(12) United States Patent
Yamazaki

(10) Patent No.: US 9,406,810 B2
(45) Date of Patent: Aug. 2, 2016

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/091,568

(22) Filed: Nov. 27, 2013

(65) Prior Publication Data

US 2014/0151687 A1 Jun. 5, 2014

(30) Foreign Application Priority Data

Dec. 3, 2012 (JP) ................................ 2012-264751
Dec. 14, 2012 (JP) ................................ 2012-273991

(51) Int. Cl.
| | | |
|---|---|---|
| H01L 29/786 | (2006.01) | |
| H01L 21/3213 | (2006.01) | |
| H01L 21/02 | (2006.01) | |
| H01L 29/24 | (2006.01) | |
| H01L 29/66 | (2006.01) | |
| G02F 1/1368 | (2006.01) | |

(52) U.S. Cl.
CPC ........ *H01L 29/78696* (2013.01); *G02F 1/1368* (2013.01); *H01L 29/24* (2013.01); *H01L 29/66969* (2013.01); *H01L 29/7869* (2013.01); *H01L 29/78618* (2013.01); *H01L 21/022* (2013.01); *H01L 21/0217* (2013.01); *H01L 21/02164* (2013.01); *H01L 21/02274* (2013.01)

(58) Field of Classification Search
CPC .......................... H01L 29/78696; H01L 29/24
USPC .............................................. 257/43; 438/151
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Cuong Q Nguyen
*Assistant Examiner* — Tong-Ho Kim
(74) *Attorney, Agent, or Firm* — Nixon Peabody LLP; Jeffrey L. Costellia

(57) ABSTRACT

In a semiconductor device, a region where a channel is formed is protected. In a semiconductor device, a region protecting a region where a channel is formed is provided in a semiconductor layer. In a semiconductor device, a layer protecting a region where a channel is formed is provided. In a semiconductor device, a region and/or a layer protecting a region where a channel is formed have/has a low density of defect states. In a semiconductor device, a region where a channel is formed has a low density of defect states.

17 Claims, 45 Drawing Sheets

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,258,862 B2 | 9/2012 | Matsuzaki et al. |
| 8,274,078 B2 | 9/2012 | Itagaki et al. |
| 8,421,083 B2 | 4/2013 | Yamazaki et al. |
| 8,890,152 B2 | 11/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1* | 10/2008 | Kim et al. ............ 257/43 |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250693 A1* | 10/2009 | Jeong et al. ............ 257/43 |
| 2009/0278122 A1 | 11/2009 | Hosono et al. |
| 2009/0280600 A1 | 11/2009 | Hosono et al. |
| 2010/0038641 A1* | 2/2010 | Imai ............ 257/57 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0140100 A1* | 6/2011 | Takata et al. ............ 257/43 |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2012/0187395 A1 | 7/2012 | Koezuka |
| 2012/0305913 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009219 A1 | 1/2013 | Yamazaki et al. |
| 2013/0009220 A1 | 1/2013 | Yamazaki et al. |
| 2013/0082255 A1 | 4/2013 | Akimoto et al. |
| 2013/0087785 A1 | 4/2013 | Akimoto et al. |
| 2013/0147518 A1 | 6/2013 | Shionoiri et al. |
| 2013/0320330 A1 | 12/2013 | Yamazaki |
| 2013/0334533 A1 | 12/2013 | Yamazaki |
| 2014/0001465 A1 | 1/2014 | Yamazaki |
| 2014/0008647 A1 | 1/2014 | Yamazaki |
| 2014/0027743 A1 | 1/2014 | Nishido |
| 2014/0034945 A1 | 2/2014 | Tokunaga et al. |
| 2014/0084287 A1 | 3/2014 | Yamazaki |
| 2014/0091301 A1 | 4/2014 | Yamazaki |
| 2014/0103335 A1 | 4/2014 | Yamazaki et al. |
| 2014/0110703 A1 | 4/2014 | Yamazaki |
| 2014/0152336 A1 | 6/2014 | Sasaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | H06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2010-177431 A | 8/2010 |
| JP | 2012-160679 A | 8/2012 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

* cited by examiner

FIG. 1A1
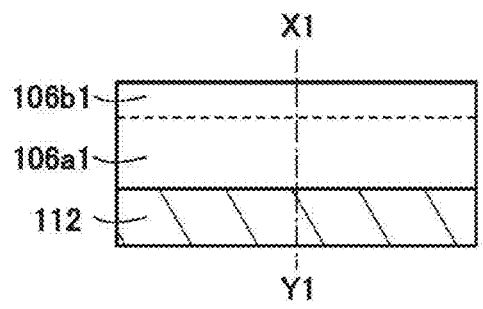
FIG. 1A2
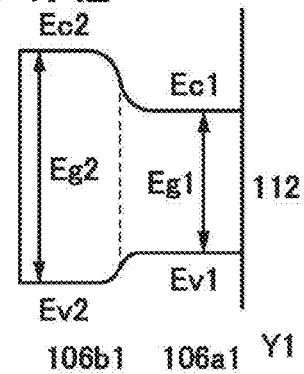
FIG. 1B1
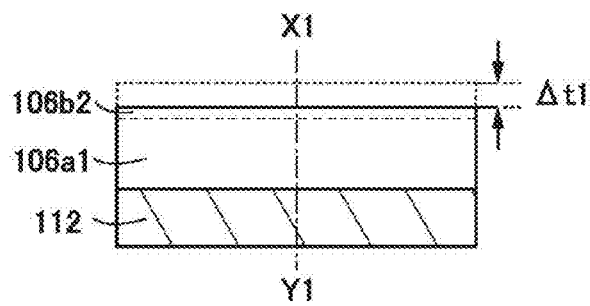
FIG. 1B2
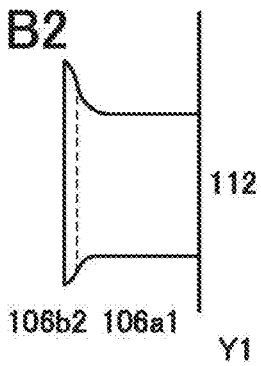
FIG. 1C1
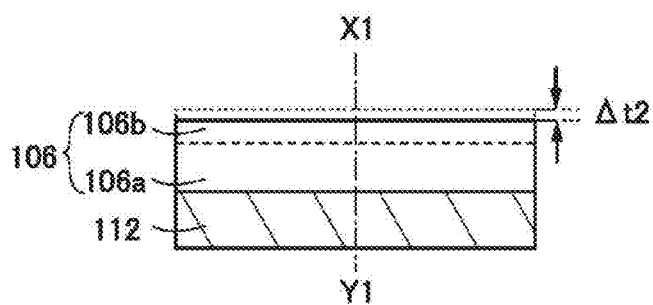
FIG. 1C2
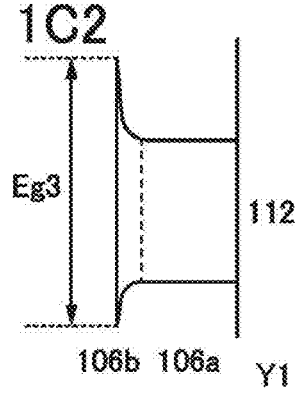
FIG. 1D1
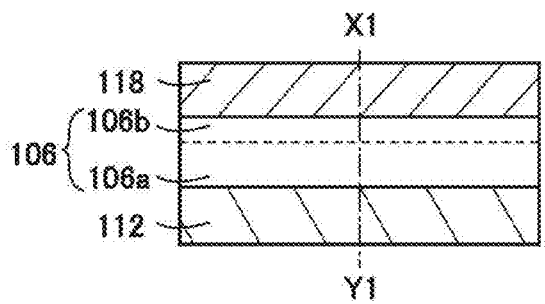
FIG. 1D2
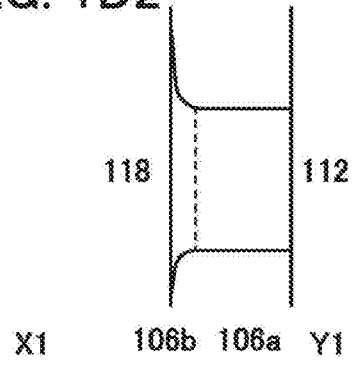

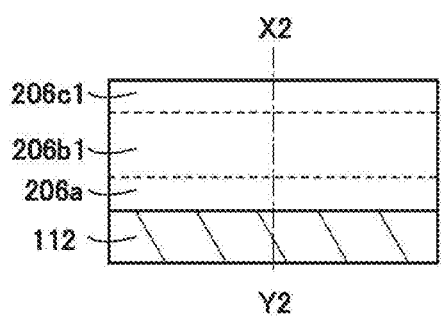
FIG. 2A1
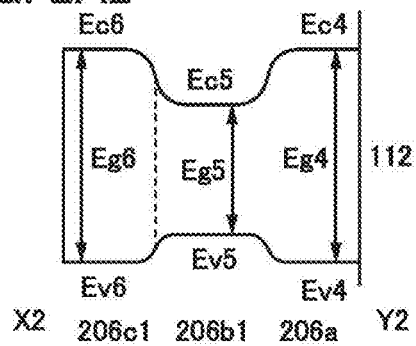
FIG. 2A2
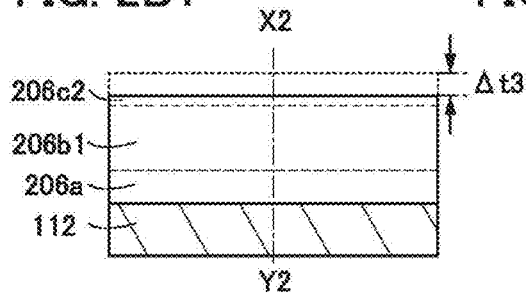
FIG. 2B1
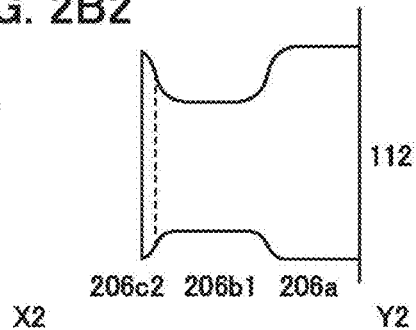
FIG. 2B2
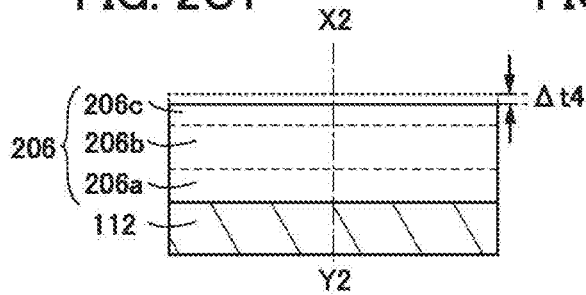
FIG. 2C1
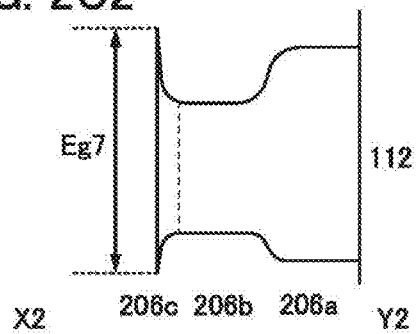
FIG. 2C2
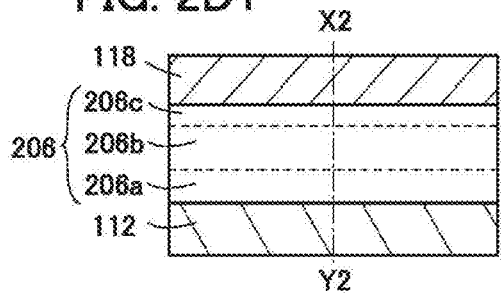
FIG. 2D1
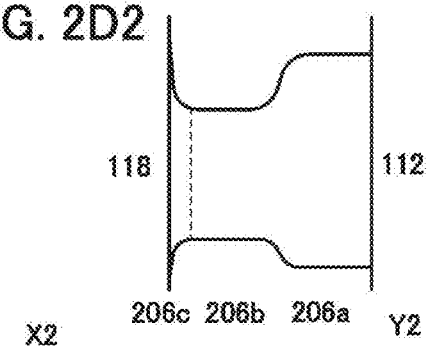
FIG. 2D2

FIG. 3A1
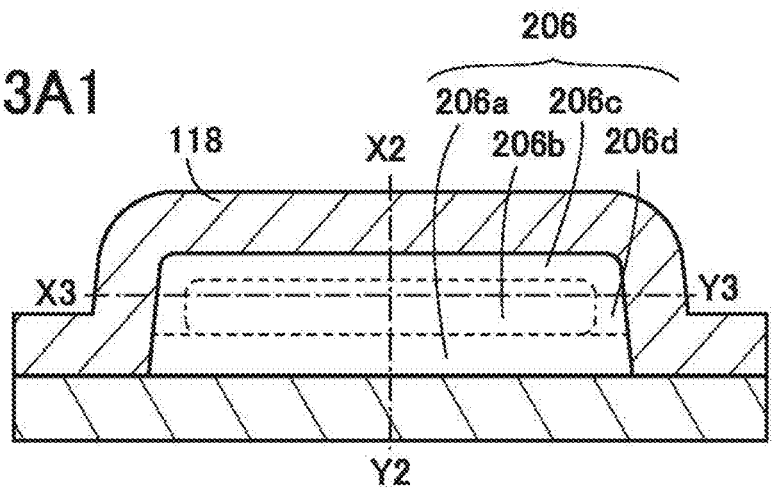
FIG. 3A2
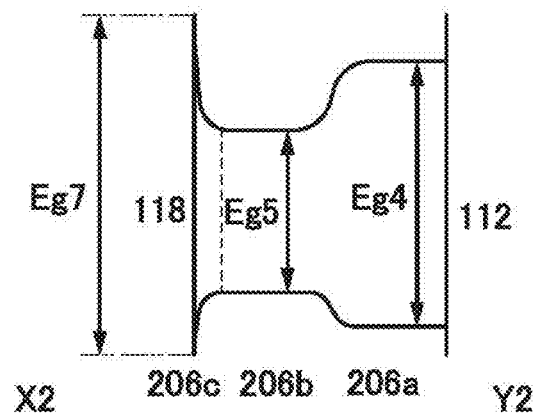
FIG. 3A3
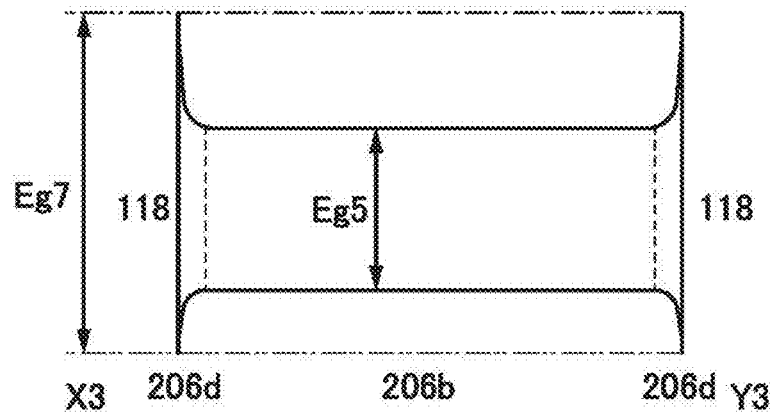

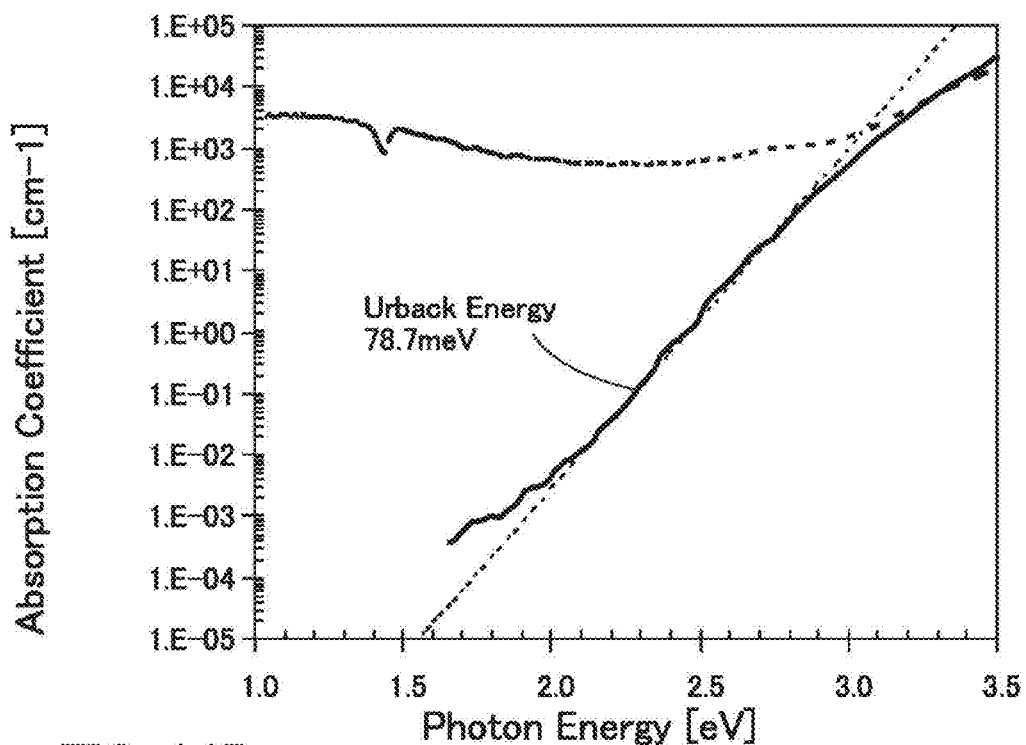
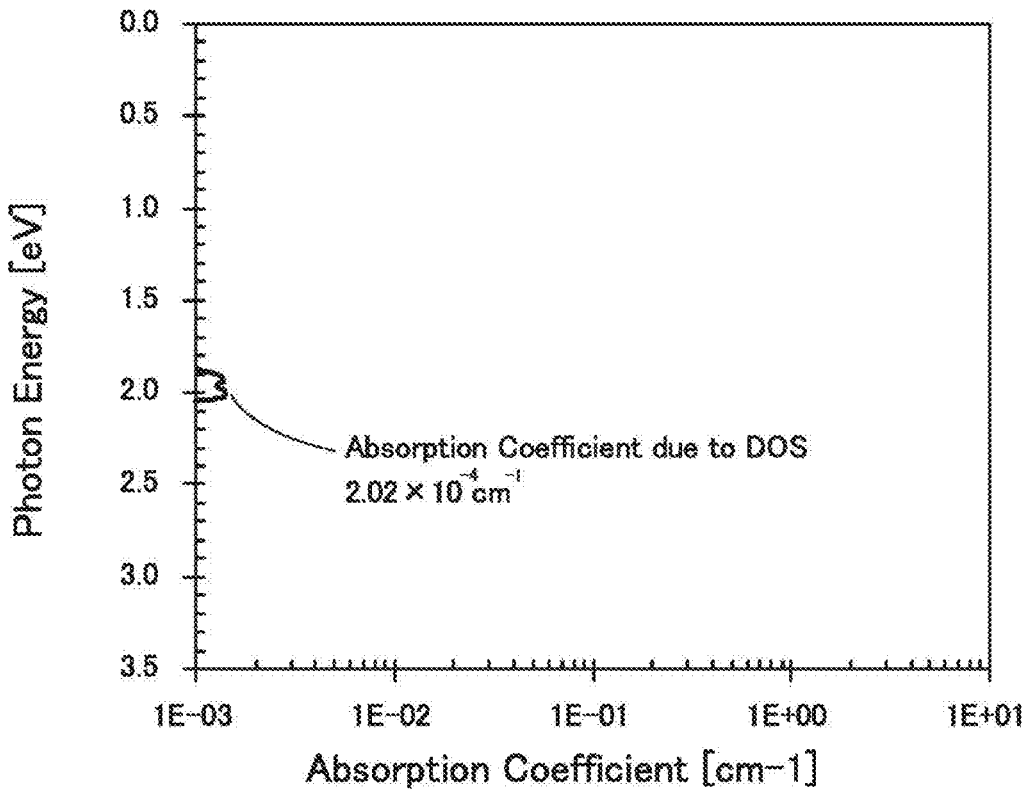

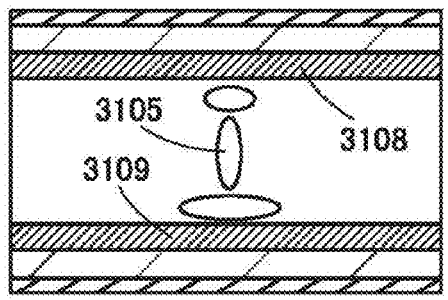
FIG. 25A1
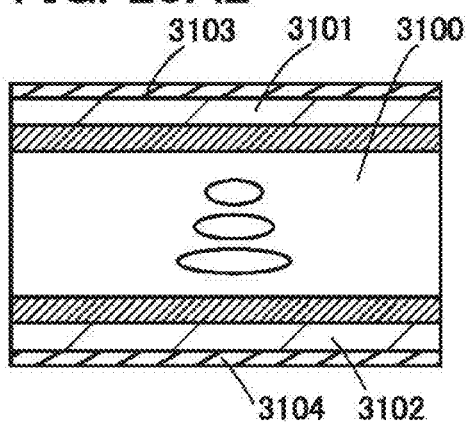
FIG. 25A2
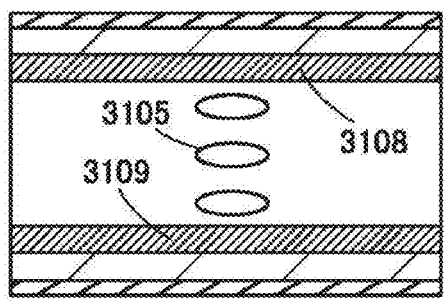
FIG. 25B1
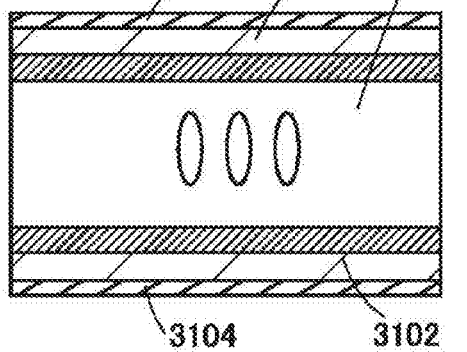
FIG. 25B2
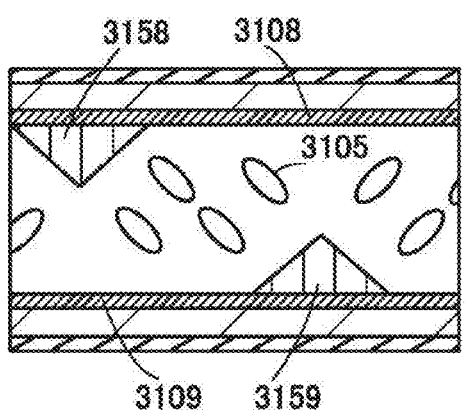
FIG. 25C1
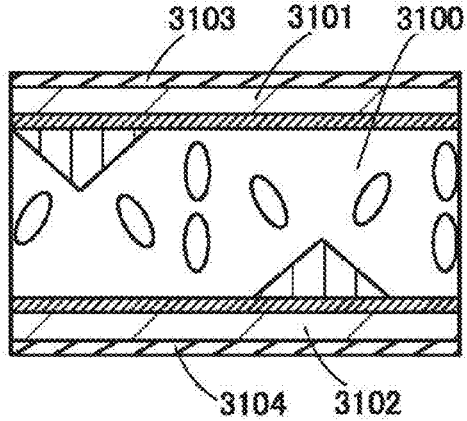
FIG. 25C2

FIG. 26A1 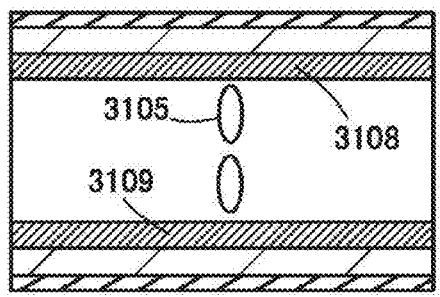
FIG. 26A2 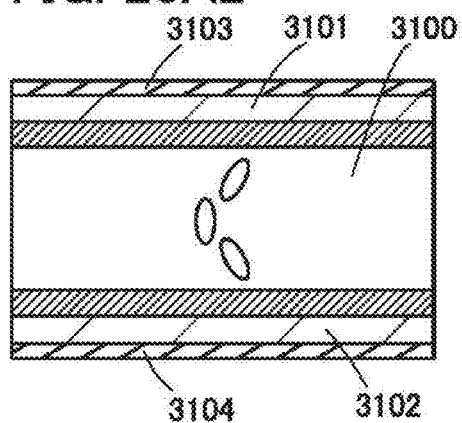
FIG. 26B1 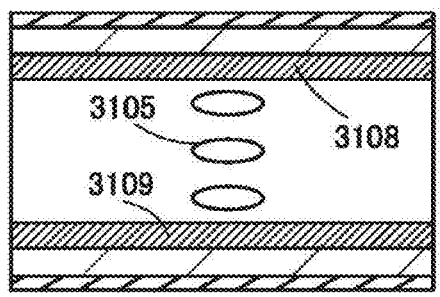
FIG. 26B2 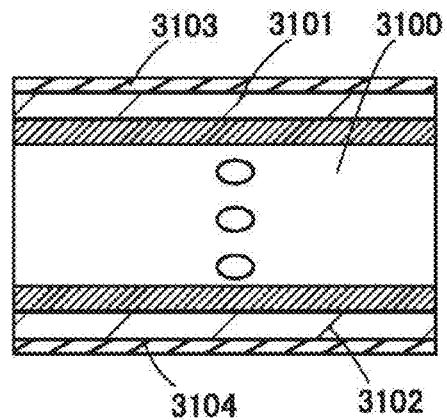

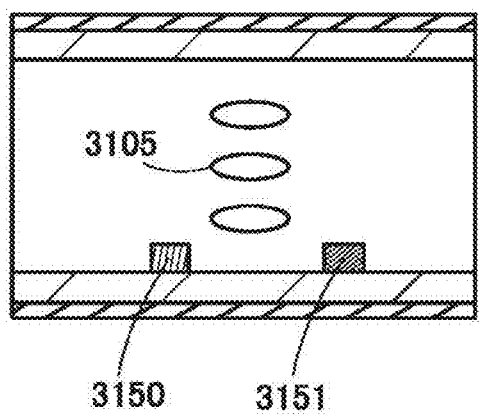
FIG. 27A1
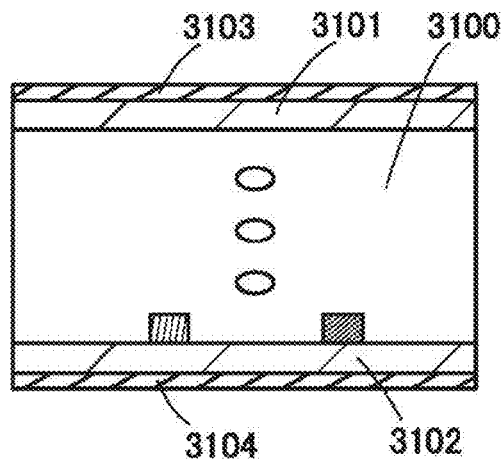
FIG. 27A2
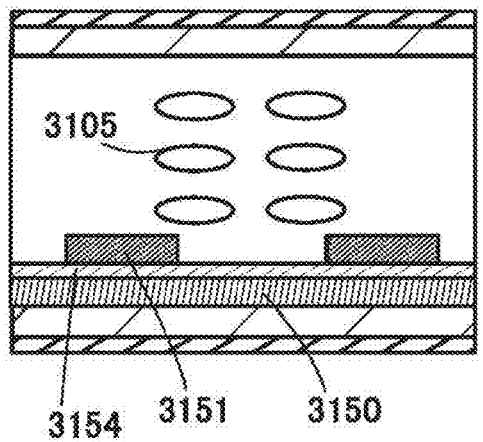
FIG. 27B1
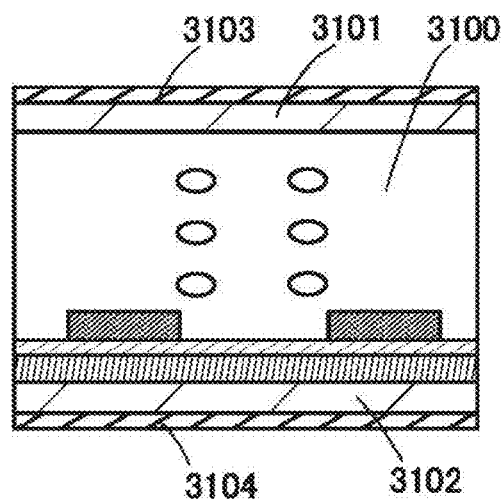
FIG. 27B2

During not Touched

Input Voltage Waveform

Output Current Waveform

During Touched

Input Voltage Waveform

Output Current Waveform

SEMICONDUCTOR DEVICE AND MANUFACTURING METHOD THEREOF

BACKGROUND OF THE INVENTION

1. Field of the Invention

The present invention relates to an object, a method, a manufacturing method, a process, a machine, manufacture, or a composition of matter. In particular, the present invention relates to, for example, a semiconductor layer, a semiconductor device, a display device, a liquid crystal display device, a light-emitting device, a driving method thereof, or a manufacturing method thereof. In particular, the present invention relates to, for example, a semiconductor device including a transistor, a display device including a transistor, or a light-emitting device including a transistor, or a driving method thereof. Alternatively, the present invention relates to, for example, an electronic device including the semiconductor device, the display device, or the light-emitting device.

Note that in this specification, a semiconductor device refers to any device that can function by utilizing semiconductor characteristics, and an electro-optical device, a semiconductor circuit, an electronic appliance, and the like are all semiconductor devices.

2. Background Art

A technique for forming a transistor by using a semiconductor film formed over a substrate having an insulating surface has attracted attention. The transistor has been widely used for semiconductor devices such as integrated circuits and display devices. A silicon film is known as a semiconductor film applicable to a transistor.

Whether an amorphous silicon film or a polycrystalline silicon film is used as a semiconductor film in a transistor depends on the purpose. For example, in the case of a transistor included in a large display device, an amorphous silicon film, which can be formed using an established technique for forming a film over a large substrate, is preferably used. On the other hand, in the case of a transistor included in a high-performance display device where driver circuits are formed over the same substrate, a polycrystalline silicon film, which can form a transistor having a high field-effect mobility, is preferably used. As a method for forming a polycrystalline silicon film, high-temperature heat treatment or a laser light treatment which is performed on an amorphous silicon film has been known.

In recent years, an oxide semiconductor film has attracted attention. For example, a transistor which includes an amorphous oxide semiconductor film containing indium, gallium, and zinc and having a carrier density lower than $10^{18}/cm^3$ is disclosed (see Patent Document 1).

An oxide semiconductor film can be formed by a sputtering method or the like, and thus can be used for a channel formation region of a transistor in a large display device. A transistor including an oxide semiconductor film has high field-effect mobility; therefore, a high-performance display device where driver circuits are formed over the same substrate can be obtained. Moreover, there is an advantage that capital investment can be reduced because part of production equipment for a transistor including an amorphous silicon film can be retrofitted and utilized.

REFERENCE

Patent Document

[Patent Document 1] Japanese Published Patent Application No. 2006-165528

SUMMARY OF THE INVENTION

An object is to provide a semiconductor layer with a low density of defect states. Another object is to provide a transistor with stable electric characteristics. Another object is to provide a transistor having low off-state current. Another object is to provide an enhancement transistor. Another object is to provide a transistor having high field-effect mobility. Another object is to provide a transistor with a small number of steps. Another object is to provide a transistor with high yield. Another object is to provide a semiconductor device including the transistor. Another object is to provide a novel semiconductor device.

Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

One embodiment of the present invention is a semiconductor device in which a region where a channel is formed is protected, for example. Alternatively, one embodiment of the present invention is a semiconductor device in which a region protecting a region where a channel is formed is provided in a semiconductor layer, for example. Alternatively, one embodiment of the present invention is a semiconductor device including a layer which protects a region where a channel is formed, for example. Alternatively, one embodiment of the present invention is a semiconductor device in which a region and/or a layer which protect/protects a region where a channel is formed have/has a low density of defect states, for example. Further alternatively, one embodiment of the present invention is a semiconductor device in which a region where a channel is formed has a low density of defect states, for example.

One embodiment of the present invention is a method for manufacturing a semiconductor device in which a region where a channel is formed is protected, for example. Alternatively, one embodiment of the present invention is a method for manufacturing a semiconductor device including a region which protects a region where a channel is formed in a semiconductor layer, for example. Alternatively, one embodiment of the present invention is a method for manufacturing a semiconductor device including a layer which protects a region where a channel is formed, for example. Alternatively, one embodiment of the present invention is a method for manufacturing a semiconductor device in which a region and/or a layer which protect/protects a region where a channel is formed have/has a low density of defect states, for example. Further alternatively, one embodiment of the present invention is a method for manufacturing a semiconductor device in which a region where a channel is formed has a low density of defect states, for example.

One embodiment of the present invention is a semiconductor layer including a region which protects a surface, for example. Alternatively, one embodiment of the present invention is a semiconductor layer including a layer which protects a surface, for example. Further alternatively, one embodiment of the present invention is a semiconductor layer in which a region and/or a layer which protect/protects a surface have/has a low density of defect states, for example. Still further alternatively, one embodiment of the present invention is a semiconductor layer with a low density of defect states, for example.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

One embodiment of the present invention is a method for forming a region which protects a surface in a semiconductor layer, for example. Alternatively, one embodiment of the present invention is a method for forming a layer which protects a surface of a semiconductor layer, for example. Further alternatively, one embodiment of the present invention is a method for forming a region and/or a layer which protect/protects a surface and have/has a low density of defect states in a semiconductor layer, for example. Still further alternatively, one embodiment of the present invention is a method for forming a semiconductor layer with a low density of defect states, for example.

Defect states exist in a semiconductor layer and at an interface with the semiconductor layer. Therefore, it is preferable that the density of defect states at the interface and in the film be reduced to form a semiconductor layer with a low density of defect states. Note that in the case where a semiconductor layer having an interface with a low density of defect states is obtained, it is only necessary to reduce the density of defect states in the film in some cases.

For example, the semiconductor layer may be etched so that only the vicinity of the interface remains. Moreover, for example, in the case where a first semiconductor layer and a second semiconductor layer are stacked in this order, a mixed region of the first semiconductor layer and the second semiconductor layer may be formed between the first semiconductor layer and the second semiconductor layer. For example, when the mixed region has a low density of defect states, the second semiconductor layer may be removed so that the mixed region remains. The thickness of the mixed region is less than 5 nm in many cases, for example.

In addition, at the time of removing the second semiconductor layer or after the mixed region remains, the second semiconductor layer and/or the mixed region may be changed in quality by utilizing chemical reaction, for example. The change in quality enables the density of defect states of the second semiconductor layer and/or the mixed region to be reduced in some cases.

For example, in the case where an oxide semiconductor layer containing indium and an element M (aluminum, gallium, yttrium, zirconium, or tin) is used as the first semiconductor layer and an oxide semiconductor layer containing indium and the element M (aluminum, gallium, yttrium, zirconium, or tin) at an atomic ratio different from that of the first semiconductor layer is used as the second semiconductor layer, the second semiconductor layer and/or the mixed region may be changed in quality using a solution containing one or more of phosphoric acid, nitric acid, hydrofluoric acid, hydrochloric acid, sulfuric acid, acetic acid, and oxalic acid. Note that the element M may be aluminum, titanium, silicon, gallium, germanium, yttrium, zirconium, tin, lanthanum, cerium, or hafnium.

The change in quality is, for example, a change in atomic ratio and/or energy gap, and specifically, an increase in the proportion of the element M, an increase in energy gap, and/or the like is given. The change in quality can reduce the density of defect states of the second semiconductor layer and/or the mixed region in some cases. Further, the second semiconductor layer changed in quality and/or the mixed region changed in quality have/has a function of blocking impurities in some cases, for example. In this case, the amount of impurity entering the first semiconductor layer can be reduced, for example; thus, an increase in the density of defect states of the first semiconductor layer can be suppressed.

Note that an impurity refers to, for example, elements other than the main components of a semiconductor layer. For example, an element with a concentration of lower than 0.1 atomic % is an impurity. When an impurity is contained, states may be formed in the semiconductor layer, the carrier mobility may be decreased, or the crystallinity may be decreased, for example. When states are formed in the semiconductor layer, electrons or holes from the states are generated, whereby the carrier density may be increased or trap states may be formed, for example. In the case where the semiconductor layer is an oxide semiconductor layer, examples of an impurity which causes variation in characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case where the semiconductor layer is an oxide semiconductor layer, oxygen vacancies may be formed by entry of impurities. The oxygen vacancies in the oxide semiconductor layer might serve as carrier generation sources or trap states, for example. Further, in the case where the semiconductor layer is a silicon layer, examples of an impurity which causes variation in characteristics of the semiconductor layer include oxygen, Group 1 elements except hydrogen, Group 2 elements, Group 13 elements, and Group 15 elements.

For example, in the case where trap states exist in the semiconductor layer, in a transistor in which a channel is formed in the semiconductor layer, as the drain voltage (voltage between a source and a drain) is higher, positive charges are more likely to be trapped by the trap states, and the charges behave like fixed charges; thus, the threshold voltage may shift in the negative direction. Moreover, for example, in the transistor in which a channel is formed in the semiconductor layer, the positive charges are easily trapped by the trap states by entry of light, and the charges behave like fixed charges; thus, the threshold voltage may shift in the negative direction.

In addition, for example, an increase in the carrier density of the semiconductor layer leads to an increase in the current of the transistor in which a channel is formed in the semiconductor layer in an off state (when the gate voltage is lower than the threshold voltage) (also referred to as off-state current, off-leakage current, or the like). Note that the off-state current is large especially in a transistor with a small channel length.

Thus, when the density of defect states of the semiconductor layer is decreased, the transistor in which a channel is formed in the semiconductor layer is easily formed to be an enhancement transistor, for example. Alternatively, the off-state current of the transistor in which a channel is formed in the semiconductor layer can be reduced, for example.

According to one embodiment of the present invention, a semiconductor device includes, for example, an oxide semiconductor layer, a gate insulating film in contact with the oxide semiconductor layer, and a gate electrode overlapping with the oxide semiconductor layer with the gate insulating film provided therebetween. A region (including the top surface) with a depth of greater than or equal to 0 nm and less than 5 nm from the top surface of the oxide semiconductor layer has a larger energy gap than a region with a depth of greater than or equal to 5 nm.

In the semiconductor device, for example, an electrode is provided over the oxide semiconductor layer with a second oxide semiconductor layer provided therebetween, and the second oxide semiconductor layer includes a region having a larger energy gap than a region with a depth of greater than or equal to 5 nm from the top surface of the oxide semiconductor layer.

According to one embodiment of the present invention, a semiconductor device includes, for example, an oxide semiconductor layer containing indium and an element M (aluminum, gallium, yttrium, zirconium, or tin), a gate insulating film in contact with the oxide semiconductor layer, and a gate electrode overlapping with the oxide semiconductor layer with the gate insulating film provided therebetween. The oxide semiconductor layer includes a region where the proportion of indium is lower than the proportion of the element M at a depth of greater than or equal to 0 nm and less than 5 nm from the top surface of the oxide semiconductor layer.

For example, an electrode is provided over the oxide semiconductor layer with the second oxide semiconductor layer provided therebetween, and the second oxide semiconductor layer includes a region where the proportion of indium is lower than the proportion of the element M.

For example, the oxide semiconductor layer includes a region which is in contact with an insulating film containing silicon on a side facing the gate insulating film and in which a channel is formed in a region apart from the insulating film.

According to one embodiment of the present invention, a method for manufacturing a semiconductor device includes, for example, the steps of: forming a gate electrode; forming a gate insulating film over the gate electrode; forming a first oxide semiconductor layer over the gate insulating film and forming a second oxide semiconductor layer over the first oxide semiconductor layer and then forming a mixed region of the first oxide semiconductor layer and the second oxide semiconductor layer between the first oxide semiconductor layer and the second oxide semiconductor layer; forming a conductive film over the second oxide semiconductor layer; and partly etching the conductive film to expose the second oxide semiconductor layer. The exposed region of the second oxide semiconductor layer is etched so that the thickness of the second oxide semiconductor layer is greater than or equal to 0 nm and less than 5 nm.

For example, in the method for manufacturing a semiconductor device, the second oxide semiconductor layer includes a region having a larger energy gap than the first oxide semiconductor layer.

For example, in the method for manufacturing a semiconductor device, the second oxide semiconductor layer and the first oxide semiconductor layer contain indium and an element M (aluminum, gallium, yttrium, zirconium, or tin). The second oxide semiconductor layer includes a region where the proportion of the element M is higher than that in the first oxide semiconductor layer.

For example, in the method for manufacturing a semiconductor device, the second oxide semiconductor layer is formed by a sputtering method at a substrate temperature of higher than or equal to 100° C. and lower than 500° C.

Note that the above-described embodiments of the present invention are examples. For example, the semiconductor layer is not limited to the oxide semiconductor layer. For example, in the above-described embodiments of the present invention, a silicon layer, an organic semiconductor layer, and other compound semiconductor layers (such as a gallium arsenide layer, a silicon carbide layer, and a gallium nitride layer) may be used instead of the oxide semiconductor layer.

According to one embodiment of the present invention, it is possible to provide a semiconductor layer with a low density of defect states by protecting the semiconductor layer, for example. It is possible to provide a transistor with stable electric characteristics. It is possible to provide a transistor with low off-state current. It is possible to provide an enhancement transistor. It is possible to provide a transistor having high field-effect mobility. It is possible to provide a transistor with a small number of manufacturing steps. It is possible to provide a transistor with high yield. It is possible to provide a semiconductor device including the transistor.

BRIEF DESCRIPTION OF THE DRAWINGS

In the accompanying drawings:

FIGS. 1A1, 1B1, 1C1, and 1D1 are cross-sectional views of a sample of one embodiment of the present invention, and FIGS. 1A2, 1B2, 1C2, and 1D2 show band structures thereof;

FIGS. 2A1, 2B1, 2C1, and 2D1 are cross-sectional views of a sample of one embodiment of the present invention, and FIGS. 2A2, 2B2, 2C2, and 2D2 show band structures thereof;

FIG. 3A1 is a cross-sectional view of a sample of one embodiment of the present invention and FIGS. 3A2 and 3A3 show band structures thereof;

FIGS. 14A and 14B are graphs showing CPM measurement results of a multilayer film of one embodiment of the present invention;

FIGS. 25A1, 25A2, 25B1, 25B2, 25C1, and 25C2 are cross-sectional views illustrating examples of a pixel of a liquid crystal device of one embodiment of the present invention;

FIGS. 26A1, 26A2, 26B1, and 26B2 are cross-sectional views illustrating examples of a pixel of a liquid crystal device of one embodiment of the present invention;

FIGS. 27A1, 27A2, 27B1, and 27B2 are cross-sectional views illustrating examples of a pixel of a liquid crystal device of one embodiment of the present invention;

DETAILED DESCRIPTION OF THE INVENTION

Figure 4:
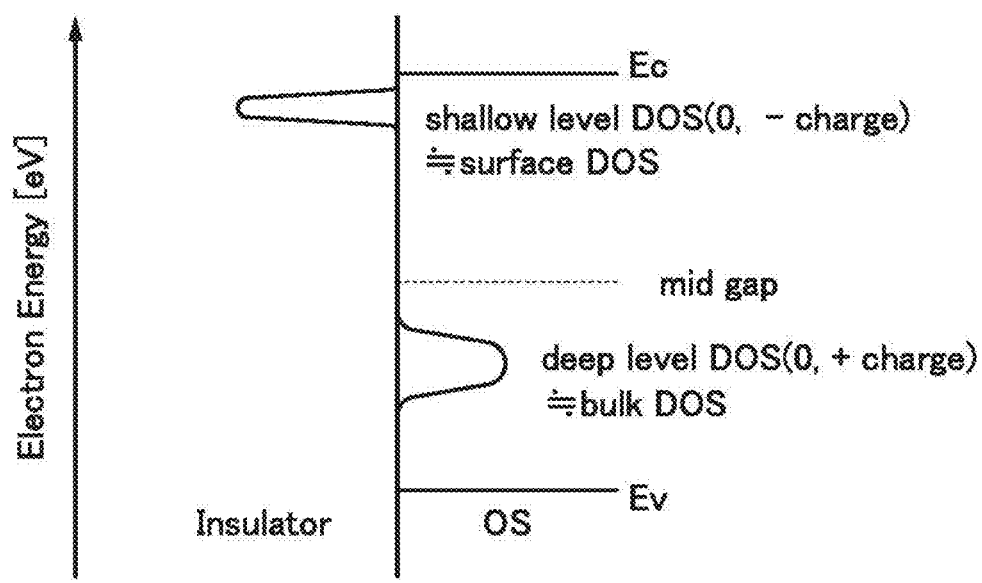
FIG. 4 shows a band structure of an oxide semiconductor layer.

Embodiments of the present invention will be described in detail with reference to the accompanying drawings. Note that the present invention is not limited to the description below, and it is easily understood by those skilled in the art that modes and details disclosed herein can be modified in various ways. Further, the present invention is not construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases.

Note that what is described (or part thereof) in one embodiment can be applied to, combined with, or exchanged with another content in the same embodiment and/or what is described (or part thereof) in another embodiment or other embodiments.

Note that in each embodiment, a content described in the embodiment is a content described with reference to a variety of drawings or a content described with texts described in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more drawings can be formed.

Note that the size, the thickness of a layer, or a region in drawings is sometimes exaggerated for simplicity. Therefore, embodiments of the present invention are not limited to such scales.

Note that drawings are schematic views of ideal examples, and shapes or values are not limited to those illustrated in the drawings. For example, the following can be included: variation in shape due to a manufacturing technique or dimensional deviation; or variation in signal, voltage, or current due to noise or difference in timing.

Note that a voltage refers to a potential difference between a certain potential and a reference potential (e.g., a ground potential (GND) or a source potential) in many cases. Accordingly, a voltage can also be called a potential.

Further, even when the expression "to be electrically connected" is used in this specification, there is a case in which no physical connection is made and a wiring is just extended in an actual circuit.

Note that technical terms are used in order to describe a specific embodiment, example, or the like in many cases. One embodiment of the present invention should not be construed as being limited by the technical terms.

Terms which are not defined in this specification (including terms used for science and technology, such as technical terms or academic terms) can be used as the terms having meaning equal to general meaning that an ordinary person skilled in the art understands. It is preferable that terms defined by dictionaries or the like be construed to have meanings consistent with the background of related art.

Note that the ordinal numbers such as "first" and "second" in this specification are used for convenience and do not denote the order of steps or the stacking order of layers. In addition, the ordinal numbers in this specification do not denote particular names which specify the present invention.

Note that a content which is not specified in any drawing or text in the specification can be excluded from the invention. When the number range of values indicated by e.g., the maximum value and the minimum value is described, the range may be freely narrowed or a value in the range may be excluded, so that the invention can be specified by a range resulting from exclusion of part of the range. In this manner, it is possible to specify the technical scope of the present invention so that a conventional technology is excluded, for example.

Specifically, for example, a diagram of a circuit including first to fifth transistors is described. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention. Note that, for example, it can be specified that the voltage is higher than or equal to 5 V and lower than or equal to 8 V in the invention. Note that, for example, it can be specified that the voltage is approximately 9 V in the invention. Note that, for example, it can be specified that the voltage is higher than or equal to 3 V and lower than or equal to 10 V but is not 9 V in the invention.

As another specific example, a description of a value, "a voltage is preferably 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention.

As another specific example, a description of a property of a material, "a film is an insulating film", is given. In that case, for example, it can be specified that the case where the insulating film is an organic insulating film is excluded from the invention. For example, it can be specified that the case where the insulating film is an inorganic insulating film is excluded from the invention.

As another specific example, a description of a stacked structure, "a film is provided between A and B" is given. In that case, for example, it can be specified that the case where the film is a stacked film of four or more layers is excluded from the invention. For example, it can be specified that the case where a conductive film is provided between A and the film is excluded from the invention.

<1. Oxide Semiconductor Layer>

Models of an oxide semiconductor layer which can be used for a channel formation region of a transistor are described below as examples of a semiconductor layer of one embodiment of the present invention.

<1-1. Model A>

FIGS. 1A1, 1A2, 1B1, 1B2, 1C1, 1C2, 1D1, and 1D2 are cross-sectional views of oxide semiconductor layers over an insulating film and band diagrams.

First, Sample A including an oxide semiconductor layer 106a1 over an insulating film 112 and an oxide semiconductor layer 106b1 over the oxide semiconductor layer 106a1 is prepared (see FIG. 1A1). FIG. 1A2 illustrates a band structure taken along dashed-dotted line X1-Y1 in FIG. 1A1.

The oxide semiconductor layer 106a1 in Sample A is an oxide semiconductor layer having higher electron affinity than the oxide semiconductor layer 106b1. For example, as the oxide semiconductor layer 106a1, an oxide semiconductor layer having higher electron affinity than the oxide semiconductor layer 106b1 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band. The energy at the bottom of the conduction band of the oxide semiconductor layer 106a1 and that of the oxide semiconductor layer 106b1 are denoted by Ec1 and Ec2, respectively. Further, the energy at the top of the valence band of the oxide semiconductor layer 106a1 and that of the oxide semiconductor layer 106b1 are denoted by Ev1 and Ev2, respectively.

As the oxide semiconductor layer 106a1 and the oxide semiconductor layer 106b1, an oxide semiconductor layer having a large energy gap is used. For example, the energy gap Eg1 of the oxide semiconductor layer 106a1 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap Eg2 of the oxide semiconductor layer 106b1 is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that the oxide semiconductor layer 106b1 has a larger energy gap than the oxide semiconductor layer 106a1.

An oxide semiconductor layer with low carrier density is used as the oxide semiconductor layer 106a1. For example, an oxide semiconductor layer whose carrier density is lower than or equal to $1 \times 10^{17}/cm^3$, preferably lower than or equal to $1 \times 10^{15}/cm^3$, more preferably lower than or equal to $1 \times 10^{13}/cm^3$, still more preferably lower than or equal to $1 \times 10^{11}/cm^3$ is used as the oxide semiconductor layer 106a1.

The oxide semiconductor layer 106a1 contains at least indium. In addition to indium, an element M (aluminum, gallium, yttrium, zirconium, or tin) is preferably contained. Note that the oxide semiconductor layer 106a1 preferably contains indium because carrier mobility (electron mobility) can be increased.

The oxide semiconductor layer 106b1 includes one or more elements other than oxygen included in the oxide semiconductor layer 106a1. Since the oxide semiconductor layer 106b1 includes one or more elements other than oxygen included in the oxide semiconductor layer 106a1, interface scattering is unlikely to occur at the interface between the oxide semiconductor layer 106a1 and the oxide semiconductor layer 106b1. Thus, the transistor can have high field-effect mobility because the movement of carriers is not hindered at the interface.

The oxide semiconductor layer 106b1 may contain, for example, aluminum, titanium, silicon, gallium, germanium, yttrium, zirconium, tin, lanthanum, cerium, or hafnium at a higher proportion than indium. Specifically, the amount of any of the above elements in the oxide semiconductor layer 106b1 in an atomic ratio is 1.5 times or more, preferably 2 times or more, more preferably 3 times or more as much as that of indium in an atomic ratio. The above elements increase the energy gap of the oxide semiconductor layer in some cases. When any of the above elements is contained in the oxide semiconductor layer at a high proportion, it decreases the electron affinity of the oxide semiconductor layer in some cases. The above elements block an impurity of the oxide semiconductor layer or reduce the diffusion coefficient of an impurity in some cases. The oxide semiconductor layer 106b1 contains any of the above elements at a higher proportion than the oxide semiconductor layer 106a1.

In the case of using an In—M—Zn oxide as the oxide semiconductor layer 106a1, when summation of In and M is assumed to be 100 atomic %, the proportions of In and M are preferably greater than or equal to 25 atomic % and less than 75 atomic %, respectively, and more preferably greater than or equal to 34 atomic % and less than 66 atomic %, respectively. In the case of using an In—M—Zn oxide as the oxide semiconductor layer 106b1, when summation of In and M is assumed to be 100 atomic %, the proportions of In and M are preferably less than 50 atomic % and greater than or equal to 50 atomic %, respectively, and more preferably less than 25 atomic % and greater than or equal to 75 atomic %, respectively.

For example, the oxide semiconductor layer containing zinc is easily crystallized. Further, for example, zinc in the oxide semiconductor layer contributes to energy at the top of the valence band.

The thickness of the oxide semiconductor layer 106a1 is greater than or equal to 5 nm and less than or equal to 200 nm, preferably greater than or equal to 5 nm and less than or equal to 100 nm, more preferably greater than or equal to 5 nm and less than or equal to 50 nm. The thickness of the oxide semiconductor layer 106b1 is greater than or equal to 5 nm and less than or equal to 100 nm, preferably greater than or equal to 5 nm and less than or equal to 50 nm.

Here, in some cases, there is a mixed region of the oxide semiconductor layer 106a1 and the oxide semiconductor layer 106b1 between the oxide semiconductor layer 106a1 and the oxide semiconductor layer 106b1. In that case, the density of defect states is probably very low in the vicinity of the interface; thus, as in the band structure in FIG. 1A2, the energy is continuously changed in the vicinity of the interface between the oxide semiconductor layer 106a1 and the oxide semiconductor layer 106b1 (continuous connection).

Thus, it indicates that the above mixed region serves as a protective layer with extremely low density of defect states. On the other hand, in a region of the oxide semiconductor layer 106b1 other than this mixed region, the density of defect states may be relatively high. For example, on the assumption that a channel of a transistor is formed in the oxide semiconductor layer 106a1, when the oxide semiconductor layer 106b1 includes a region with high density of defect states, a current path may be formed in the defect states, for example. Alternatively, for example, a positive charge may be trapped in the defect state, so that the threshold voltage of the transistor shifts in the negative direction. By suppressing entry of an impurity such as water when the oxide semiconductor layer 106b1 is formed or by performing dehydrogenation treatment and oxygen adding treatment after the film formation, the density of defect states of the oxide semiconductor layer 106b1 can be reduced. Note that depending on performance of a film formation apparatus or the like, the density of defect states cannot be reduced sufficiently in some cases.

Next, the oxide semiconductor layer 106b1 is etched, so that an oxide semiconductor layer 106b2 with a thickness reduced by ΔU is formed (see FIG. 1B1). Note that the oxide semiconductor layer 106b2 is formed to a thickness of greater than or equal to 0 nm and less than 5 nm. The oxide semiconductor layer 106b2 includes the above-described mixed region. The thus obtained oxide semiconductor layer 106b2 can be referred to as an oxide semiconductor layer in which the region with a high density of defect states is removed from the oxide semiconductor layer 106b1. FIG. 1B2 illustrates a band structure taken along dashed-dotted line X1-Y1 in FIG. 1B1. This step can be used even in the case where the density of defect states of the oxide semiconductor layer 106b1 becomes high because of performance of a film formation apparatus or the like. However, it is preferable that the density of defect states of the oxide semiconductor layer 106b1 be as low as possible.

Here, the above-described mixed region is a region in which the energy of the vicinity of the interface between the oxide semiconductor layer 106a1 and the oxide semiconductor layer 106b2 is continuously changed as in the band structure in FIG. 1B2.

Next, the oxide semiconductor layer 106b2 is etched so that the thickness thereof is reduced by Δt2. It is preferable that chemical reaction be utilized in the etching. The etching utilizing chemical reaction may be performed by changing the oxide semiconductor layer 106a1 and/or the oxide semiconductor layer 106b2 in quality with use of a solution containing one or more of phosphoric acid, nitric acid, hydrofluoric acid, hydrochloric acid, sulfuric acid, acetic acid, oxalic acid, and the like. In this manner, indium (indium oxide) contained in the oxide semiconductor layer 106a1 and/or the oxide semiconductor layer 106b2 is etched first and the element M (M oxide) may remain, so that the oxide semiconductor layer 106b which is the reacted region is obtained. Further, the oxide semiconductor layer 106a which is an unreacted region of the oxide semiconductor layer 106a1 remains. In the case where the oxide semiconductor layer 106a1 is not reacted at all, the oxide semiconductor layer 106a may be the same as the oxide semiconductor layer 106a1. Through the above steps, the oxide semiconductor layer 106 including the oxide semiconductor layer 106a and the oxide semiconductor layer 106b protecting the oxide semiconductor layer 106a can be formed (see FIG. 1C1).

The energy gap Eg3 of the oxide semiconductor layer 106b is larger than the energy gap of the oxide semiconductor layer 106a (Eg1: the same as that of the oxide semiconductor layer 106a1). Since the atomic ratio of the element M is higher than that of the oxide semiconductor layer 106b2, the energy gap Eg3 of the oxide semiconductor layer 106b is larger than the energy gap of the oxide semiconductor layer 106b2 (Eg2: the same as that of the oxide semiconductor layer 106b1). FIG. 1C2 illustrates a band structure taken along dashed-dotted line X1-Y1 in FIG. 1C1.

Through the above steps, it is possible to form the oxide semiconductor layer 106 including the oxide semiconductor layer 106b which is over the oxide semiconductor layer 106a and protects the oxide semiconductor layer 106a. Note that when the boundary between the oxide semiconductor layer 106a and the oxide semiconductor layer 106b is not clear, it can be said in some cases that the oxide semiconductor layer 106 includes a region corresponding to the oxide semiconductor layer 106a and a region corresponding to the oxide semiconductor layer 106b.

Next, an insulating film 118 is provided over the oxide semiconductor layer 106 (see FIG. 1D1). In the case where the insulating film 118 contains an impurity for the oxide semiconductor layer (particularly silicon), the impurity enters the oxide semiconductor layer 106 from the insulating film 118 in some cases, for example. However, the oxide semiconductor layer 106b has a high proportion of the element M which may block an impurity or reduce the diffusion coefficient of an impurity; thus, the amount of impurity reaching at least the oxide semiconductor layer 106a among the oxide semiconductor layer 106 can be reduced. FIG. 1D2 illustrates a band structure taken along dashed-dotted line X1-Y1 in FIG. 1D1.

By applying the above-described oxide semiconductor layer to a transistor whose channel is formed in an oxide semiconductor layer, a transistor with stable electric characteristics can be provided. It is possible to provide a transistor with low off-state current. It is possible to provide an enhancement transistor. It is possible to provide a transistor having high field-effect mobility. It is possible to provide a transistor with a small number of manufacturing steps. It is possible to provide a transistor with high yield.

<1-2. Model B>

FIGS. 2A1, 2A2, 2B1, 2B2, 2C1, 2C2, 2D1, and 2D2 are cross-sectional views of oxide semiconductor layers over an insulating film and band diagrams.

First, Sample B including an oxide semiconductor layer 206a over the insulating film 112, an oxide semiconductor layer 206b1, and an oxide semiconductor layer 206c1 over the oxide semiconductor layer 206b1 is prepared (see FIG. 2A1). FIG. 2A2 illustrates a band structure taken along dashed-dotted line X2-Y2 in FIG. 2A1.

The oxide semiconductor layer 206b1 in Sample B is an oxide semiconductor layer having higher electron affinity than the oxide semiconductor layer 206a and the oxide semiconductor layer 206c1. For example, as the oxide semiconductor layer 206b1, an oxide semiconductor layer having higher electron affinity than the oxide semiconductor layer 206a and the oxide semiconductor layer 206c1 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band. The energy at the bottom of the conduction band of the oxide semiconductor layer 206a, that of the oxide semiconductor layer 206b1, and that of the oxide semiconductor layer 206c1 are denoted by Ec4, Ec5, and Ec6, respectively. Further, the energy at the top of the valence band of the oxide semiconductor layer 206a, that of the oxide semiconductor layer 206b1, and the oxide semiconductor layer 206c1 are denoted by Ev4, Ev5, and Ev6, respectively.

As the oxide semiconductor layer 206a, the oxide semiconductor layer 206b1, and the oxide semiconductor layer 206c1, an oxide semiconductor layer having a large energy gap is used. For example, the energy gap Eg4 of the oxide semiconductor layer 206a is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Further, for example, the energy gap Eg5 of the oxide semiconductor layer 206b1 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap Eg6 of the oxide semiconductor layer 206c1 is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that the oxide semiconductor layer 206c1 has a larger energy gap than the oxide semiconductor layer 206b1.

An oxide semiconductor layer with low carrier density is used as the oxide semiconductor layer 206b1. For example, an oxide semiconductor layer whose carrier density is lower than or equal to $1 \times 10^{17}/cm^3$, preferably lower than or equal to $1 \times 10^{15}/cm^3$, more preferably lower than or equal to $1 \times 10^{13}/cm^3$, still more preferably lower than or equal to $1 \times 10^{11}/cm^3$ is used as the oxide semiconductor layer 206b1.

The oxide semiconductor layer 206b1 contains at least indium. In addition to indium, an element M (aluminum, gallium, yttrium, zirconium, or tin) is preferably contained.

The oxide semiconductor layer 206a includes one or more elements other than oxygen included in the oxide semiconductor layer 206b1. Note that the oxide semiconductor layer 206b1 preferably contains at least indium in order that the carrier mobility (electron mobility) is high. Since the oxide semiconductor layer 206a includes one or more elements other than oxygen included in the oxide semiconductor layer 206b1, interface scattering is unlikely to occur at the interface between the oxide semiconductor layer 206b1 and the oxide semiconductor layer 206a. Thus, the transistor can have high field-effect mobility because the movement of carriers is not hindered at the interface.

The oxide semiconductor layer 206a may contain, for example, aluminum, titanium, silicon, gallium, germanium, yttrium, zirconium, tin, lanthanum, cerium, or hafnium at a higher proportion than indium. Specifically, the amount of any of the above elements in the oxide semiconductor layer 206a in an atomic ratio is 1.5 times or more, preferably 2 times or more, more preferably 3 times or more as much as that of indium in an atomic ratio. The above elements increase the energy gap of the oxide semiconductor layer in some cases. When any of the above elements is contained in the oxide semiconductor layer at a high proportion, it decreases the electron affinity of the oxide semiconductor layer in some cases. The above elements block an impurity of the oxide semiconductor layer or reduce the diffusion coefficient of an impurity in some cases. Further, the oxide semiconductor layer 206a contains any of the above elements at a higher proportion than the oxide semiconductor layer 206b1.

The oxide semiconductor layer 206c1 includes one or more elements other than oxygen included in the oxide semiconductor layer 206b1. Note that the oxide semiconductor layer 206b1 preferably contains at least indium in order that the carrier mobility (electron mobility) is high. Since the oxide semiconductor layer 206c1 includes one or more elements other than oxygen included in the oxide semiconductor layer 206b1, interface scattering is unlikely to occur at the interface between the oxide semiconductor layer 206b1 and the oxide semiconductor layer 206c1. Thus, the transistor can have high field-effect mobility because the movement of carriers is not hindered at the interface.

The oxide semiconductor layer 206c1 may contain, for example, aluminum, titanium, silicon, gallium, germanium, yttrium, zirconium, tin, lanthanum, cerium, or hafnium at a higher proportion than indium. Specifically, the amount of any of the above elements in the oxide semiconductor layer 206c1 in an atomic ratio is 1.5 times or more, preferably 2 times or more, more preferably 3 times or more as much as that of indium in an atomic ratio. The above elements increase the energy gap of the oxide semiconductor layer in some cases. When any of the above elements is contained in the oxide semiconductor layer at a high proportion, it decreases the electron affinity of the oxide semiconductor layer in some cases. The above elements block an impurity of the oxide semiconductor layer or reduce the diffusion coefficient of an impurity in some cases. The oxide semiconductor layer 206c1 contains any of the above elements at a higher proportion than the oxide semiconductor layer 206b1.

Note that the oxide semiconductor layer 206a and the oxide semiconductor layer 206b1 may have different physical properties.

In the case of using an In—M—Zn oxide as the oxide semiconductor layer 206a, when summation of In and M is assumed to be 100 atomic %, the proportions of In and M are preferably less than 50 atomic % and greater than or equal to 50 atomic %, respectively, and more preferably less than 25 atomic % and greater than or equal to 75 atomic %, respectively. In the case of using an In—M—Zn oxide as the oxide semiconductor layer 206b1, when summation of In and M is assumed to be 100 atomic %, the proportions of In and M are preferably greater than or equal to 25 atomic % and less than 75 atomic %, respectively, and more preferably greater than or equal to 34 atomic % and less than 66 atomic %, respectively. In the case of using an In—M—Zn oxide as the oxide semiconductor layer 206c1, when summation of In and M is assumed to be 100 atomic %, the proportions of In and M are preferably less than 50 atomic % and greater than or equal to 50 atomic %, respectively, and more preferably less than 25 atomic % and greater than or equal to 75 atomic %, respectively.

The thickness of the oxide semiconductor layer 206a is greater than or equal to 5 nm and less than or equal to 100 nm, preferably greater than or equal to 5 nm and less than or equal to 50 nm. The thickness of the oxide semiconductor layer 206b1 is greater than or equal to 5 nm and less than or equal to 200 nm, preferably greater than or equal to 5 nm and less than or equal to 100 nm, more preferably greater than or equal to 5 nm and less than or equal to 50 nm. The thickness of the oxide semiconductor layer 206c1 is greater than or equal to 5 nm and less than or equal to 100 nm, preferably greater than or equal to 5 nm and less than or equal to 50 nm.

Here, in some cases, there is a mixed region of the oxide semiconductor layer 206b1 and the oxide semiconductor layer 206c1 between the oxide semiconductor layer 206b1 and the oxide semiconductor layer 206c1. In that case, the density of defect states is probably very low in the vicinity of the interface; thus, as in the band structure in FIG. 2A2, the energy is continuously changed in the vicinity of the interface between the oxide semiconductor layer 206b1 and the oxide semiconductor layer 206c1 (continuous connection).

Thus, it indicates that the above mixed region serves as a protective layer with extremely low density of defect states. On the other hand, in a region of the oxide semiconductor layer 206c1 other than this mixed region, the density of defect states may be relatively high. For example, on the assumption that a channel of a transistor is formed in the oxide semiconductor layer 206b1, when the oxide semiconductor layer 206c1 includes a region with high density of defect states, a current path may be formed in the defect states, for example. Alternatively, for example, a positive charge may be trapped in the defect state, so that the threshold voltage of the transistor shifts in the negative direction. By suppressing entry of an impurity such as water when the oxide semiconductor layer 206c1 is formed or by performing dehydrogenation treatment and oxygen adding treatment after the film formation, the density of defect states of the oxide semiconductor layer 206c1 can be reduced. Note that depending on performance of a film formation apparatus or the like, the density of defect states cannot be reduced sufficiently in some cases.

Next, the oxide semiconductor layer 206c1 is etched, so that an oxide semiconductor layer 206c2 with a thickness reduced by Δt3 is formed (see FIG. 2B1). Note that the oxide semiconductor layer 206c2 is formed to a thickness of greater than or equal to 0 nm and less than 5 nm. The oxide semiconductor layer 206c2 includes the above-described mixed region. The thus obtained oxide semiconductor layer 206c2 can be referred to as an oxide semiconductor layer in which the region with a high density of defect states is removed from the oxide semiconductor layer 206c1. FIG. 2B2 illustrates a band structure taken along dashed-dotted line X2-Y2 in FIG. 2B1. This step can be used even in the case where the density of defect states of the oxide semiconductor layer 206c1 becomes high because of performance of a film formation apparatus or the like. However, it is preferable that the density of defect states of the oxide semiconductor layer 206c1 be as low as possible.

Here, the above-described mixed region is a region in which the energy in the vicinity of the interface between the oxide semiconductor layer 206b1 and the oxide semiconductor layer 206c2 is continuously changed as in the band structure in FIG. 2B2.

Next, the oxide semiconductor layer 206c2 is etched so that the thickness thereof is reduced by Δt4. It is preferable that chemical reaction be utilized in the etching. The etching utilizing chemical reaction may be performed by changing the oxide semiconductor layer 206b1 and/or the oxide semiconductor layer 206c2 in quality with use of a solution containing one or more of phosphoric acid, nitric acid, hydrofluoric acid, hydrochloric acid, sulfuric acid, acetic acid, oxalic acid, and the like. In this manner, indium (indium oxide) contained in the oxide semiconductor layer 206b1 and/or the oxide semiconductor layer 206c2 is etched first and the element M (M oxide) may remain, so that the oxide semiconductor layer 206c which is the reacted region is obtained. Further, the oxide semiconductor layer 206b which is an unreacted region of the oxide semiconductor layer 206b1 remains. In the case where the oxide semiconductor layer 206b1 is not reacted at all, the oxide semiconductor layer 206b may be the same as the oxide semiconductor layer 206b1. Through the above steps, the oxide semiconductor layer 206 including the oxide semiconductor layer 206b and the oxide semiconductor layer 206c protecting the oxide semiconductor layer 206b can be formed (see FIG. 2C1).

The energy gap Eg7 of the oxide semiconductor layer 206c is larger than the energy gap of the oxide semiconductor layer 206b (Eg5: the same as that of the oxide semiconductor layer 206b1). Since the atomic ratio of the element M is higher than that of the oxide semiconductor layer 206c2, the energy gap Eg7 of the oxide semiconductor layer 206c is larger than the energy gap of the oxide semiconductor layer 206c2 (Eg6: the same as that of the oxide semiconductor layer 206c1). FIG. 2C2 illustrates a band structure taken along dashed-dotted line X2-Y2 in FIG. 2C1.

Through the above steps, it is possible to form the oxide semiconductor layer 206 including the oxide semiconductor layer 206a, the oxide semiconductor layer 206b over the oxide semiconductor layer 206a, and the oxide semiconductor layer 206c which is over the oxide semiconductor layer 206b and protects the oxide semiconductor layer 206b. Note that when the boundary between the oxide semiconductor layer 206b and the oxide semiconductor layer 206c is not clear, it can be said in some cases that the oxide semiconductor layer 206 includes a region corresponding to the oxide semiconductor layer 206b and a region corresponding to the oxide semiconductor layer 206c.

Next, the insulating film 118 is provided over the oxide semiconductor layer 206 (see FIG. 2D1). In the case where the insulating film 118 contains an impurity for the oxide semiconductor layer (particularly silicon), the impurity enters the oxide semiconductor layer 206 from the insulating film 118 in some cases, for example. However, the oxide semiconductor layer 206c has a high proportion of the element M which may block an impurity or reduce the diffusion coefficient of an impurity; thus, the amount of impurity reaching at least the oxide semiconductor layer 206b among the oxide semiconductor layer 206 can be reduced. FIG. 2D2 illustrates a band structure taken along dashed-dotted line X2-Y2 in FIG. 2D1.

By applying the above-described oxide semiconductor layer to a transistor whose channel is formed in an oxide semiconductor layer, a transistor with stable electric characteristics can be provided. It is possible to provide a transistor with low off-state current. It is possible to provide an enhancement transistor. It is possible to provide a transistor having high field-effect mobility. It is possible to provide a transistor with a small number of manufacturing steps. It is possible to provide a transistor with high yield.

<1-3. Expansion of Model B>

In the case where the oxide semiconductor layer is formed into an island shape, Model B can be expanded to side surfaces of the oxide semiconductor layer. FIGS. 3A1 to 3A3 are a cross-sectional view of oxide semiconductor layers provided over an insulating film and band diagrams.

First, in a sample including the oxide semiconductor layer 206a over the insulating film 112, the oxide semiconductor layer 206b, and the oxide semiconductor layer 206c over the oxide semiconductor layer 206b, an oxide semiconductor layer 206d having physical properties similar to those of the oxide semiconductor layer 206c is formed on side surfaces of the oxide semiconductor layer 206 (see FIG. 3A1). FIG. 3A2 illustrates a band structure taken along dashed-dotted line X2-Y2 in FIG. 3A1. FIG. 3A3 illustrates a band structure taken along dashed-dotted line X3-Y3 in FIG. 3A1.

As illustrated in FIG. 3A1, in the oxide semiconductor layer 206, the bottom surface of the oxide semiconductor layer 206b is protected by the oxide semiconductor layer 206a, the top surface thereof is protected by the oxide semiconductor layer 206c, and the side surfaces thereof are protected by the oxide semiconductor layer 206d.

By applying the above-described oxide semiconductor layer to a transistor whose channel is formed in an oxide semiconductor layer, a transistor with stable electric characteristics can be provided. It is possible to provide a transistor with low off-state current. It is possible to provide an enhancement transistor. It is possible to provide a transistor having high field-effect mobility. It is possible to provide a transistor with a small number of manufacturing steps. It is possible to provide a transistor with high yield.

Note that Model A can be also expanded similarly.

<1-4. State Relating to Oxygen Vacancy>

States due to oxygen vacancy, which is one of defect states of an oxide semiconductor layer, are described. Here, the case where the oxide semiconductor layer includes an In—Ga—Zn oxide is described.

FIG. 4 illustrates a band structure of an oxide semiconductor layer (OS). The oxide semiconductor layer has a shallow level DOS and a deep level DOS. Note that in this specification, the shallow level DOS refers to a state between energy at the bottom of the conduction band (Ec) and the mid gap.

Further, the deep level DOS refers to a state between energy at the top of the valence band (Ev) and the mid gap. Note that the shallow level DOS is likely to exist in the vicinity of a surface (vicinity of an interface with an insulating film (Insulator)), and the deep level DOS is likely to exist in a bulk.

For example, in the case where an insulating film in contact with an oxide semiconductor layer contains silicon, a bond between oxygen and indium contained in the oxide semiconductor layer is cut and a bond between the oxygen and silicon is generated in some cases. This is because the bond energy between silicon and oxygen is high and the bond energy between indium and oxygen is relatively low. In this case, a site of oxygen bonded to indium becomes an oxygen vacancy (Vo). Therefore, silicon may adversely influence the oxide semiconductor layer. Further, in the oxide semiconductor layer, a bond between indium and oxygen is easily cut; thus, an oxygen vacancy occurs because of damage caused by plasma, a sputtering particle, or the like in some cases. The oxygen vacancy becomes a deep level DOS and a hole trap state (hole trap).

In addition, oxygen vacancies are unstable in the oxide semiconductor layer. Accordingly, oxygen vacancies become a metastable state by trapping hydrogen. The oxygen vacancy becomes a shallow level DOS by trapping hydrogen and serves as an electron trap state (electron trap) or an electron generation source. That is, the shallow level DOS is charged positively or negatively.

Note that by supplying oxygen to the oxide semiconductor layer, the density of oxygen vacancies of the oxide semiconductor layer can be reduced in some cases. The oxygen vacancies can be stable and electrically neutral by entry of oxygen. For example, when excess oxygen is contained in the oxide semiconductor layer or an insulating film provided in the vicinity of the oxide semiconductor layer, oxygen vacancies in the oxide semiconductor layer can be effectively reduced. Excess oxygen refers to oxygen in excess of the stoichiometric composition, for example. Alternatively, excess oxygen refers to oxygen released by heating, for example. In the oxide semiconductor layer, an oxygen vacancy may seem to move by capturing adjacent oxygen atoms. Similarly, excess oxygen may seem to move in the oxide semiconductor layer.

As described above, the oxygen vacancy may become a metastable state or a stable state by hydrogen or oxygen. In the case where the concentration of hydrogen in the oxide semiconductor layer is high, more hydrogen is trapped by oxygen vacancies. In contrast, in the case where the concentration of hydrogen in the oxide semiconductor layer is low, less hydrogen is trapped by oxygen vacancies.

In consideration of only relative positions of a hydrogen bond, hydrogen, an oxygen vacancy, and oxygen, it can be understood that shallow level DOS is positively or negatively charged. Hydrogen forms $H^+ + e^-$ to make the oxide semiconductor layer have n-type conductivity. Further, hydrogen is trapped by oxygen vacancies (VoH). The oxygen vacancies are considered to a valence of approximately $-0.7 \pm 1.0$, and VoH is positively charged. As a result, in $H^+ + e^-$, an n-type region is formed in the oxide semiconductor layer.

Examples of forming the shallow level DOS include the following modes.

For example, there is Model 1, Si—O—H . . . Vo-In. In this case, H . . . Vo is negatively charged. Further, Model 2, Si—O . . . H-Vo-In, is given as an example. In this case, H-Vo is positively charged. Since much silicon exists in the vicinity of the surface of the oxide semiconductor layer, the shallow level DOS represented by Model 1 and Model 2 is easily generated in the vicinity of the surface (also referred to as a surface DOS). Note that the reaction of Model 2 is probably unlikely to occur. A symbol " . . . " in Model denotes a hydrogen bond.

The same applies to the case where silicon is replaced with indium. For example, there is Model 3, In—O—H . . . Vo-In. In this case, H . . . Vo is negatively charged. Further, Model 4, In—O . . . H-Vo-In, is given as an example. In this case, H-Vo is positively charged. Model 3 and Model 4 in which silicon in Model 1 and Model 2 is replaced with indium are easily generated not only in the vicinity of the surface of the oxide semiconductor layer but also in a bulk (also referred to as a bulk DOS). Model 3 and Model 4 are frequently generated in the oxide semiconductor layer in which the proportion of indium is high in an atomic ratio.

A deterioration mechanism of a transistor caused by the deep level DOS is described below with reference to FIGS. 5A to 5C.

Figure 5A:
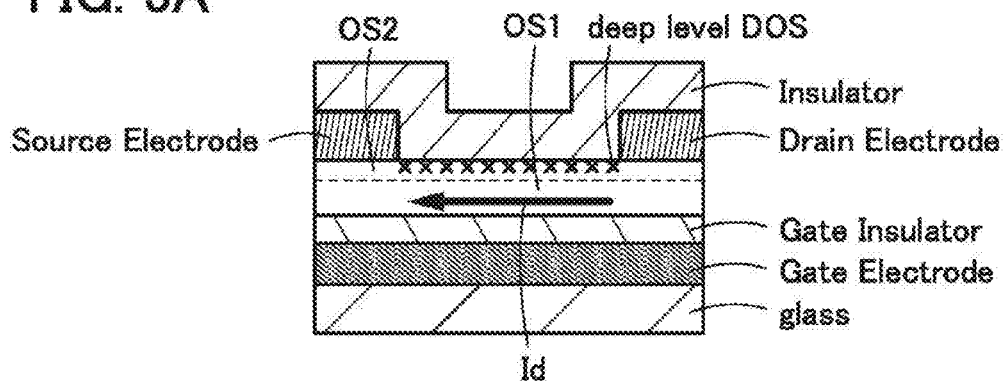
FIG. 5A is a cross-sectional view of a transistor.

FIG. 5A is a cross-sectional view of a transistor. The transistor includes a gate electrode (Gate Electrode) over glass (glass), a gate insulating film (Gate Insulator) over the gate electrode, a first oxide semiconductor layer (OS1) over the gate insulating film, a second oxide semiconductor layer (OS2) over the first oxide semiconductor layer, a source electrode (Source Electrode) and a drain electrode (Drain Electrode) over the second oxide semiconductor layer, and an insulating film (Insulator) over the second oxide semiconductor layer, the source electrode, and the drain electrode.

The first oxide semiconductor layer has higher electron affinity than the second oxide semiconductor layer. In that case, when voltage Vg is applied to the gate electrode in a state where drain voltage Vd (voltage between the source electrode and the drain electrode) is applied, a channel is formed in the first oxide semiconductor layer, so that drain current Id flows.

Figure 5B:
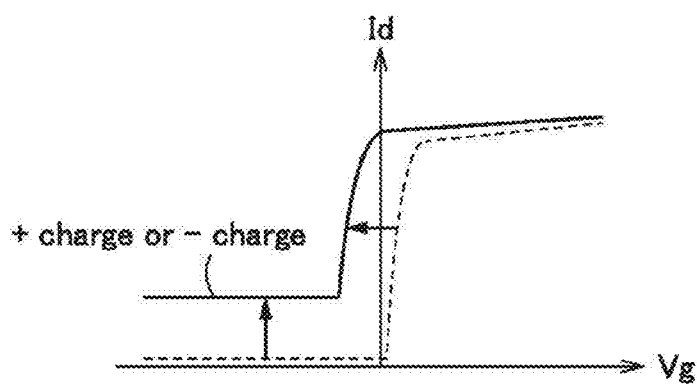
FIG. 5B shows Vg-Id characteristics thereof.

FIG. 5B shows Vg-Id characteristics of the transistor in FIG. 5A. In FIG. 5B, a broken line indicates Vg-Id characteristics in the case where the deep level DOS does not exist in the second oxide semiconductor layer, and a solid line indicates Vg-Id characteristics in the case where the deep level DOS exists in the second oxide semiconductor layer.

Figure 5C:
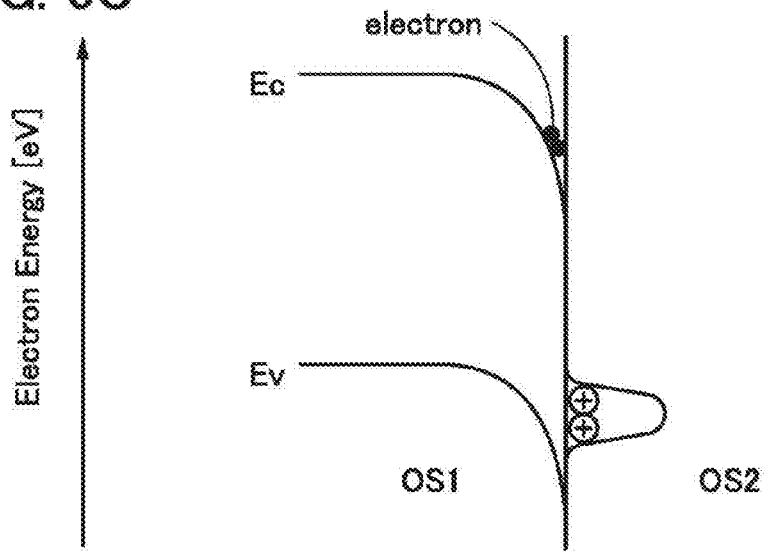
FIG. 5C shows a band structure thereof.

In the transistor in FIG. 5A, in the case where the deep level DOS exists in the second oxide semiconductor layer, holes having positive charge are trapped by the deep level DOS by applying voltage to the drain electrode, applying voltage to the gate electrode, or applying external energy such as light to the first oxide semiconductor layer or the second oxide semiconductor layer (see FIG. 5C). In the case where positive charges are trapped by the deep level DOS, the charges cannot be released and might behave like fixed charges. Thus, the threshold voltage of the transistor shifts in the negative direction.

Further, by positive charges trapped by the deep level DOS, the band bends downward and a certain number of electrons flow from the source electrode, so that certain current may flow through the back channel side (side in contact with the insulating film) of the transistor even when the gate voltage is less than 0 V.

Accordingly, it is preferable that states such as a deep level DOS do not exist also in the second oxide semiconductor layer. In other words, it is preferable that the second oxide semiconductor layer be made dense by crystallization or the like. Note that in order to prevent defects at an interface between the first oxide semiconductor layer and the second oxide semiconductor layer, both the first oxide semiconductor layer and the second oxide semiconductor layer preferably include a c-axis aligned crystalline oxide semiconductor (CAAC-OS). The CAAC-OS is described later.

<2. Transistor>

A transistor including a multilayer film 306 is described below.

<2-1. Transistor Structure (1)>

Here, a bottom-gate transistor is described. In this section, a bottom-gate top-contact (BGTC) transistor which is one kind of a bottom-gate transistor is described with reference to FIGS. 6A to 6D.

Figure 6A:
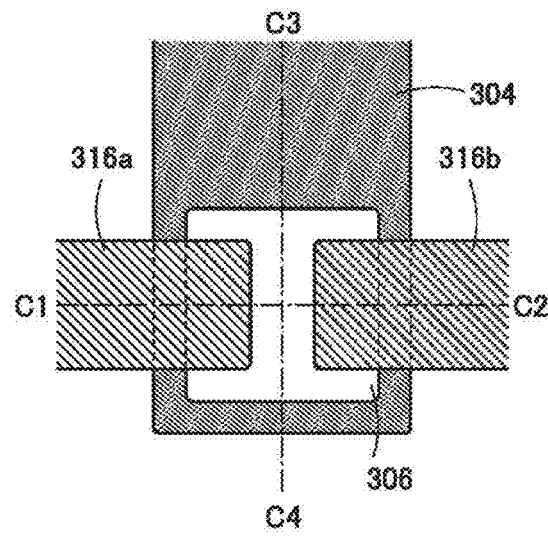
FIGS. 6A to 6D are a top view and cross-sectional views illustrating an example of a semiconductor device of one embodiment of the present invention.
Figure 6C:
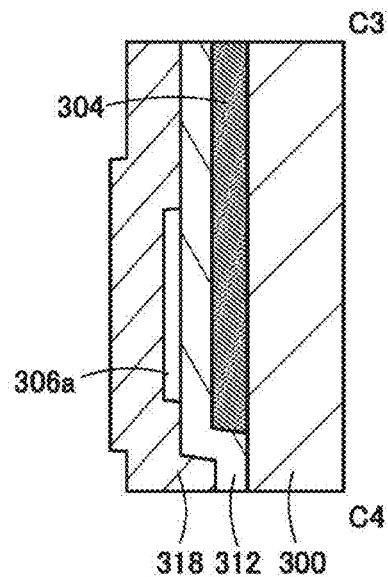
Figure 6B:
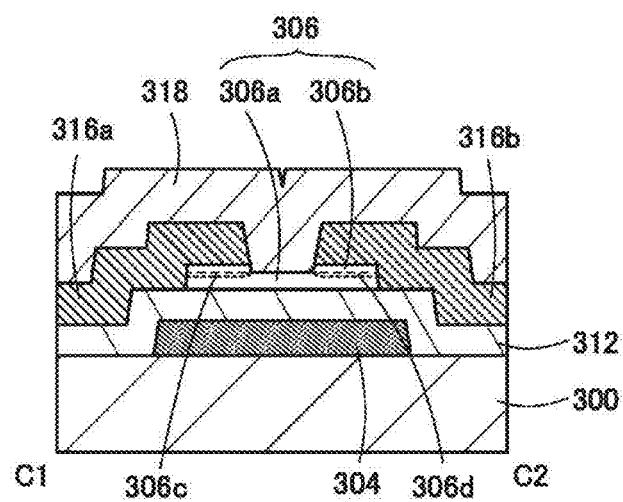

FIGS. 6A to 6D are a top view and cross-sectional views illustrating a BGTC transistor. FIG. 6A is a top view of the transistor. FIG. 6B is a cross-sectional view taken along dashed-dotted line C1-C2 in FIG. 6A. FIG. 6C is a cross-sectional view taken along dashed-dotted line C3-C4 in FIG. 6A.

The transistor illustrated in FIGS. 6A to 6C includes a gate electrode 304 provided over a substrate 300, a gate insulating film 312 provided over the gate electrode 304, the multilayer film 306 which includes an oxide semiconductor layer 306a provided over the gate insulating film 312 and an oxide semiconductor layer 306b provided over the oxide semiconductor layer 306a, a source electrode 316a and a drain electrode 316b provided over the gate insulating film 312 and the multilayer film 306, and an insulating film 318 provided over the multilayer film 306, the source electrode 316a, and the drain electrode 316b.

Note that a conductive film used for the source electrode 316a and the drain electrode 316b or the oxide semiconductor layer 306b takes oxygen from part of the oxide semiconductor layer 306b or forms a mixed layer depending on the kind of the conductive film used for the source electrode 316a and the drain electrode 316b or the oxide semiconductor layer 306b, which results in formation of a source region 306c and a drain region 306d in the oxide semiconductor layer 306b.

Figure 7A:
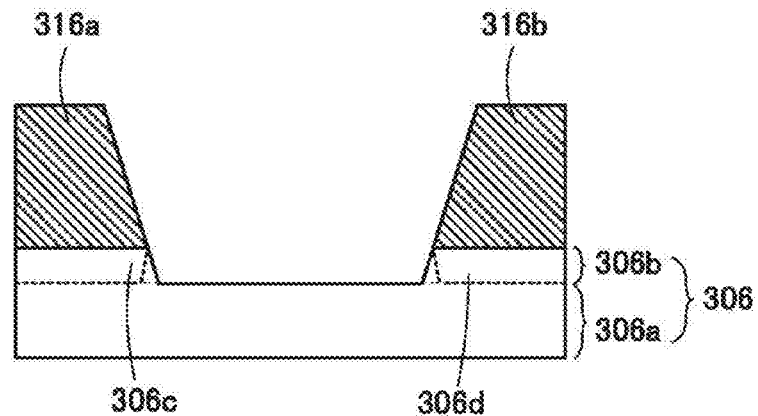
FIGS. 7A to 7C are cross-sectional views each illustrating an example of a semiconductor device of one embodiment of the present invention.
Figure 7B:
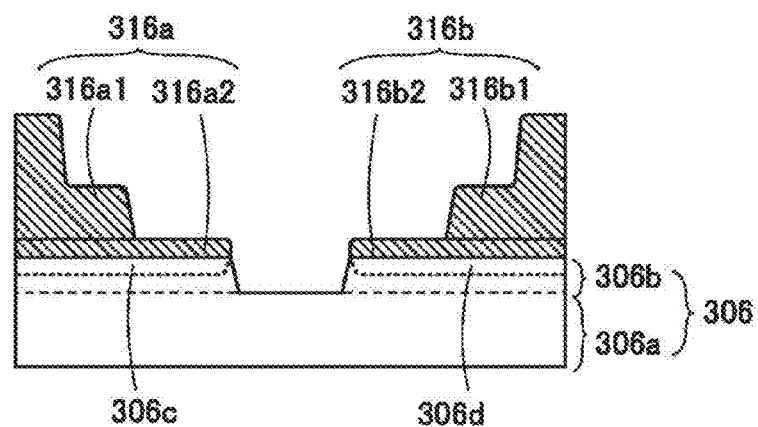
Figure 7C:
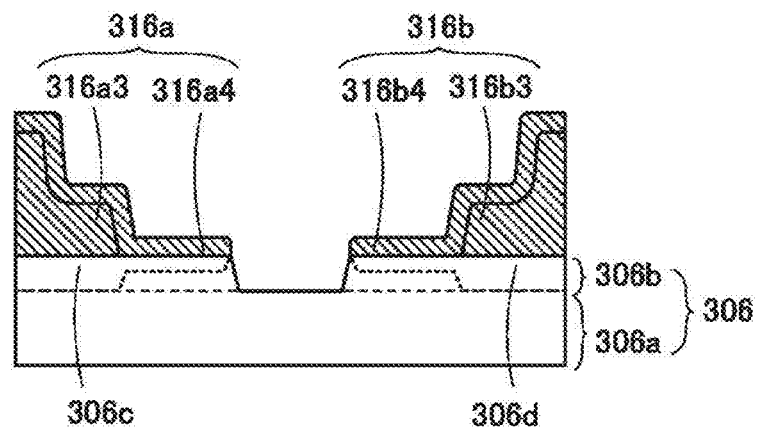

FIGS. 7A to 7C are cross-sectional views of the vicinities of the source electrode 316a and the drain electrode 316b of the transistor. The source electrode 316a and the drain electrode 316b may have any structure illustrated in FIGS. 7A to 7C. In some cases, the top surface of the multilayer film 306 has a recessed portion formed at the time of forming the source electrode 316a and the drain electrode 316b; however, the portion is not illustrated in FIGS. 7A to 7C for easy understanding.

The structure in FIG. 7A is similar to that of the source electrode 316a and the drain electrode 316b in FIG. 6B. In such a structure, the source region 306c and the drain region 306d are formed in regions of the multilayer film 306 adjacent to the source electrode 316a and the drain electrode 316b and are indicated by dashed lines. The source region 306c and the drain region 306d are formed by damage at the time of forming the source electrode 316a and the drain electrode 316b over the multilayer film 306 or by an oxygen vacancy in the multilayer film 306 caused by the action of the conductive film which forms the source electrode 316a and the drain electrode 316b. Although the source region 306c and the drain region 306d reach the vicinity of the oxide semiconductor layer 306a of the multilayer film 306, the present invention is not limited thereto. For example, the source region 306c and the drain region 306d may be formed only an upper portion of the oxide semiconductor layer 306b of the multilayer film 306. The source region 306c and the drain region 306d have higher carrier density (lower resistance) than the oxide semiconductor layer 306b and the oxide semiconductor layer 306a.

In the structure illustrated in FIG. 7B, a conductive layer 316a2 which is not easily oxidized and a conductive layer 316a1 provided over the conductive layer 316a2 are used as the source electrode 316a, and a conductive layer 316b2 which is not easily oxidized and a conductive layer 316b1 provided over the conductive layer 316b2 are used as the drain electrode 316b. Note that the conductive layer which is not easily oxidized is unlikely to reduce the multilayer film 306. When the source electrode 316a and the drain electrode 316b have structures illustrated in FIG. 7B, the source region 306c and the drain region 306d are formed only in the oxide semiconductor layer 306b of the multilayer film 306. In that case, diffusion of oxygen vacancies in the channel length direction is small, so that the channel formation region is less likely to have n-type conductivity. Further, owing to the conductive layer 316a1 and the conductive layer 316b1, the conductive layer 316a2 and the conductive layer 316b2 may have low conductivity. Thus, the thicknesses of the conductive layer 316a2 and the conductive layer 316b2 can be small, which leads to easy microfabrication. In other words, the structure illustrated in FIG. 7B is favorable for a miniaturized transistor having a small channel length.

In the structure illustrated in FIG. 7C, a conductive layer 316a3 and a conductive layer 316a4 which is not easily oxidized and is provided over the conductive layer 316a3 are used as the source electrode 316a, and a conductive layer 316b3 and a conductive layer 316b4 which is not easily oxidized and is provided over the conductive layer 316b3 are used as the drain electrode 316b. When the source electrode 316a and the drain electrode 316b have structures illustrated in FIG. 7C, the source region 306c and the drain region 306d formed in the multilayer film 306 each include a region formed adjacent to the oxide semiconductor layer 306a of the multilayer film 306 and a region formed only in an upper portion of the semiconductor layer 306b. In that case, diffusion of oxygen vacancies in the channel length direction is small, so that the channel formation region is less likely to have n-type conductivity. Since the source region 306c and the drain region 306d below the conductive layer 316a3 and the conductive layer 316b3 reach the oxide semiconductor layer 306a, the resistance between the source electrode 316a and the drain electrode 316b is small; as a result, the field-effect mobility of the transistor can be increased. Further, owing to the conductive layer 316a3 and the conductive layer 316b3, the conductive layer 316a4 and the conductive layer 316b4 can have low conductivity. Thus, the thicknesses of the conductive layer 316a4 and the conductive layer 316b4 can be small, which leads to easy microfabrication. In other words, the structure illustrated in FIG. 7C is favorable for a miniaturized transistor having a small channel length.

In FIG. 6A, the distance between the source electrode 316a and the drain electrode 316b in a region overlapping with the gate electrode 304 is called channel length. Note that in the case where the transistor includes the source region 306c and the drain region 306d, the distance between the source region 306c and the drain region 306d in a region overlapping with the gate electrode 304 may be called channel length.

Note that a channel formation region refers to a region, which overlaps with the gate electrode 304 and is interposed between the source electrode 316a and the drain electrode 316b, in the multilayer film 306 (see FIG. 6B). In addition, a channel refers to a region where current mainly flows in the channel formation region.

Note that as illustrated in FIG. 6A, the gate electrode 304 is provided such that the edge of the multilayer film 306 is located on the inner side of the edge of the gate electrode 304 in the top view. This can suppress generation of carriers in the multilayer film 306 due to light entering from the substrate 300 side. In other words, the gate electrode 304 functions as a light-blocking film. Note that the edge of the multilayer film 306 may be located on the outer side of the edge of the gate electrode 304.

<2-1-1. Multilayer Film>

The multilayer film 306 and the oxide semiconductor layer 306a and the oxide layer 306b which are included in the multilayer film 306 are described below.

For the oxide semiconductor layer 306b, the above description of the oxide semiconductor layer 106b1 or the oxide semiconductor layer 206c1 is referred to. For the oxide semiconductor layer 306a, the above description of the oxide semiconductor layer 106 or the oxide semiconductor layer 206 is referred to. In that case, when an electric field is applied to the gate electrode 304, a channel is formed in a region having higher electron affinity (a region corresponding to the oxide semiconductor layer 106a) of the oxide semiconductor layer 306a. That is, forming a region protecting the oxide semiconductor layer (a region corresponding to the oxide semiconductor layer 106b) between the region of an oxide semiconductor layer in which a channel is formed and the insulating film 318 (also referred to as an upper surface of the oxide semiconductor layer 306a (a region with a depth of approximately 0 nm to 5 nm from the surface)) enables the channel of the transistor to be formed in the region of the oxide semiconductor layer which is apart from the insulating film 318. Further, since current hardly flows at the interface between the oxide semiconductor layer 306a and the insulating film 318, interface scattering is unlikely to occur at the interface. Thus, movement of carriers is not inhibited in the oxide semiconductor layer 306a, which results in an increase in the field-effect mobility of the transistor. Further, a defect state is unlikely to be formed in the oxide semiconductor layer 306a. When a defect state exists in the oxide semiconductor layer 306a, the off-state current of the transistor is increased or the threshold voltage of the transistor varies in some cases. As a result, variation in the electric characteristics such as the threshold voltage of a transistor can be reduced.

The thickness of the oxide semiconductor layer 306b is greater than or equal to 3 nm and less than or equal to 100 nm, preferably greater than or equal to 3 nm and less than or equal to 50 nm. The thickness of the oxide semiconductor layer 306a is greater than or equal to 3 nm and less than or equal to 200 nm, preferably greater than or equal to 3 nm and less than or equal to 100 nm, more preferably greater than or equal to 3 nm and less than or equal to 50 nm.

The multilayer film 306 is not limited to the case of including two oxide semiconductor layers. For example, the multilayer film 306 may include three or more oxide semiconductor layers.

In the case where the oxide semiconductor layer 306b is formed by a sputtering method, a target containing indium is preferably used in order to prevent an increase in the number of particles. Moreover, it is preferable to use an oxide target in which the proportion of gallium is relatively small. Particularly in the case where a target containing indium is used, the conductivity of the target can be increased and DC discharge is facilitated; thus, deposition over a large substrate can be easily performed. Thus, semiconductor devices can be manufactured with improved productivity.

An oxide semiconductor layer applicable to the oxide semiconductor layer 306b was formed by a sputtering method, and the number of particles with a size of 1 μm or more was measured.

The measurement was performed on the following samples: a sample formed using a gallium oxide target; a sample formed using a Ga—Zn oxide (having an atomic ratio of Ga:Zn=2:5) target; a sample formed using an In—Ga—Zn oxide (having an atomic ratio of In:Ga:Zn=3:1:2) target; a sample formed using an In—Ga—Zn oxide (having an atomic ratio of In:Ga:Zn=1:1:1) target; a sample formed using an In—Ga—Zn oxide (having an atomic ratio of In:Ga:Zn=1:3:2) target; and a sample formed using an In—Ga—Zn oxide (having an atomic ratio of In:Ga:Zn=1:6:4) target.

Figure 13:
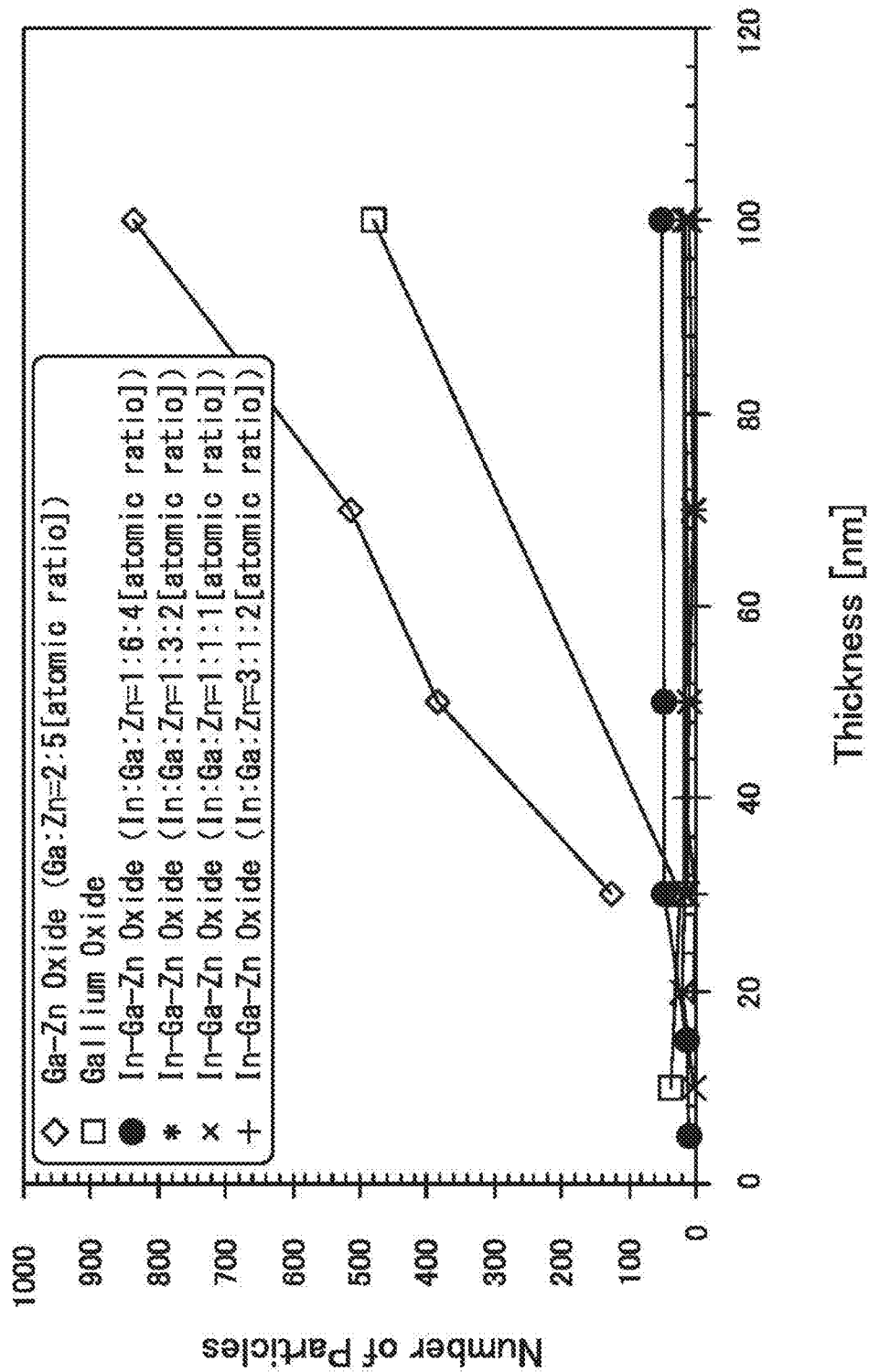
FIG. 13 is a graph showing the number of particles in oxide semiconductor layers of one embodiment of the present invention.

According to FIG. 13, in the sample formed using the gallium oxide target and the sample formed using the Ga—Zn oxide target, the number of particles with a size of 1 µm or more rapidly increases as the thickness of the oxide semiconductor layer increases. On the other hand, in the samples formed using the In—Ga—Zn oxide targets, the number of particles with a size of 1 µm or more is unlikely to increase even when the thickness of the oxide semiconductor layer increases.

The concentration of silicon in each of the oxide semiconductor layer 306a and the oxide semiconductor layer 306b is described below. In order to obtain stable electric characteristics of a transistor, it is effective to reduce the concentration of impurities in the oxide semiconductor layer 306a so that the oxide semiconductor layer 306a is highly purified to be intrinsic. The carrier density of the oxide semiconductor layer 306a is set to lower than $1\times10^{17}/cm^3$, lower than $1\times10^{15}/cm^3$, or lower than $1\times10^{13}/cm^3$. In the oxide semiconductor layer 306a, a light element, a semimetal element, a metal element, and the like (lower than 1 atomic %), other than main components serve as impurities. For example, hydrogen, nitrogen, carbon, silicon, germanium, titanium, and hafnium serve as impurities in the oxide semiconductor layer 306a. Thus, the concentrations of impurities in the gate insulating film 312 and/or the oxide semiconductor layer 306b which are adjacent to the oxide semiconductor layer 306a are preferably reduced.

For example, when silicon is contained in the oxide semiconductor layer 306a, an impurity state is formed. In particular, when silicon exists on the surface of the oxide semiconductor layer 306a, the impurity state becomes a trap. For this reason, the concentration of silicon in a region between the oxide semiconductor layer 306a and the oxide semiconductor layer 306b is set to lower than $1\times10^{19}$ atoms/cm$^3$, preferably lower than $5\times10^{18}$ atoms/cm$^3$, more preferably lower than $2\times10^{18}$ atoms/cm$^3$.

Further, hydrogen and nitrogen in the oxide semiconductor layer 306a form donor levels, which increase carrier density. The concentration of hydrogen in the oxide semiconductor layer 306a, which is measured by secondary ion mass spectrometry (SIMS), is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, which is measured by SIMS, is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentrations of hydrogen and nitrogen in the oxide semiconductor layer 306b in order to reduce the concentrations of hydrogen and nitrogen in the oxide semiconductor layer 306a. The concentration of hydrogen in the oxide semiconductor layer 306b, which is measured by SIMS, is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, which is measured by SIMS, is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

A structure of an oxide semiconductor layer which can be used for the oxide semiconductor layer 306a, the oxide semiconductor layer 306b, and the like is described below.

An oxide semiconductor layer is classified roughly into a non-single-crystal oxide semiconductor layer and a single-crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of c-axis aligned crystal parts.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

Most of the crystal parts included in the CAAC-OS layer each fit inside a cube whose one side is less than 100 nm. Thus, there is a case where a crystal part included in the CAAC-OS layer fits a cube whose one side is less than 10 nm, less than 5 nm, or less than 3 nm. Note that when a plurality of crystal parts included in the CAAC-OS layer are connected to each other, one large crystal region is formed in some cases. For example, a crystal region with an area of 2500 nm$^2$ or more, 5 µm$^2$ or more, or 1000 µm$^2$ or more is observed in some cases in the plan TEM image.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56° in some cases. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, distribution of c-axis aligned crystal parts in the CAAC-OS layer is not necessarily uniform. For example, in the case where crystal growth leading to the crystal parts of the CAAC-OS layer occurs from the vicinity of the top surface of the layer, the proportion of the c-axis aligned crystal parts in the vicinity of the top surface is higher than that in the vicinity of the formation surface in some cases. Further, when an impurity is added to the CAAC-OS layer, a region to which the impurity is added is altered, and the proportion of the c-axis aligned crystal parts in the CAAC-OS layer varies depending on regions, in some cases.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ do not appear at around 36°.

The CAAC-OS layer is an oxide semiconductor layer having a low impurity concentration. The impurity means an element other than the main components of the oxide semiconductor layer, such as hydrogen, carbon, silicon, or a transition metal element. In particular, an element (e.g., silicon) having higher strength of bonding to oxygen than a metal element included in the oxide semiconductor layer takes oxygen away in the oxide semiconductor layer to disrupt the atomic arrangement in the oxide semiconductor layer, which causes a lowering of the crystallinity of the oxide semiconductor layer. A heavy metal such as iron or nickel, argon, carbon dioxide, or the like has a large atomic radius (or molecular radius), and thus disrupts the atomic arrangement in the oxide semiconductor layer when included in the oxide semiconductor layer, which causes a lowering of the crystallinity of the oxide semiconductor layer. Note that the impurity included in the oxide semiconductor layer serves as a carrier trap or a carrier generation source in some cases.

The CAAC-OS layer is an oxide semiconductor layer having a low density of defect states. For example, oxygen vacancies in the oxide semiconductor layer serve as carrier traps or serve as carrier generation sources when hydrogen is trapped therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor layer has few carrier generation sources, and thus has a low carrier density. Thus, a transistor including the oxide semiconductor layer rarely has a negative threshold voltage (is rarely normally-on). A highly purified intrinsic or substantially highly purified intrinsic oxide semiconductor layer has few carrier traps. Thus, the transistor including the oxide semiconductor layer has a small variation in electric characteristics and accordingly has high reliability. Charges trapped by the carrier traps in the oxide semiconductor layer take a long time to be released and may behave like fixed charges. Thus, the transistor including the oxide semiconductor layer with a high impurity concentration and a high density of defect states has unstable electric characteristics in some cases.

In a transistor using the CAAC-OS layer, change in electric characteristics due to irradiation with visible light or ultraviolet light is small.

Next, a polycrystalline oxide semiconductor layer is described.

In an image obtained with a TEM, for example, crystal grains can be found in the polycrystalline oxide semiconductor layer. In most cases, the size of a crystal grain in the polycrystalline oxide semiconductor layer is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor layer in some cases.

The polycrystalline oxide semiconductor layer may include a plurality of crystal grains, and alignment of crystals may be different in the plurality of crystal grains. A polycrystalline oxide semiconductor layer is subjected to structural analysis with an XRD apparatus. For example, when the polycrystalline oxide semiconductor layer including an InGaZnO$_4$ crystal is analyzed by an out-of-plane method, peaks of 2θ appear at around 31°, 36°, and the like in some cases.

The polycrystalline oxide semiconductor layer has high crystallinity and thus has high electron mobility in some cases. Accordingly, a transistor including the polycrystalline oxide semiconductor layer has high field-effect mobility. Note that there are cases in which an impurity is segregated at the grain boundary between the crystals in the polycrystalline oxide semiconductor layer. Moreover, the grain boundary of the polycrystalline oxide semiconductor layer becomes a defect state. Since the grain boundary of the polycrystalline oxide semiconductor layer may serve as a carrier trap or a carrier generation source, a transistor including the polycrystalline oxide semiconductor layer has larger variation in electric characteristics and lower reliability than a transistor including a CAAC-OS layer in some cases.

Next, a microcrystalline oxide semiconductor layer is described.

In an image obtained with a TEM, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly detected in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS layer; thus, the orientation of the whole layer is not observed. Accordingly, in some cases, the nc-OS layer cannot be distinguished from an amorphous oxide semiconductor depending on an analysis method. For example, when the nc-OS layer is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS layer obtained by using an electron beam having a probe diameter (e.g., larger than or equal to 50 nm) larger than the diameter of a crystal part. Meanwhile, spots are shown in a nanobeam electron diffraction pattern of the nc-OS layer obtained by using an electron beam having a probe diameter (e.g., larger than or equal to 1 nm and smaller than or equal to 30 nm) close to, or smaller than the diameter of a crystal part. Further, in a nanobeam electron diffraction pattern of the nc-OS layer, regions with high luminance in a circular (ring) pattern are shown in some cases. Also in a nanobeam electron diffraction pattern of the nc-OS layer, a plurality of spots is shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Next, an amorphous oxide semiconductor layer is described.

The amorphous oxide semiconductor layer has disordered atomic arrangement and no crystal part. For example, the amorphous oxide semiconductor layer does not have a specific state as in quartz.

In an image obtained with a TEM, crystal parts cannot be found in the amorphous oxide semiconductor layer.

When the amorphous oxide semiconductor layer is subjected to structural analysis by an out-of-plane method with an XRD apparatus, a peak which shows a crystal plane does not appear. A halo pattern is shown in an electron diffraction pattern of the amorphous oxide semiconductor layer. Further, a halo pattern is shown but a spot is not shown in a nanobeam electron diffraction pattern of the amorphous oxide semiconductor layer.

The amorphous oxide semiconductor layer contains impurities such as hydrogen at a high concentration. In addition, the amorphous oxide semiconductor layer has a high density of defect states.

The oxide semiconductor layer having a high impurity concentration and a high density of defect states has many carrier traps or many carrier generation sources.

Accordingly, the amorphous oxide semiconductor layer has much higher carrier density than the nc-OS layer. Therefore, a transistor including the amorphous oxide semiconductor layer tends to be normally on. Thus, in some cases, such an amorphous oxide semiconductor layer can be applied to a transistor which needs to be normally on. Since the amorphous oxide semiconductor layer has a high density of defect states, carrier traps might be increased. Consequently, a transistor including the amorphous oxide semiconductor layer has larger variation in electric characteristics and lower reliability than a transistor including the CAAC-OS layer or the nc-OS layer.

Next, a single-crystal oxide semiconductor layer is described.

The single-crystal oxide semiconductor layer has a lower impurity concentration and a lower density of defect states (few oxygen vacancies). Thus, the carrier density can be decreased. Accordingly, a transistor including the single-crystal oxide semiconductor layer is unlikely to be normally on. Moreover, since the single-crystal oxide semiconductor layer has a lower impurity concentration and a lower density of defect states, carrier traps might be reduced. Thus, the transistor including the single-crystal oxide semiconductor layer has small variation in electric characteristics and accordingly has high reliability.

Note that when the oxide semiconductor layer has few defects, the density thereof is increased. When the oxide semiconductor layer has high crystallinity, the density thereof is increased. When the oxide semiconductor layer has a lower concentration of impurities such as hydrogen, the density thereof is increased. The single-crystal oxide semiconductor layer has higher density than the CAAC-OS layer. The CAAC-OS layer has higher density than the microcrystalline oxide semiconductor layer. The polycrystalline oxide semiconductor layer has higher density than the microcrystalline oxide semiconductor layer. The microcrystalline oxide semiconductor layer has higher density than the amorphous oxide semiconductor layer.

Note that an oxide semiconductor layer may be a stacked film including two or more layers of an amorphous oxide semiconductor layer, a microcrystalline oxide semiconductor layer, and a CAAC-OS layer, for example.

Note that when silicon and carbon are contained in the oxide semiconductor layer 306a at a high concentration, the crystallinity of the oxide semiconductor layer 306a is lowered in some cases. In order not to lower the crystallinity of the oxide semiconductor layer 306a, the concentration of silicon in the oxide semiconductor layer 306a is preferably set to lower than $1 \times 10^{19}$ atoms/cm$^3$, preferably lower than $5 \times 10^{18}$ atoms/cm$^3$, more preferably lower than $2 \times 10^{18}$ atoms/cm$^3$. Moreover, in order not to lower the crystallinity of the oxide semiconductor layer 306a, the concentration of carbon in the oxide semiconductor layer 306a is set to lower than $1 \times 10^{19}$ atoms/cm$^3$, preferably lower than $5 \times 10^{18}$ atoms/cm$^3$, more preferably lower than $2 \times 10^{18}$ atoms/cm$^3$.

As described above, in the case where the oxide semiconductor layer 306a in which a channel is formed has high crystallinity and the density of states due to an impurity or a defect is low, a transistor including the multilayer film 306 has stable electric characteristics.

Localized states of the multilayer film 306 are described below. By reducing the density of localized states due to defect states of the multilayer film 306, a transistor including the multilayer film 306 can have stable electric characteristics. The density of localized states of the multilayer film 306 can be measured by a constant photocurrent method (CPM).

In order that the transistor has stable electric characteristics, the absorption coefficient due to the localized states of the multilayer film 306 measured by CPM is preferably lower than $1\times10^{-3}$ cm$^{-1}$, more preferably lower than $3\times10^{-4}$ cm$^{-1}$. Further, when the absorption coefficient due to the localized states of the multilayer film 306 measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized states of the multilayer film 306 measured by CPM is lower than $1\times10-3$ cm$^{-1}$, preferably lower than $3\times10^{-4}$ cm$^{-1}$, the concentration of silicon, germanium, carbon, hafnium, titanium, and the like in the oxide semiconductor layer 306a which form localized states is preferably lower than $2\times10^{18}$ atoms/cm$^3$, more preferably lower than $2\times10^{17}$ atoms/cm$^3$.

DOS in a multilayer film including a first oxide semiconductor layer, a second oxide semiconductor layer, and a third oxide semiconductor layer in this order from the bottom was measured by CPM.

The first oxide semiconductor layer is an oxide semiconductor layer formed by a sputtering method using an In—Ga—Zn oxide (having an atomic ratio of In:Ga:Zn=1:3:2) target. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

As the second oxide semiconductor layer provided over the first oxide semiconductor layer, an oxide semiconductor layer formed by a sputtering method using an In—Ga—Zn oxide (having an atomic ratio of In:Ga:Zn=1:1:1) target was used. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

As the third oxide semiconductor layer provided over the second oxide semiconductor layer, an oxide semiconductor layer formed by a sputtering method using an In—Ga—Zn oxide (having an atomic ratio of In:Ga:Zn=1:3:2) target was used. Note that an argon gas (flow rate: 30 sccm) and an oxygen gas (flow rate: 15 sccm) were used as a deposition gas, the pressure was set to 0.4 Pa, the substrate temperature was set to 200° C., and a DC power of 0.5 kW was applied.

Here, in order to improve the accuracy of the CPM measurement, the multilayer film needs to have a certain thickness. Specifically, the thicknesses of the first oxide semiconductor layer, the second oxide semiconductor layer, and the third oxide semiconductor layer which are included in the multilayer film were set to 30 nm, 100 nm, and 30 nm, respectively.

In the CPM measurement, the amount of light with which a surface of the sample between terminals is irradiated is adjusted so that a photocurrent value is kept constant in the state where voltage is applied between a first electrode and a second electrode provided in contact with the multilayer film that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

FIG. 14A shows results of fitting the absorption coefficient (dotted line) measured using a spectrophotometer and the absorption coefficient (solid line) measured by CPM in the range of energy higher than or equal to the energy gap of each layer in a multilayer film. Note that the Urbach energy obtained based on the absorption coefficient measured by CPM was 78.7 meV. The integral value of the absorption coefficient was derived in such a manner that a background (thin dotted line) was subtracted from the absorption coefficient measured by CPM in FIG. 14A (see FIG. 14B). As a result, the absorption coefficient due to DOS of this sample was found to be $2.02\times10^{-4}$ cm$^{-1}$.

This indicates that an extremely small number of DOS is in the multilayer film. That is, the transistor including the multilayer film has high field-effect mobility and stable electric characteristics.

<2-1-2. Source Electrode and Drain Electrode>

The source electrode 316a and the drain electrode 316b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. The source electrode 316a and the drain electrode 316b are each preferably a multilayer film including a layer containing copper. The source electrode 316a and the drain electrode 316b are each a multilayer film including a layer containing copper, whereby wiring resistance can be reduced in the case where a wiring is formed in the same steps as the source electrode 316a and the drain electrode 316b. Note that the source electrode 316a and the drain electrode 316b may have the same composition or different compositions.

In the case where a multilayer film including a layer containing copper is used for the source electrode 316a and the drain electrode 316b, a defect state might be formed at the interface between the oxide semiconductor layer 306a and the insulating film 318 due to copper. Also in this case, when the oxide semiconductor layer 306a includes a protective region, variation in off-state current or threshold voltage of the transistor due to the defect state can be reduced. Thus, stable electric characteristics of a transistor can be achieved and wiring resistance can be reduced.

<2-1-3. Insulating Film>

The insulating film 318 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 318 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of released hydrogen gas or ammonia gas may be measured by thermal desorption spectroscopy (TDS). Further, as the silicon nitride layer, a silicon nitride layer which does not transmit or hardly transmits hydrogen, water, and oxygen is used.

Figure 6D:
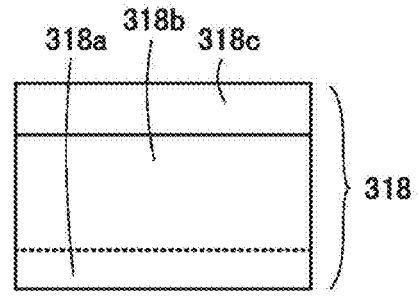

Alternatively, the insulating film 318 may be, for example, a multilayer film including a first silicon oxide layer 318a as a first layer, a second silicon oxide layer 318b as a second layer, and a silicon nitride layer 318c as a third layer (see FIG. 6D). In that case, the first silicon oxide layer 318a and/or the second silicon oxide layer 318b may be a silicon oxynitride layer. In addition, the silicon nitride layer may be a silicon nitride oxide layer. As the first silicon oxide layer 318a, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer 318$b$, a silicon oxide layer containing excess oxygen is used. As the silicon nitride layer 318$c$, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer having excess oxygen means a silicon oxide layer from which oxygen can be released by heat treatment or the like. An insulating film having excess oxygen means an insulating film from which oxygen is released by heat treatment.

The insulating film containing excess oxygen is capable of reducing oxygen vacancies in the oxide semiconductor layer 306$a$. Oxygen vacancies in the oxide semiconductor layer 306$a$ form defect levels, and some of the defect levels become donor levels. Thus, by a reduction in the oxygen vacancies in the oxide semiconductor layer 306$a$, the transistor can have stable electric characteristics.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms).

Here, the method of measuring the amount of released oxygen using TDS analysis is described below.

The total amount of released gas from a measurement sample in TDS is proportional to the integral value of the ion intensity of the released gas. Then, a comparison with a reference sample is made, whereby the total amount of released gas can be calculated.

For example, the number of released oxygen molecules ($N_{O2}$) from a measurement sample can be calculated according to Formula 1 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having a mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[FORMULA 1]}$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Further, $S_{O2}$ is the integral value of ion intensity in the TDS analysis of the measurement sample, and $\alpha$ is a coefficient affecting the ion intensity in the TDS analysis. For details of Formula 1, Japanese Published Patent Application No. H6-275697 is referred to. The amount of released oxygen was measured with a thermal desorption spectroscopy apparatus produced by ESCO Ltd., EMD-WA1000S/W using a silicon wafer containing hydrogen atoms at $1\times10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

Further, the film from which oxygen is released by heat treatment may contain a peroxide radical. Specifically, the spin density attributed to a peroxide radical is greater than or equal to $5\times10^{17}$ spins/cm$^3$. Note that the film containing a peroxide radical may have an asymmetric signal at a g-factor of around 2.01 generated in ESR.

The insulating film containing excess oxygen may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry (RBS).

<2-1-4. Gate Insulating Film>

The gate insulating film 312 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 312 may be, for example, a multilayer film including a silicon nitride layer as a first layer and a silicon oxide layer as a second layer. In that case, the silicon oxide layer may be replaced with a silicon oxynitride layer. In addition, the silicon nitride layer may be replaced with a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide layer, a silicon oxide layer containing excess oxygen is preferably used. As the silicon nitride layer, a silicon nitride layer from which a hydrogen gas and an ammonia gas are less likely to be released is used. The amount of released hydrogen gas or ammonia gas may be measured by TDS.

In the case where at least one of the gate insulating film 312 and the insulating film 318 includes an insulating film containing excess oxygen, oxygen vacancies in the oxide semiconductor layer 306$a$ are reduced, so that stable electric characteristics of a transistor can be achieved.

<2-1-5. Gate Electrode>

The gate electrode 304 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

<2-1-6. Substrate>

There is no particular limitation on the substrate 300. For example, a glass substrate, a ceramic substrate, a quartz substrate, or a sapphire substrate may be used as the substrate 300. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 300. Still alternatively, any of these substrates provided with a semiconductor element may be used as the substrate 300.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 300, minute processing is sometimes difficult due to shrinkage of the substrate 300 caused by heat treatment or the like in a manufacturing process of a semiconductor device. Therefore, in the case where the above-described large glass substrate is used as the substrate 300, a substrate which is unlikely to shrink through the heat treatment is preferably used. For example, as the substrate 300, it is possible to use a large glass substrate in which the amount of shrinkage after heat treatment which is performed for an hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 300. Note that as a method for forming a transistor over a flexible substrate, there is also a method in which, after a transistor is formed over a non-flexible substrate, the transistor is separated from the non-flexible substrate and transferred to the substrate 300 which is a flexible substrate. In that case, a separation layer is preferably provided between the non-flexible substrate and the transistor.

The transistor formed in such a manner has stable electric characteristics because a region in which a channel is formed is protected. The transistor has low off-state current. The transistor is an enhancement transistor. The transistor has high field-effect mobility. It is possible to provide a transistor with a small number of steps. It is possible to provide a transistor with high yield.

<2-2. Method for Manufacturing Transistor Structure (1)>

A method for manufacturing a transistor is described here with reference to FIGS. 8A to 8C and FIGS. 9A and 9B.

First, the substrate 300 is prepared.

Then, a conductive film to be the gate electrode 304 is formed. The conductive film to be the gate electrode 304 may be formed using any of the conductive films given as examples of the gate electrode 304 by a sputtering method, a chemical vapor deposition (CVD) method, a molecular beam epitaxy (MBE) method, an atomic layer deposition (ALD) method, or a pulsed laser deposition (PLD) method. As a CVD method, a plasma CVD method, a thermal CVD method, or the like may be employed. In the case of employing a plasma CVD method, a high quality film can be formed even when the substrate temperature during the film formation is relatively low. On the other hand, in the case of employing a thermal CVD method such as a metal CVD (MCVD) method or a metal organic CVD (MOCVD) method, film formation can be performed with few defects generated in a base film because damage caused by plasma does not occur.

Figure 8A:
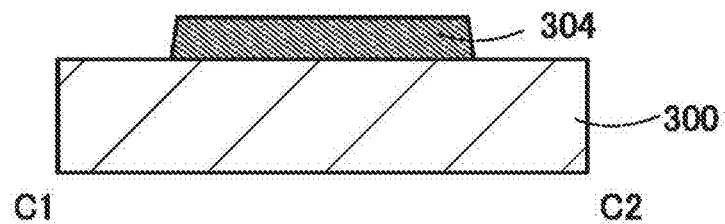
FIGS. 8A to 8C are cross-sectional views illustrating an example of a method for manufacturing a semiconductor device of one embodiment of the present invention.

Next, the conductive film to be the gate electrode 304 is partly etched to form the gate electrode 304 (see FIG. 8A).

Figure 8B:
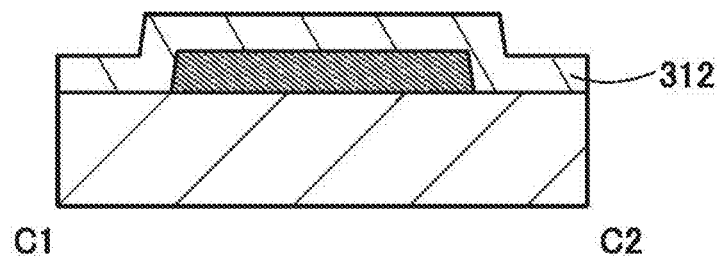

Next, the gate insulating film 312 is formed (see FIG. 8B). The gate insulating film 312 may be formed in such a manner that any of the insulating films given above as examples of the gate insulating film 312 is formed by a sputtering method, a CVD method, an MBE method, an ALD method, or a PLD method.

Next, an oxide semiconductor layer to be an oxide semiconductor layer 306a1 is formed. As the oxide semiconductor layer to be the oxide semiconductor layer 306a1, any of the oxide semiconductor layers mentioned above as the oxide semiconductor layer 106a can be formed by a sputtering method, a CVD method, an MBE method, an ALD method, or a PLD method. Note that the oxide semiconductor layer 306a1 is formed so as to be a CAAC-OS film, a microcrystalline film, or an amorphous film, for example. When the oxide semiconductor layer 306a1 is the CAAC-OS film, the microcrystalline film, or the amorphous film, for example, an oxide semiconductor layer formed over the oxide semiconductor layer 306a1 is likely to be a CAAC-OS film.

Here, a model in which a CAAC-OS film having high crystallinity is formed over an insulating surface, an amorphous film, or an amorphous insulating film is described with reference to FIGS. 15A and 15B and FIGS. 16A and 16B.

Figure 15A:
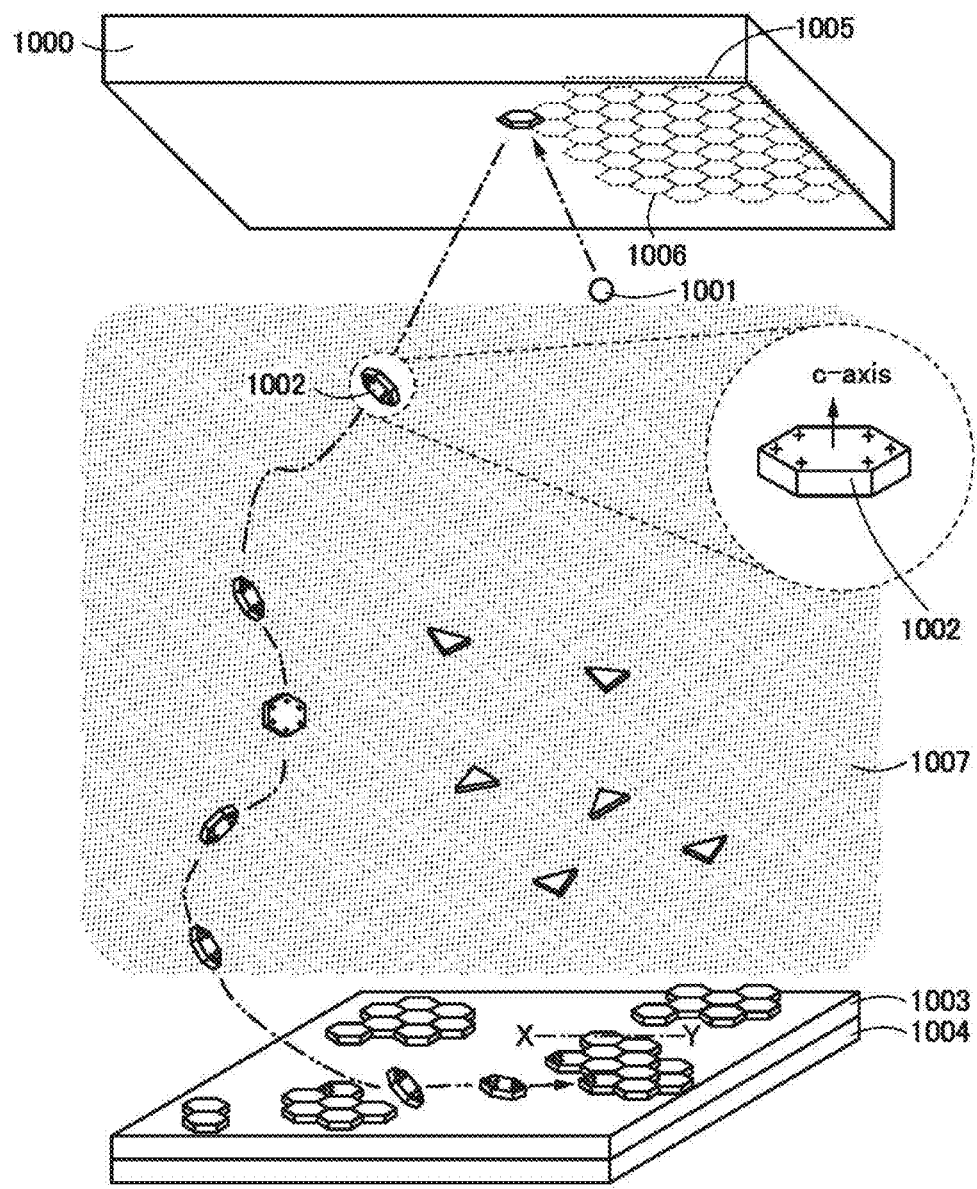
FIGS. 15A and 15B are schematic diagrams illustrating a situation where a sputtered particle separated from a target reaches a deposition surface and is deposited.

FIG. 15A is a schematic diagram illustrating a state in which an ion 1001 collides with a target 1000 containing a polycrystalline oxide semiconductor having high alignment to separate a sputtered particle 1002 with crystallinity from the target 1000. A crystal grain has a cleavage plane 1005 parallel to a surface of the target 1000. The crystal grain has a portion 1006 where an interatomic bond is weak. When the ion 1001 collides with the crystal grain, the cleavage plane 1005 and the portion 1006 where an interatomic bond is weak are cut. Accordingly, the sputtered particle 1002 is cut along the cleavage plane 1005 and the portion 1006 where an interatomic bond is weak and separated in a flat-plate (or a pellet) form. The c-axis direction of the sputtered particle 1002 corresponds to a direction perpendicular to a flat plane of the sputtered particle 1002. Note that the equivalent circle diameter of a flat plane of the sputtered particle 1002 is greater than or equal to $\frac{1}{3000}$ and less than or equal to $\frac{1}{20}$, preferably greater than or equal to $\frac{1}{1000}$ and less than or equal to $\frac{1}{30}$ of an average grain size of the crystal grains. Here, the term "equivalent circle diameter on a plane" refers to the diameter of a perfect circle having the same area as the plane.

Alternatively, when part of the crystal grain is separated as a particle from a cleavage plane and exposed to plasma 1007, cutting of a bond starts at the portion where an interatomic bond is weak, so that a plurality of sputtered particles 1002 are generated.

With the use of an oxygen cation as the ion 1001, plasma damage at the film formation can be alleviated. Specifically, when the ion 1001 collides with the surface of the target 1000, a lowering in crystallinity of the target 1000 can be prevented or a change of the target 1000 into an amorphous state can be prevented.

Figure 16A:
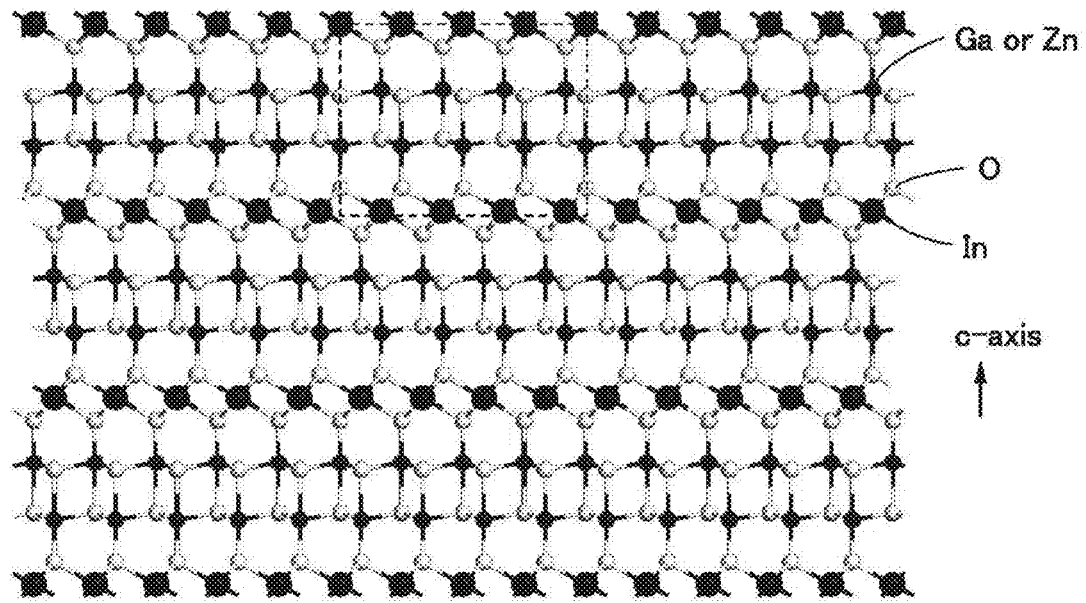
FIGS. 16A and 16B are diagrams illustrating an example of a crystal structure of an In—Ga—Zn oxide.
Figure 16B:
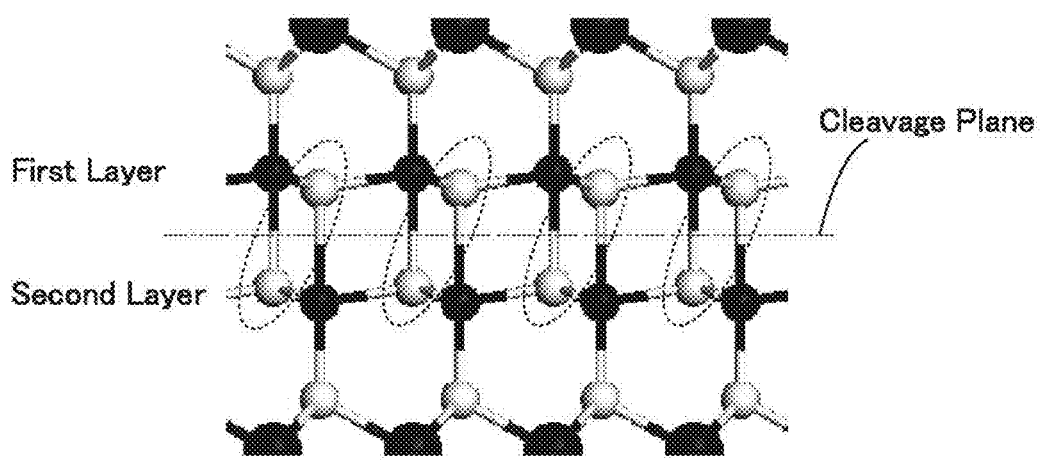

FIG. 16A illustrates a crystal structure of an In—Ga—Zn oxide viewed from a direction parallel to an a-b plane of the crystal as an example of the target 1000 containing a polycrystalline oxide semiconductor with high alignment. FIG. 16B illustrates an enlarged view of a portion surrounded by a dashed line in FIG. 16A.

For example, in a crystal grain of an In—Ga—Zn oxide, a cleavage plane is a plane between a first layer and a second layer as illustrated in FIG. 16B. The first layer includes a gallium atom and/or zinc atom and an oxygen atom, and the second layer includes a gallium atom and/or zinc atom and an oxygen atom. This is because oxygen atoms having negative charge in the first layer and oxygen atoms having negative charge in the second layer are close to each other (see surrounded portions in FIG. 16B). In this manner, the cleavage plane is a plane parallel to an a-b plane. Further, the crystal of the In—Ga—Zn oxide shown in FIGS. 16A and 16B is a hexagonal crystal; thus, the flat-plate-like particle is likely to have a hexagonal prism shape with a regular hexagonal plane whose internal angle is 120° or a triangle prism shape with a regular triangle plane whose internal angle is 60°.

The target 1000 including a polycrystalline oxide semiconductor is a target whose impurity concentration is reduced. Specifically, the concentration of silicon in the target is set to lower than $1 \times 10^{19}$ atoms/cm$^3$, preferably lower than $5 \times 10^{18}$ atoms/cm$^3$, more preferably lower than $1 \times 10^{18}$ atoms/cm$^3$. The concentration of carbon in the target is set to lower than $1 \times 10^{19}$ atoms/cm$^3$, preferably lower than $5 \times 10^{18}$ atoms/cm$^3$, more preferably lower than $1 \times 10^{18}$ atoms/cm$^3$. The concentration of iron in the target is set to lower than $1 \times 10^{16}$ atoms/cm$^3$, preferably lower than $5 \times 10^{15}$ atoms/cm$^3$, more preferably lower than $1 \times 10^{15}$ atoms/cm$^3$. The concentration of nickel in the target is set to lower than $5 \times 10^{16}$ atoms/cm$^3$, preferably lower than $1 \times 10^{16}$ atoms/cm$^3$, more preferably lower than $5 \times 10^{15}$ atoms/cm$^3$, further preferably lower than $1 \times 10^{15}$ atoms/cm$^3$. It is preferable to use a highly-purified raw material in order to reduce the impurity concentration in the target.

It is preferable that the sputtered particles 1002 be charged. Note that it is preferable that corner portions of the sputtered particle 1002 have charges with the same polarity because interaction within the sputtered particle occurs (the corner portions repel with each other) so that the shape of the sputtered particle 1002 maintains. For example, the sputtered particles 1002 may be positively charged. There is no particular limitation on a timing of when the sputtered particle 1002 is positively charged, but it is preferably positively charged by receiving an electric charge when the ion 1001 collides. Alternatively, in the case where the plasma 1007 is generated, the sputtered particle 1002 is preferably exposed to the plasma 1007 to be positively charged. Further alternatively, the ion 1001 which is an oxygen cation is preferably bonded to a side surface, a top surface, or a bottom surface of the sputtered particle 1002, whereby the sputtered particle 1002 is positively charged.

A state where a sputtered particle is deposited on a deposition surface is described with reference to FIGS. 15A and 15B. Note that in FIGS. 15A and 15B, sputtered particles which have been already deposited are shown by dotted lines.

FIG. 15A illustrates an oxide semiconductor layer 1003 which is formed by deposition of the sputtering particles 1002 on an amorphous film 1004. As shown in FIG. 15A, the sputtered particle 1002 is exposed to the plasma 1007 to be positively charged, and accordingly the sputtered particle 1002 is deposited on a region where other sputtered particles 1002 have not been deposited yet. This is because the sputtered particles 1002 that are positively charged repel each other. In the case with substrate heating, one sputtered particle 1002 moves to a region of the deposition surface, where other sputtered particles 1002 have not been deposited yet, and migration of the sputtered particle 1002 occurs, whereby the sputtered particle 1002 is bonded to the side of the sputtered particles which are already deposited. In this manner, the sputtered particles 1002 are spread with flat plate planes facing upward.

In contrast, in the case without substrate heating, the sputtered particles 1002 fall irregularly to a deposition surface. Thus, the sputtered particles 1002 are deposited randomly also in a region where other sputtered particles 1002 are already deposited. That is, an oxide film which is obtained by the deposition has neither a uniform thickness nor a uniform crystal alignment. The oxide film which is obtained in such a manner is a microcrystalline oxide film because the crystallinity of the flat plate-like sputtered particles 1002 is maintained to some extent.

Figure 15B:
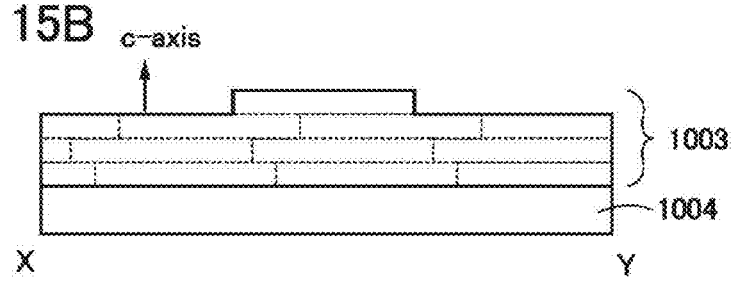

FIG. 15B is a cross-sectional view taken along dashed-dotted line X-Y in FIG. 15A. The oxide semiconductor layer 1003 is formed in such a manner that the flat-plate-like sputtered particles 1002 whose c-axis direction is perpendicular to their flat planes are deposited orderly. Accordingly, the oxide semiconductor layer 1003 is a CAAC-OS whose c-axes are aligned in a direction perpendicular to a surface on which the layer is formed. According to the above model, a CAAC-OS film having high crystallinity can be formed even on an insulating surface, an amorphous film, or an amorphous insulating film.

Next, an oxide semiconductor layer to be an oxide semiconductor layer 306b1 is formed. As the oxide semiconductor layer to be the oxide semiconductor layer 306b1, any of the oxide semiconductor layers mentioned above as the oxide semiconductor layer 106b can be formed by a sputtering method, a CVD method, an MBE method, an ALD method, or a PLD method. The oxide semiconductor layer to be the oxide semiconductor layer 306b1 may be formed by applying the above model in which an oxide semiconductor layer having high crystallinity is formed.

Note that when the oxide semiconductor layer to be the oxide semiconductor layer 306a1 and the oxide semiconductor layer to be the oxide semiconductor layer 306b1 are formed successively without being exposed to the air, impurities are less likely to be taken into interfaces between the layers; thus, the density of defect states of the oxide semiconductor layer to be the oxide semiconductor layer 306a1 and/or the oxide semiconductor layer to be the oxide semiconductor layer 306b1 can be reduced in some cases.

Figure 8C:
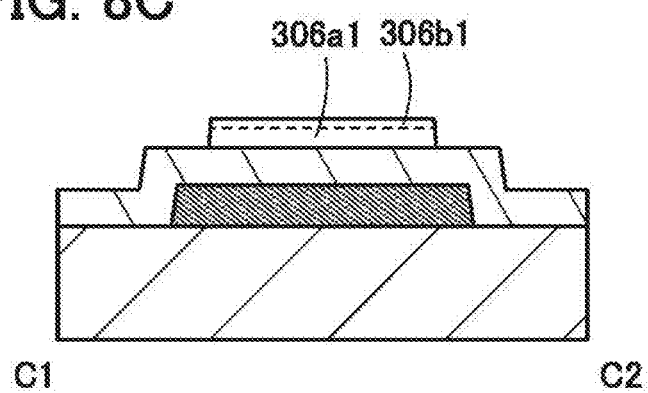

Next, the oxide semiconductor layer to be the oxide semiconductor layer 306a1 and the oxide semiconductor layer to be the oxide semiconductor layer 306b1 are partly etched to form a multilayer film including the oxide semiconductor layer 306a1 and the oxide semiconductor layer 306b1 (see FIG. 8C).

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment can improve the crystallinity of the oxide semiconductor layer 306a1 and remove impurities such as hydrogen and water from the gate insulating film 312 and/or the oxide semiconductor layer 306a1. By the first heat treatment, the density of defect states of the oxide semiconductor layer 306a1 can be reduced. Accordingly, treatment like the first heat treatment can be referred to as treatment for reducing the density of defect states of an oxide semiconductor layer in some cases.

Then, a conductive film to be the source electrode 316a and the drain electrode 316b is formed. The conductive film to be the source electrode 316a and the drain electrode 316b may be formed in such a manner that any of the conductive films given above as examples of the source electrode 316a and the drain electrode 316b is formed by a sputtering method, a CVD method, an MBE method, an ALD method, or a PLD method.

For example, a multilayer film including a tungsten layer and a copper layer over the tungsten layer may be formed as the conductive film to be the source electrode 316a and the drain electrode 316b. Alternatively, a multilayer film including a titanium layer, a titanium nitride layer over the titanium layer, and a copper layer over the titanium nitride layer may be formed as the conductive film to be the source electrode 316a and the drain electrode 316b, for example.

Next, the conductive film to be the source electrode 316a and the drain electrode 316b is partly etched to form the source electrode 316a and the drain electrode 316b. At the time of or after the etching, a region of the oxide semiconductor layer 306a1 and the oxide semiconductor layer 306b1 which overlaps with neither the source electrode 316a nor the drain electrode 316b can be etched by the methods given above as examples of Model A and Model B. The region of the oxide semiconductor layer 306a1 and the oxide semiconductor layer 306b1 which overlaps with neither the source electrode 316a nor the drain electrode 316b is etched to form the oxide semiconductor layer 306a and the oxide semiconductor layer 306b (see FIG. 9A).

In the case where a multilayer film including a tungsten layer and a copper layer over the tungsten layer is used as the conductive film to be the source electrode 316a and the drain electrode 316b, the multilayer film can be etched with the use of a photomask. Even when the tungsten layer and the copper layer are etched at once, the concentration of copper in the oxide semiconductor layer 306a can be lower than $1\times10^{19}$ atoms/cm$^3$, lower than $2\times10^{18}$ atoms/cm$^3$, or lower than $2\times10^{17}$ atoms/cm$^3$ because the oxide semiconductor layer 306a includes a protective region. In other words, an increase in the density of defect states of the oxide semiconductor layer 306a due to copper can be suppressed, so that deterioration of electric characteristics of the transistor can be reduced. Thus, the degree of freedom of the process is increased, so that transistors can be manufactured with improved productivity.

Next, second heat treatment is preferably performed. The description of the first heat treatment can be referred to for the second heat treatment. The second heat treatment can remove impurities such as hydrogen and water from the oxide semiconductor layer 306a. Hydrogen easily moves especially in the oxide semiconductor layer 306a; thus, reducing hydrogen by the second heat treatment enables a reduction in the density of defect states of the oxide semiconductor layer 306a. Accordingly, the transistor can have stable electric characteristics.

Figure 9A:
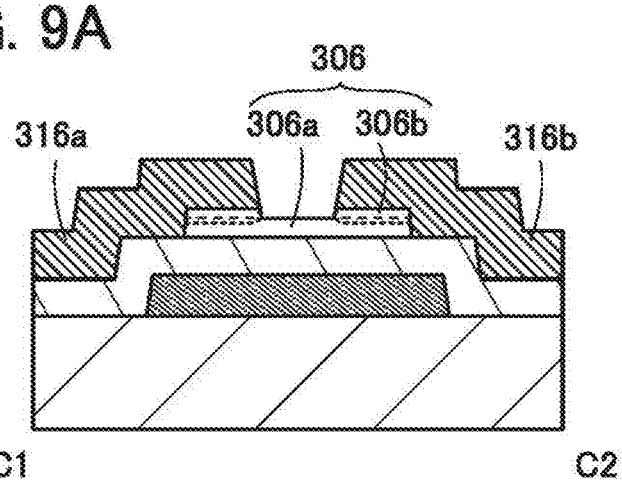
FIGS. 9A and 9B are cross-sectional views illustrating the example of the method for manufacturing the semiconductor device of one embodiment of the present invention.
Figure 9B:
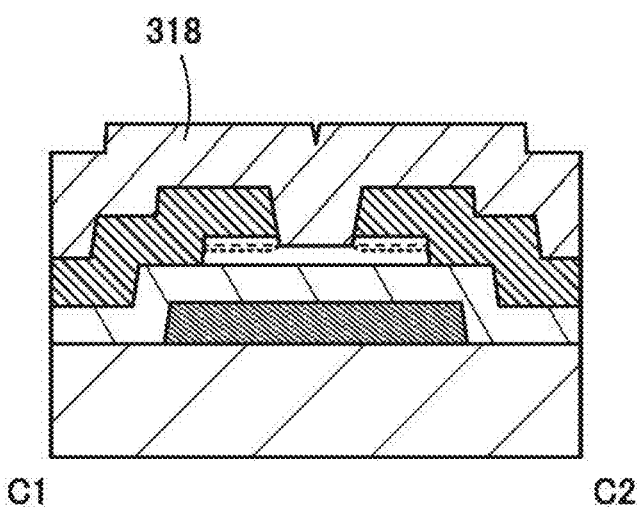

Next, the insulating film 318 is formed (see FIG. 9B). The insulating film 318 may be formed in such a manner that any of the insulating films given above as examples of the insulating film 318 is formed by a sputtering method, a CVD method, an MBE method, an ALD method, or a PLD method.

Here, the case where the insulating film 318 has a three-layer structure as illustrated in FIG. 6D is described. First, the first silicon oxide layer 318a is formed, and then the second silicon oxide layer 318b is formed. Next, treatment for adding oxygen ions to the first silicon oxide layer 318a and/or the second silicon oxide layer 318b may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, the silicon nitride layer 318c is formed. The insulating film 318 may be formed in the above manner.

The first silicon oxide layer 318a is preferably formed by a plasma CVD method which is one type of CVD method. Specifically, the first silicon oxide layer 318a may be formed by supplying high-frequency power to an electrode under the following conditions: the substrate temperature is higher than or equal to 180° C. and lower than or equal to 400° C., preferably higher than or equal to 200° C. and lower than or equal to 370° C., a deposition gas containing silicon and an oxidizing gas are used, and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide layer 318a can be reduced and dangling bonds can be reduced.

In the above manner, the first silicon oxide layer 318a with low defect density is formed. That is, the spin density of the first silicon oxide layer 318a, which is attributed to a signal with a g factor of 2.001 in ESR, can be lower than or equal to $3\times10^{17}$ spins/cm$^3$ or lower than or equal to $5\times10^{16}$ spins/cm$^3$.

The second silicon oxide layer 318b is preferably formed by a plasma CVD method. Specifically, the second silicon oxide layer 318b may be formed by supplying high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$, to an electrode under the following conditions: the substrate temperature is higher than or equal to 160° C. and lower than or equal to 350° C., preferably higher than or equal to 180° C. and lower than or equal to 260° C., a deposition gas containing silicon and an oxidizing gas are used, and the pressure is higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide layer 318b containing excess oxygen can be formed.

The silicon nitride layer 318c is preferably formed by a plasma CVD method. Specifically, the silicon nitride layer 318c may be formed by supplying high-frequency power under the following conditions: the substrate temperature is higher than or equal to 180° C. and lower than or equal to 400° C., preferably higher than or equal to 200° C. and lower than or equal to 370° C., a deposition gas containing silicon, a nitrogen gas, and an ammonia gas are used, and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of ammonia gas can promote decomposition of the deposition gas containing silicon and the nitrogen gas. This is because the ammonia gas is dissociated by plasma energy or heat energy, and energy generated by the dissociation contributes to decomposition of a bond of the deposition gas containing silicon and a bond of the nitrogen gas.

Through the above method, the silicon nitride layer 318c from which the hydrogen gas and the ammonia gas are less likely to be released can be formed. The silicon nitride layer 318c has low hydrogen content, and thus is dense and does not transmit or hardly transmit hydrogen, water, and oxygen.

Next, third heat treatment is preferably performed. The description of the first heat treatment can be referred to for the third heat treatment. By the third heat treatment, excess oxygen is released from the gate insulating film 312 and/or the insulating film 318; thus, the density of defect states due to oxygen vacancies or the like in the oxide semiconductor layer 306a is reduced in some cases. Note that in the oxide semiconductor layer 306a, an oxygen vacancy captures an adjacent oxygen atom, so that the oxygen vacancy seems to move.

In the above manner, the BGTC transistor can be manufactured.

The transistor has stable electric characteristics because a region in which a channel is formed is protected. The transistor has low off-state current. The transistor is an enhancement transistor. The transistor has high field-effect mobility. It is possible to provide a transistor with a small number of steps. It is possible to provide a transistor with high yield.

<2-2-1. Manufacturing Apparatus>

When the concentration of impurities in the oxide semiconductor layer is low, the electric characteristics of the transistor are stable. Moreover, the oxide semiconductor layer with high crystallinity has electric characteristics more stable than those of the oxide semiconductor layer with an amorphous structure. A film formation apparatus for forming the oxide semiconductor layer with low impurity concentration and high crystallinity is described below.

First, a structure of a film formation apparatus which allows the entry of few impurities during film formation is described with reference to FIGS. 17A and 17B.

Figure 17A:
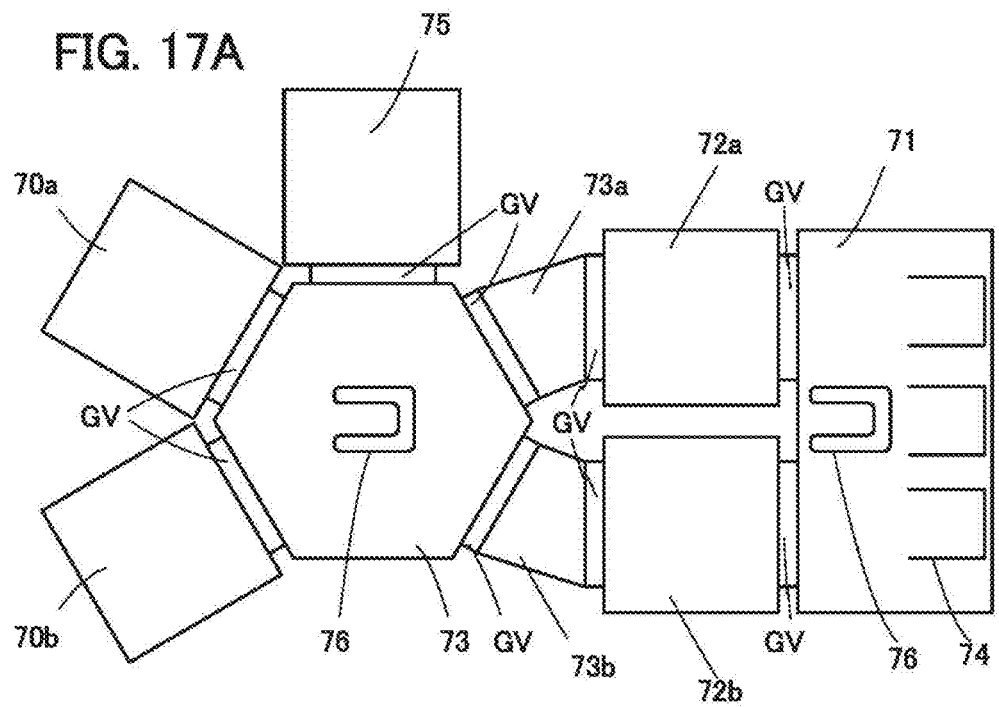
FIGS. 17A and 17B are top views each illustrating an example of a film formation apparatus.

FIG. 17A is a top view of a multi-chamber film formation apparatus. The film formation apparatus includes an atmosphere-side substrate supply chamber 71 provided with three cassette ports 74 for holding substrates, a load lock chamber 72a, an unload lock chamber 72b, a transfer chamber 73, a transfer chamber 73a, a transfer chamber 73b, a substrate heating chamber 75, a film formation chamber 70a, and a film formation chamber 70b. The atmosphere-side substrate supply chamber 71 is connected to the load lock chamber 72a and the unload lock chamber 72b. The load lock chamber 72a and the unload lock chamber 72b are connected to the transfer chamber 73 through the transfer chambers 73a and 73b. The substrate heating chamber 75 and the film formation chambers 70a and 70b are connected to only the transfer chamber 73. Gate valves (GV) are provided for connecting portions between the chambers so that each chamber except the atmosphere-side substrate supply chamber 71 can be independently kept under vacuum. Moreover, the atmosphere-side substrate transfer chamber 71 and the transfer chamber 73 each include one or more substrate transfer robots 76, with which a substrate can be transferred. Here, it is preferable that the substrate heating chamber 75 also serve as a plasma treatment chamber. With a single wafer multi-chamber film formation apparatus, it is possible to transfer a substrate without exposure to the air between treatments, resulting in a reduction in adsorption of impurities to a substrate. In addition, the order of film formation, heat treatment, or the like can be freely determined. Note that the numbers of transfer chambers, film formation chambers, load lock chambers, unload lock chambers, and substrate heating chambers are not limited to the above, and can be determined as appropriate depending on the space for placement or the process.

Figure 17B:
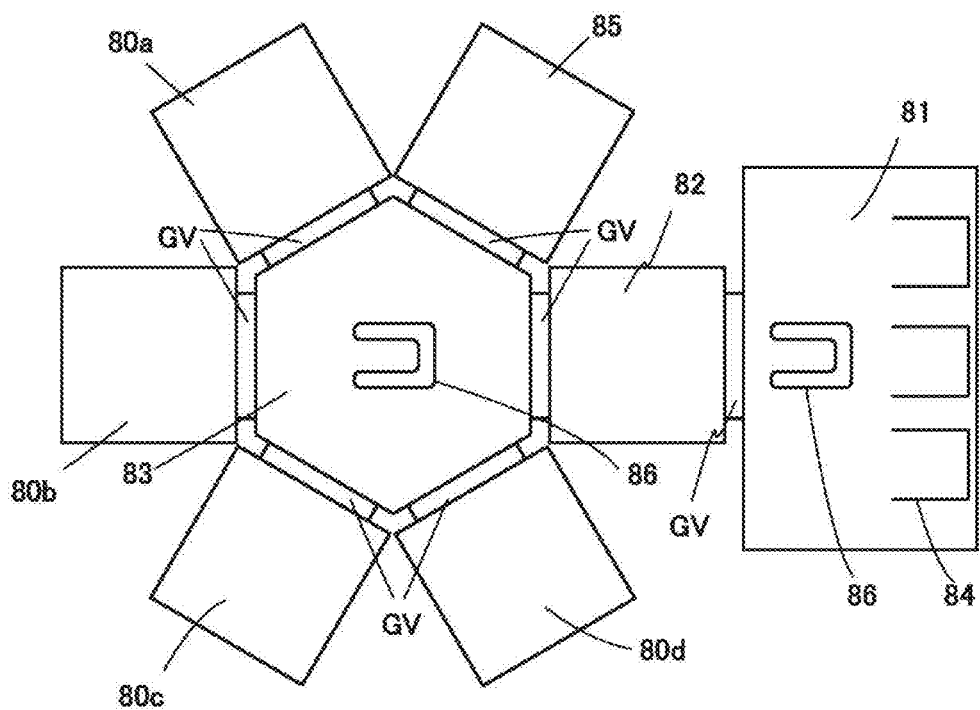

FIG. 17B is a top view of a multi-chamber film formation apparatus having a different structure from that illustrated in FIG. 17A. The film formation apparatus includes an atmosphere-side substrate supply chamber 81 provided with cassette ports 84, a load/unload lock chamber 82, a transfer chamber 83, a substrate heating chamber 85, and film formation chambers 80a, 80b, 80c, and 80d. The atmosphere-side substrate supply chamber 81, the substrate heating chamber 85, and the film formation chambers 80a, 80b, 80c, and 80d are connected to one another through the transfer chamber 83.

Gate valves (GV) are provided for connecting portions between the chambers so that each chamber except the atmosphere-side substrate supply chamber 81 can be independently kept under vacuum. Moreover, the atmosphere-side substrate transfer chamber 81 and the transfer chamber 83 each include one or more substrate transfer robots 86, with which a glass substrate can be transferred.

Here, the details of the film formation chamber (sputtering chamber) illustrated in FIG. 17B are described with reference to FIG. 18A. The film formation chamber 80b includes a target 87, an attachment protection plate 88, and a substrate stage 90. Note that here, a glass substrate 89 is placed on the substrate stage 90. Although not illustrated, the substrate stage 90 may include a substrate holding mechanism which holds the glass substrate 89, a rear heater which heats the glass substrate 89 from the back surface, or the like. The attachment protection plate 88 can suppress deposition of a particle which is sputtered from the target 87 on a region where deposition is not needed.

Figure 18A:
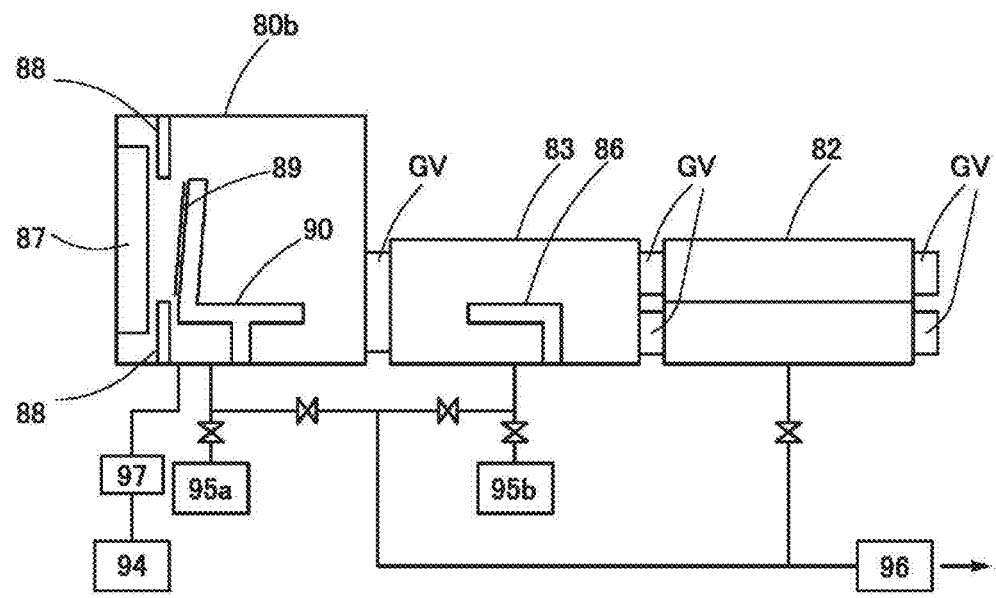
FIGS. 18A and 18B are cross-sectional views each illustrating an example of a film formation chamber.

The film formation chamber 80b illustrated in FIG. 18A is connected to the transfer chamber 83 through a gate valve, and the transfer chamber 83 is connected to the load/unload lock chamber 82 through a gate valve. The transfer chamber 83 provided with a substrate transfer robot 86 can deliver a glass substrate between the film formation chamber 80b and the load/unload lock chamber 82. The load/unload lock chamber 82 is divided into an upper part and a lower part in one vacuum chamber. One of the parts can be used as a load lock chamber and the other can be used as an unload lock chamber. This structure is preferably employed, in which case the installation area of a sputtering apparatus can be reduced.

The film formation chamber 80b illustrated in FIG. 18A is connected to a refiner 94 through a mass flow controller 97. Note that although the refiner 94 and the mass flow controller 97 are provided in accordance with the number of kinds of gases, only one refiner 94 and one mass flow controller 97 are illustrated for simplicity. As a gas introduced to the film formation chamber 80b or the like, a gas whose dew point is lower than or equal to −80° C., preferably lower than or equal to −100° C., more preferably lower than or equal to −120° C. is used. With the use of an oxygen gas, a rare gas (e.g., an argon gas), or the like whose dew point is low, moisture entering a film at the time of film formation can be reduced.

Moreover, the film formation chamber 80b illustrated in FIG. 18A is connected to a cryopump 95a through a valve. The transfer chamber 83 is connected to a cryopump 95b through a gate valve. The load/unload lock chamber 82 is connected to a vacuum pump 96 through a gate valve. The load lock chamber and the unload lock chamber of the load/unload lock chamber 82 may be individually connected to the vacuum pump 96. The film formation chamber 80b and the transfer chamber 83 are each connected to the vacuum pump 96 through the gate valve.

Note that the vacuum pump 96 may be, for example, a pump in which a dry pump and a mechanical booster pump are connected in series. With such a structure, the film formation chamber 80b and the transfer chamber 83 are evacuated from atmospheric pressure to a low vacuum (about 0.1 Pa to 10 Pa) by the vacuum pump 96, and then evacuated from the low vacuum to a high vacuum ($1\times10^{-4}$ Pa to $1\times10^{-7}$ Pa) by the cryopump 95a or 95b after the valves are switched.

Next, another example of the film formation chamber illustrated in FIG. 17B is described with reference to FIG. 18B.

Figure 18B:
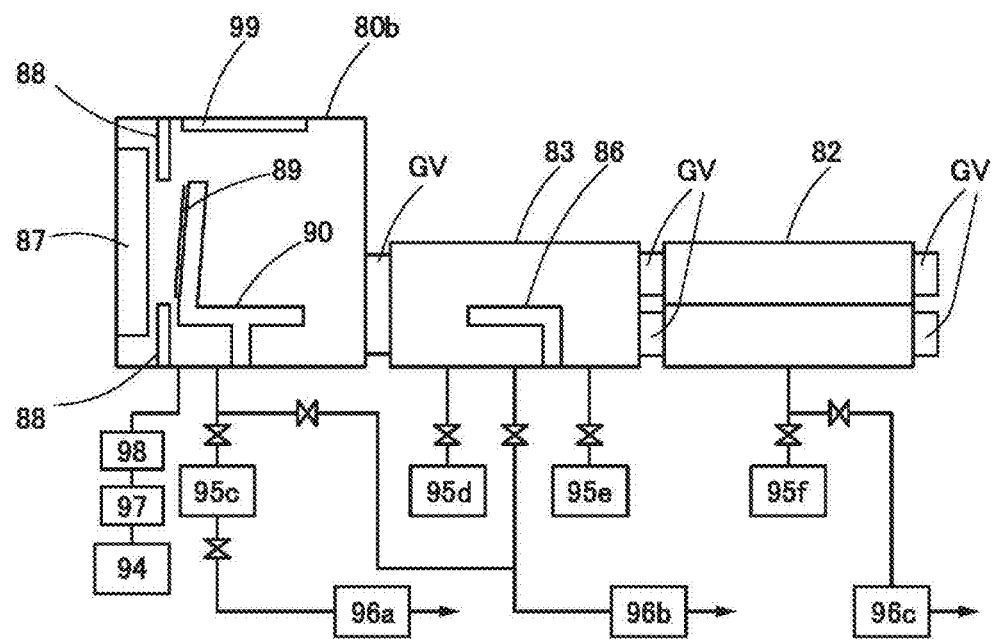

The film formation chamber 80b illustrated in FIG. 18B is connected to the transfer chamber 83 through the gate valve, and the transfer chamber 83 is connected to the load/unload lock chamber 82 through the gate valves.

The film formation chamber 80b in FIG. 18B is connected to the mass flow controller 97 through a gas heating system 98, and the gas heating system 98 is connected to the refiner 94 through the mass flow controller 97. With the gas heating system 98, a gas used in the film formation chamber 80b can be heated to higher than or equal to 40° C. and lower than or equal to 400° C., preferably higher than or equal to 50° C. and lower than or equal to 200° C. Note that although the gas heating systems 98, the refiner 94, and the mass flow controller 97 can be provided in accordance with the number of kinds of gases, only one gas heating system 98, one refiner 94, and one mass flow controller 97 are provided for simplicity.

The film formation chamber 80b illustrated in FIG. 18B is connected to a turbo molecular pump 95c and a vacuum pump 96b through valves. Note that as an auxiliary pump, a vacuum pump 96a is provided for the turbo molecular pump 95c through a valve. The vacuum pumps 96a and 96b may have structures similar to that of the vacuum pump 96.

In addition, the film formation chamber 80b illustrated in FIG. 18B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the film formation chamber 80b. The temperature of a refrigerator of the cryotrap 99 is set to lower than or equal to 100 K, preferably lower than or equal to 80 K. When the cryotrap 99 includes a plurality of refrigerators, the refrigerators preferably have different temperatures, in which case efficient evacuation can be performed. For example, the temperatures of a first-stage refrigerator and a second-stage refrigerator may be set to lower than or equal to 100 K and lower than or equal to 20 K, respectively.

The transfer chamber 83 illustrated in FIG. 18B is connected to the vacuum pump 96b and cryopumps 95d and 95e through valves. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules (atoms) entrapped in the cryopump. When molecules (atoms) are entrapped too much in a cryopump, the evacuation capability of the cryopump is lowered; therefore, regeneration is performed regularly.

The load/unload lock chamber 82 illustrated in FIG. 18B is connected to a cryopump 95f and a vacuum pump 96c through valves. Note that the vacuum pump 96c may have a structure similar to that of the vacuum pump 96.

In the film formation chamber 80b, a target-facing-type sputtering apparatus may be employed.

Note that a parallel-plate-type sputtering device or an ion beam sputtering apparatus may be provided in the film formation chamber 80b.

Next, an evacuation example of the substrate heating chamber illustrated in FIG. 17B is described with reference to FIG. 19.

Figure 19:
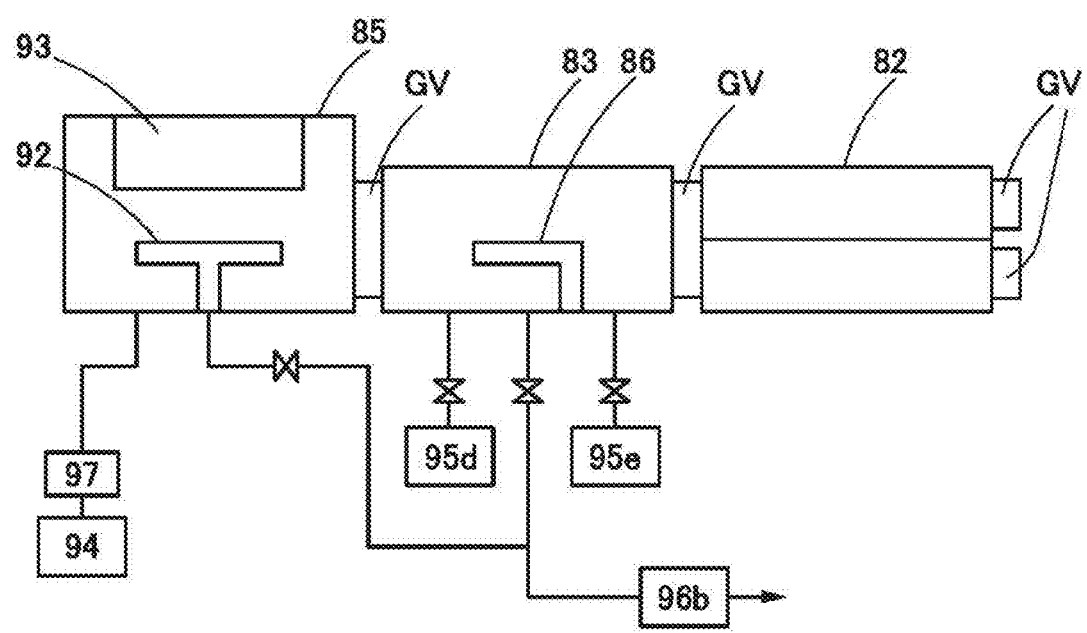
FIG. 19 is a diagram illustrating an example of a heat treatment chamber.

The substrate heating chamber 85 illustrated in FIG. 19 is connected to the transfer chamber 83 through a gate valve. The transfer chamber 83 is connected to the load/unload lock chamber 82 through a gate valve. Note that the load/unload lock chamber 82 has a structure similar to that illustrated in FIG. 18A or 18B.

The substrate heating chamber 85 illustrated in FIG. 19 is connected to the refiner 94 through the mass flow controller 97. Note that although the refiner 94 and the mass flow controller 97 are provided in accordance with the number of kinds of gases, only one refiner 94 and one mass flow controller 97 are illustrated for simplicity. In addition, the substrate heating chamber 85 is connected to the vacuum pump 96b through a valve.

Moreover, the substrate heating chamber 85 includes a substrate stage 92. It is only necessary that the substrate stage 92 is capable of placement of at least one substrate. The substrate stage 92 may be one capable of placement of a plurality of substrates. The substrate heating chamber 85 also includes a heating mechanism 93. The heating mechanism 93 may be, for example, a heating mechanism using a resistance heater or the like for heating. Alternatively, a heating mechanism in which heating is performed by heat conduction or heat radiation from a medium such as a heated gas may be employed. For example, a rapid thermal annealing (RTA) apparatus such as a gas rapid thermal annealing (GRTA) apparatus or a lamp rapid thermal annealing (LRTA) apparatus can be employed. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as the gas. The RTA apparatus enables heat treatment in a short time; thus, bending of the substrate caused by the heat treatment can be reduced. In particular, in a large glass substrate, bending may cause a reduction in yield of a semiconductor device even at a small amount. Accordingly, the RTA apparatus is preferably used for heat treatment at a high temperature such that a substrate is bent.

Note that the back pressure of each of the film formation chamber 80b and the substrate heating chamber 85 is lower than or equal to $1\times10^{-4}$ Pa, preferably lower than or equal to $3\times10^{-5}$ Pa, more preferably lower than or equal to $1\times10^{-5}$ Pa.

In each of the film formation chamber 80b and the substrate heating chamber 85, the partial pressure of a gas molecule (atom) having a mass-to-charge ratio (m/z) of 18 is lower than or equal to $3\times10^{-5}$ Pa, preferably lower than or equal to $1\times10^{-5}$ Pa, more preferably lower than or equal to $3\times10^{-6}$ Pa.

Moreover, in each of the film formation chamber 80b and the substrate heating chamber 85, the partial pressure of a gas molecule (atom) having a mass-to-charge ratio (m/z) of 28 is lower than or equal to $3\times10^{-5}$ Pa, preferably lower than or equal to $1\times10^{-5}$ Pa, more preferably lower than or equal to $3\times10^{-6}$ Pa.

Moreover in each of the film formation chamber 80b and the substrate heating chamber 85, the partial pressure of a gas molecule (atom) having a mass-to-charge ratio (m/z) of 44 is lower than or equal to $3\times10^{-5}$ Pa, preferably lower than or equal to $1\times10^{-5}$ Pa, more preferably lower than or equal to $3\times10^{-6}$ Pa.

Further, in each of the film formation chamber 80b and the substrate heating chamber 85, the leakage rate is less than or equal to $3\times10^{-6}$ Pa·m$^3$/s, preferably less than or equal to $1\times10^{-6}$ Pa·m$^3$/s.

In each of the film formation chamber 80b and the substrate heating chamber 85, the leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s.

In each of the film formation chamber 80b and the substrate heating chamber 85, the leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s.

Moreover, in each of the film formation chamber 80b and the substrate heating chamber 85, the leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that the total pressure and the partial pressure in the vacuum chambers such as the film formation chamber, the substrate heating chamber, and the transfer chamber can be measured using a mass analyzer. For example, Qulee CGM-051, a quadrupole mass analyzer (also referred to as Q-mass) manufactured by ULVAC, Inc. can be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be less than or equal to the above value.

For example, an open/close portion of the film formation chamber is preferably sealed with a metal gasket. For the metal gasket, metal covered with iron fluoride, aluminum oxide, or chromium oxide is preferably used. The metal gasket realizes higher adhesion than an O-ring, and can reduce the external leakage. Further, with use of the metal covered with an iron fluoride, an aluminum oxide, a chromium oxide, or the like which is in the passive state, the release of gas containing impurities released from the metal gasket is suppressed, so that the internal leakage can be reduced.

For a member of the deposition apparatus, aluminum, chromium, titanium, zirconium, nickel, or vanadium, which releases a smaller amount of gas containing impurities, is used. Alternatively, an alloy containing iron, chromium, nickel, and the like covered with the above member may be used. The alloy containing iron, chromium, nickel, and the like is rigid, resistant to heat, and suitable for processing. Here, when surface unevenness of the member is decreased by polishing or the like to reduce the surface area, the released gas can be reduced.

Alternatively, the above member of the film formation apparatus may be covered with iron fluoride, aluminum oxide, chromium oxide, or the like.

The member of the film formation apparatus is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

In the case where the refiner is provided just before a deposition gas is introduced, the length of a pipe between the refiner and the film formation chamber is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly.

Furthermore, as the pipe for the film formation gas, a metal pipe the inside of which is covered with iron fluoride, aluminum oxide, chromium oxide, or the like is preferably used. With the above pipe, the amount of released gas containing impurities is made small and the entry of impurities into the deposition gas can be reduced as compared with a SUS316L-EP pipe, for example. Further, a high-performance ultra-compact metal gasket joint (a UPG joint) is preferably used as a joint of the pipe. A structure where all the materials of the pipe are metal is preferably employed, in which case the effect of the generated released gas or the external leakage can be reduced compared with a structure where resin or the like is used.

When an adsorbate is present in the film formation chamber, the adsorbate does not affect the pressure in the film formation chamber because it is adsorbed onto an inner wall or the like; however, the adsorbate causes gas to be released when the inside of the film formation chamber is evacuated. Therefore, although there is no correlation between the leakage rate and the evacuation rate, it is important that the adsorbate present in the film formation chamber be desorbed as much as possible and evacuation be performed in advance with the use of a pump with high evacuation capability. Note that the film formation chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced to the film formation chamber, the rate of desorption of water or the like, which is difficult to be desorbed simply by evacuation, can be further increased. Note that the rate of desorption of the adsorbate can be further increased by heating of the inert gas at substantially the same temperature as the temperature of the baking. Here, a rare gas is preferably used as the inert gas. Depending on the kind of a film to be formed, oxygen or the like may be used instead of an inert gas. For example, in the case of forming an oxide semiconductor layer, using oxygen, which is the main component of the oxide, is preferable in some cases.

Alternatively, treatment for evacuating the inside of the film formation chamber is preferably performed a certain period of time after heated oxygen, a heated inert gas such as a heated rare gas, or the like is introduced to increase a pressure in the film formation chamber. The introduction of the heated gas can desorb the adsorbate in the film formation chamber, and the impurities present in the film formation chamber can be reduced. Note that an advantageous effect can be achieved when this treatment is repeated greater than or equal to twice and less than or equal to 30 times, preferably greater than or equal to 5 times and less than or equal to 15 times. Specifically, an inert gas, oxygen, or the like with a temperature higher than or equal to 40° C. and lower than or equal to 400° C., or higher than or equal to 50° C. and lower than or equal to 200° C. is introduced to the film formation chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the film formation chamber is evacuated for longer than or equal to 5 minutes and shorter than or equal to 300 minutes, preferably longer than or equal to 10 minutes and shorter than or equal to 120 minutes.

The rate of desorption of the adsorbate can be further increased also by dummy film formation. Here, the dummy film formation refers to film formation on a dummy substrate by sputtering or the like, in which a film is formed on the dummy substrate and the inner wall of the film formation chamber so that impurities in the film formation chamber and an adsorbate on the inner wall of the film formation chamber are confined in the film. As the dummy substrate, a substrate which releases a smaller amount of gas is preferably used, and for example, a substrate similar to the substrate 100 described later may be used. By performing dummy film formation, the concentration of impurities in a film to be formed later can be reduced. Note that the dummy film formation may be performed at the same time as the baking of the film formation chamber.

An oxide semiconductor layer is formed with the use of the above film formation apparatus, so that the entry of impurities into the oxide semiconductor layer can be suppressed. Further, a film in contact with the oxide semiconductor layer is formed with the use of the above film formation apparatus, so that the entry of impurities into the oxide semiconductor layer from the film in contact therewith can be suppressed.

Next, a method for forming a first oxide semiconductor layer and a second oxide semiconductor layer with the use of the above film formation apparatus is described.

The first oxide semiconductor layer is formed. The first oxide semiconductor layer is formed in an oxygen gas atmosphere with a substrate heating temperature higher than or equal to room temperature (25° C.) and lower than or equal to 600° C., preferably higher than or equal to 70° C. and lower than or equal to 550° C., more preferably higher than or equal to 100° C. and lower than or equal to 500° C. As the heating temperature during the formation is higher, the concentration of impurities in the first oxide semiconductor layer is lower. Further, migration of sputtered particles on a deposition surface is likely to occur; thus, the atomic arrangement is ordered and the density is increased, so that the crystallinity of the first oxide semiconductor layer becomes high. Furthermore, when the film formation is performed in an oxygen gas atmosphere, plasma damage is alleviated and a surplus atom such as a rare gas atom is not contained in the first oxide semiconductor layer, whereby the first oxide semiconductor layer with high crystallinity is formed. Note that the film formation may be performed in a mixed atmosphere containing an oxygen gas and a rare gas. In that case, the percentage of an oxygen gas is set to greater than or equal to 30 vol. %, preferably greater than or equal to 50 vol. %, further preferably greater than or equal to 80 vol. %. The substrate is transferred to the film formation chamber, the deposition gas is introduced to the film formation chamber, the film formation pressure is set to lower than or equal to 0.8 Pa, preferably lower than or equal to 0.4 Pa, the substrate is held under the pressure for longer than or equal to 10 seconds and shorter than or equal to 1000 seconds, preferably longer than or equal to 15 seconds and shorter than or equal to 720 seconds in order to stabilize the pressure, and then the formation of the first oxide semiconductor layer is performed. The pressure is held for the above period of time in order to stabilize the pressure, whereby the amount of impurity entering the first oxide semiconductor layer during the formation can be reduced. Note that since the first oxide semiconductor layer may be amorphous, the first oxide semiconductor layer can be intentionally formed at a low temperature less than 70° C. with a percentage of an oxygen gas less than 30 vol %.

Then, the second oxide semiconductor layer is formed. The surface temperature of the target is set to lower than or equal to 100° C., preferably lower than or equal to 50° C., more preferably about room temperature (typically, 20° C. or 25° C.). In a sputtering apparatus for a large substrate, a large target is often used. However, it is difficult to form a target for a large substrate without a juncture. In fact, a plurality of targets are arranged with as few spaces as possible to obtain a large shape; however, a tiny space is inevitably generated. When the surface temperature of the target increases, in some cases, Zn or the like is volatilized from such a tiny space, and the space might expand gradually. When the space expands, a metal of a backing plate or a metal used for adhesion might be sputtered and cause an increase in impurity concentration. Thus, it is preferable that the target be cooled sufficiently.

Specifically, for the backing plate, a metal having high conductivity and a high heat dissipation property (specifically Cu) is used. The target can be cooled efficiently by making a sufficient amount of cooling water flow through a water channel which is formed in the backing plate. Here, the sufficient amount of cooling water, which depends on the size of the target, is set to greater than or equal to 3 L/min, greater than or equal to 5 L/min, or greater than or equal to 10 L/min in the case of, for example, a circular target whose diameter is 300 mm.

The second oxide semiconductor layer is formed in an oxygen gas atmosphere at a substrate heating temperature higher than or equal to 100° C. and lower than or equal to 600° C., preferably higher than or equal to 150° C. and lower than or equal to 550° C., more preferably higher than or equal to 200° C. and lower than or equal to 500° C. The concentration of impurities in the second oxide semiconductor layer decreases as the substrate heating temperature in film formation increases. Further, migration of sputtered particles on a deposition surface is likely to occur; thus, the atomic arrangement is ordered and the density is increased, so that the second oxide semiconductor layer with high crystallinity is formed. Furthermore, when the film formation is performed in the oxygen gas atmosphere, plasma damage is alleviated and a surplus atom such as a rare gas atom is not contained in the second oxide semiconductor layer, whereby the second oxide semiconductor layer with high crystallinity is formed. Note that the film formation may be performed in a mixed atmosphere containing an oxygen gas and a rare gas. In that case, the percentage of an oxygen gas is set to greater than or equal to 30 vol. %, preferably greater than or equal to 50 vol. %, more preferably greater than or equal to 80 vol. %.

Note that in the case where the target includes Zn, plasma damage is alleviated by the film formation in an oxygen gas atmosphere; thus, the second oxide semiconductor layer in which Zn is unlikely to be volatilized can be obtained.

The substrate is transferred to the film formation chamber, a deposition gas is introduced to the film formation chamber, the film formation pressure is set to lower than or equal to 0.8 Pa, preferably lower than or equal to 0.4 Pa, and the substrate is held under the pressure for longer than or equal to 10 seconds and shorter than or equal to 1000 seconds, preferably longer than or equal to 15 seconds and shorter than or equal to 720 seconds in order to stabilize the pressure, and then the formation of the second oxide semiconductor layer is performed. The substrate is held for the above period of time in order to stabilize the pressure, whereby the amount of impurity entering the second oxide semiconductor layer during the formation can be reduced. At this time, the distance between the target and the substrate is set to less than or equal to 40 mm, preferably less than or equal to 25 mm When the second oxide semiconductor layer is formed under the above conditions, the frequency of the collision between a sputtered particle and another sputtered particle, a gas molecule, or an ion can be reduced. That is, depending on the film formation pressure, the distance between the target and the substrate is made shorter than the mean free path of a sputtered particle, a gas molecule, or an ion, so that the concentration of impurities entering the film can be reduced.

For example, when the pressure is 0.4 Pa and the temperature is 25° C. (the absolute temperature is 298 K), a hydrogen molecule ($H_2$) has a mean free path of 48.7 mm, a helium atom (He) has a mean free path of 57.9 mm, a water molecule ($H_2O$) has a mean free path of 31.3 mm, an methane molecule ($CH_4$) has a mean free path of 13.2 mm, a neon atom (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon atom (Ar) has a mean free path of 28.3 mm, a carbon dioxide molecule ($CO_2$) has a mean free path of 10.9 mm, a krypton atom (Kr) has a mean free path of 13.4 mm, and a xenon atom (Xe) has a mean free path of 9.6 mm Note that doubling of the pressure halves a mean free path and doubling of the absolute temperature doubles a mean free path.

The mean free path depends on pressure, temperature, and the diameter of a molecule (atom). In the case where pressure and temperature are constant, as the diameter of a molecule (atom) is larger, the mean free path is shorter. Note that the diameters of the molecules (atoms) are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule (atom) is larger, the mean free path is shorter and the crystallinity is lowered due to the large diameter of the molecule (atom) when the molecule (atom) enters the film. For this reason, it can be said that, for example, a molecule (atom) whose diameter is larger than that of Ar is likely to behave as an impurity which decreases the crystallinity.

Note that in the case where the first oxide semiconductor layer and the second oxide semiconductor layer are formed over a plurality of substrates, it is preferable that a rare gas, an oxygen gas, or the like be continuously supplied at a small amount even in a period during which the formation is not performed. In that case, the pressure of the film formation chamber can be kept high; thus, counter flow of impurities from the evacuation system can be reduced. Release of impurities from a pipe, another member, or the like can be suppressed. Accordingly, entry of impurities into the first oxide semiconductor layer and the second oxide semiconductor layer can be reduced. For example, the flow rate of argon is greater than or equal to 1 sccm and less than or equal to 500 sccm, preferably greater than or equal to 2 sccm and less than or equal to 200 sccm, more preferably greater than or equal to 5 sccm and less than or equal to 100 sccm.

Next, heat treatment is performed. The heat treatment is performed under reduced pressure or in an inert atmosphere or an oxidation atmosphere. By the heat treatment, the concentration of impurities in the second oxide semiconductor layer can be reduced.

The heat treatment is preferably performed in such a manner that after heat treatment is performed under reduced pressure or in an inert atmosphere, the atmosphere is switched to an oxidation atmosphere with the temperature maintained and heat treatment is further performed. When the heat treatment is performed under reduced pressure or in an inert atmosphere, the concentration of impurities in the second oxide semiconductor layer can be reduced; however, oxygen vacancies are caused at the same time. By the heat treatment in an oxidation atmosphere, the caused oxygen vacancies can be reduced.

When heat treatment is performed on the second oxide semiconductor layer in addition to the substrate heating at the time of the formation, the concentration of impurities in the layer can be reduced.

Specifically, the concentration of hydrogen in the second oxide semiconductor layer, which is measured by SIMS, can be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in the second oxide semiconductor layer, which is measured by SIMS, can be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The concentration of carbon in the second oxide semiconductor layer, which is measured by SIMS, can be lower than $5 \times 10^{19}$ atoms/cm$^3$, preferably lower than or equal to $5 \times 10^{18}$ atoms/cm$^3$, more preferably lower than or equal to $2 \times 10^{18}$ atoms/cm$^3$, still more preferably lower than or equal to $5 \times 10^{17}$ atoms/cm$^3$.

The amount of each of the following gas molecules (atoms) released from the second oxide semiconductor layer can be less than or equal to $1 \times 10^{19}$/cm$^3$, preferably less than or equal to $1 \times 10^{18}$/cm$^3$, which is measured by TDS analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

A measurement method of the number of released oxygen atoms, which is described later, is referred to for a measurement method of the release amount using TDS analysis.

The first oxide semiconductor layer and the second oxide semiconductor layer are formed as described above, whereby the crystallinity of the first oxide semiconductor layer can be increased, and the concentrations of impurities in the first oxide semiconductor layer and the second oxide semiconductor layer and at the interface between the first oxide semiconductor layer and the second oxide semiconductor layer can be reduced.

<2-3. Transistor Structure (2)>

In this section, a top-gate transistor is described. Here, a top-gate top-contact (TGTC) transistor, which is one kind of top-gate transistor, is described with reference to FIGS. 10A to 10C.

Figure 10A:
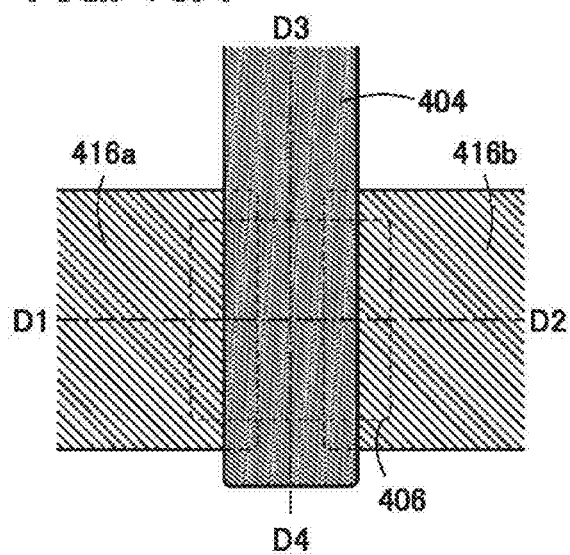
FIGS. 10A to 10C are a top view and cross-sectional views illustrating an example of a semiconductor device of one embodiment of the present invention.
Figure 10C:
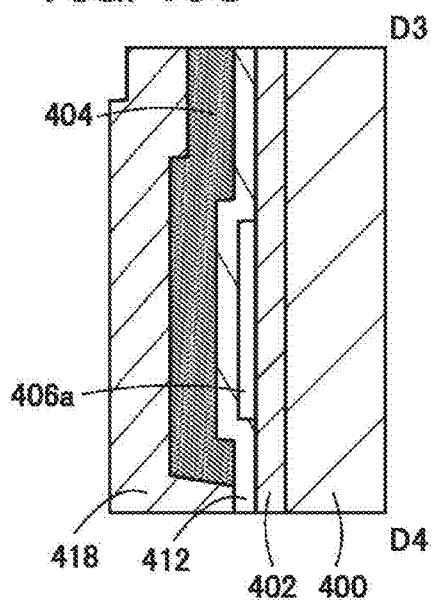
Figure 10B:
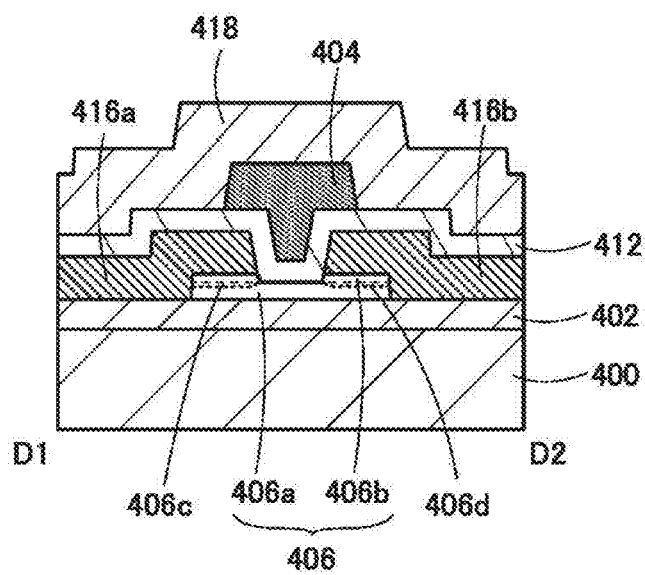

FIGS. 10A to 10C are a top view and cross-sectional views of the TGTC transistor. FIG. 10A is the top view of the transistor. FIG. 10B is the cross-sectional view taken along dashed-dotted line D1-D2 in FIG. 10A. FIG. 10C is the cross-sectional view taken along dashed-dotted line D3-D4 in FIG. 10A.

The transistor illustrated in FIG. 10B includes a base insulating film 402 over a substrate 400; a multilayer film 406 including an oxide semiconductor layer 406a over the base insulating film 402 and an oxide semiconductor layer 406b over the oxide semiconductor layer 406a; a source electrode 416a and a drain electrode 416b over the base insulating film 402 and the multilayer film 406; a gate insulating film 412 over the multilayer film 406, the source electrode 416a, and the drain electrode 416b; a gate electrode 404 over the gate insulating film 412; and an insulating film 418 over the gate insulating film 412 and the gate electrode 404. Note that the transistor does not necessarily include the base insulating film 402 and/or the insulating film 418.

Depending on the kind of conductive film used for the source electrode 416a and the drain electrode 416b or the oxide semiconductor layer 406b, oxygen is taken away from part of the oxide semiconductor layer 406b, or a mixed layer is formed, so that a source region 406c and a drain region 406d are formed in the oxide semiconductor layer 406b.

In FIG. 10A, the distance between the source electrode 416a and the drain electrode 416b in a region overlapping with the gate electrode 404 is referred to as a channel length. Note that in the case where the transistor includes the source region and the drain region, the distance between the source region 406c and the drain region 406d in the region overlapping with the gate electrode 404 may be referred to as a channel length.

Note that a channel formation region refers to a region which overlaps with the gate electrode 404 and is located between the source electrode 416a and the drain electrode 416b when seen from above in the multilayer film 406. Further, a channel refers to a region through which current mainly flows in the channel formation region.

For the multilayer film 406, the description of the multilayer film 306 is referred to. For example, for the oxide semiconductor layer 406a, the description of the oxide semiconductor layer 306a is referred to, and for the oxide semiconductor layer 406b, the description of the oxide semiconductor layer 306b is referred to.

For the substrate 400, the description of the substrate 300 is referred to. For the source electrode 416a and the drain electrode 416b, description of the source electrode 316a and the drain electrode 316b is referred. For the gate insulating film 412, the description of the gate insulating film 312 is referred to. For the gate electrode 404, the description of the gate electrode 304 is referred to. For the insulating film 418, the description of the insulating film 318 is referred to.

Although the edge of the multilayer film 406 is located on the outer side than the edge of the gate electrode 404 in FIG. 10A in the top view in order to suppress generation of carriers in the multilayer film 406 due to light, the edge of the multilayer film 406 may be located on the inner side than the edge of the gate electrode 404.

The base insulating film 402 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 402 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the silicon nitride layer, a silicon nitride layer from which hydrogen and ammonia are less likely to be released is used. The amount of discharge of hydrogen or ammonia may be measured by TDS. Further, as the silicon nitride layer, a silicon nitride layer which does not transmit or hardly transmits hydrogen, water, and oxygen is used.

The base insulating film 402 may be, for example, a multilayer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is less than or equal to $3\times10^{17}$ spins/cm$^3$, preferably less than or equal to $5\times10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits hydrogen, water, and oxygen is used.

In the case where at least one of the gate insulating film 412 and the base insulating film 402 contains excess oxygen, the density of defect states due to oxygen vacancies or the like in the oxide semiconductor layer 406b can be reduced.

The transistor formed in such a manner has stable electric characteristics because a region in which a channel is formed is protected. The transistor has low off-state current. The transistor is an enhancement transistor. The transistor has high field-effect mobility. It is possible to provide a transistor with a small number of steps. It is possible to provide a transistor with high yield.

<2-4. Method for Manufacturing Transistor Structure (2)>

A method for manufacturing the transistor is described here with reference to FIGS. 11A to 11C and FIGS. 12A to 12C.

First, the substrate 400 is prepared.

Figure 11A:
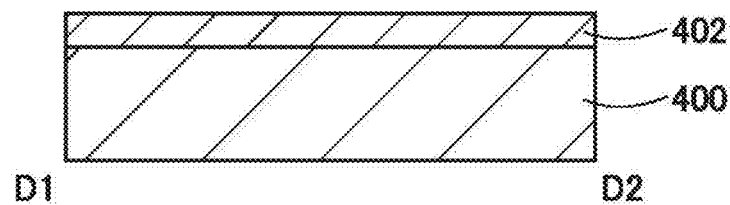
FIGS. 11A to 11C are cross-sectional views illustrating an example of a method for manufacturing a semiconductor device of one embodiment of the present invention.
Figure 11B:
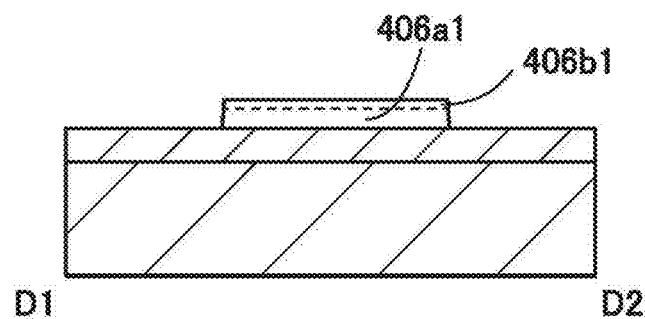
Figure 11C:
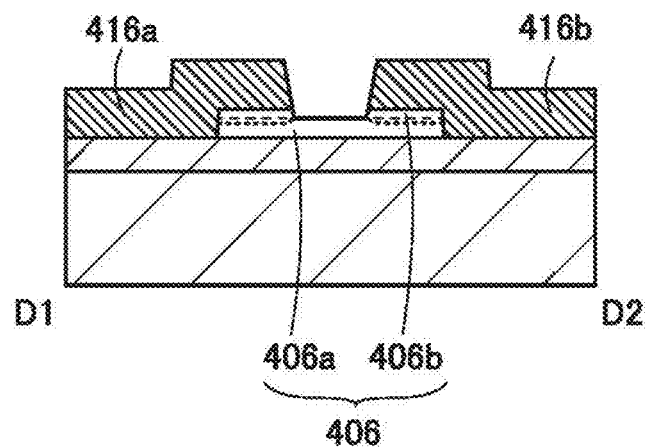

Next, the base insulating film 402 is formed (see FIG. 11A). The base insulating film 402 may be formed using any of the insulating films given above as examples of the base insulating film 402 by a sputtering method, a CVD method, an MBE method, an ALD method, or a PLD method.

Next, an oxide semiconductor layer to be an oxide semiconductor layer 406a1 is formed. For the method for forming the oxide semiconductor layer to be the oxide semiconductor layer 406a1, the description of the method for forming the oxide semiconductor layer 306a1 is referred to. Note that the oxide semiconductor layer 406a1 is formed so as to be a CAAC-OS film, a microcrystalline film, or an amorphous film. When the oxide semiconductor layer 406a1 is the CAAC-OS film, the microcrystalline film, or the amorphous film, an oxide semiconductor layer formed over the oxide semiconductor layer 406a1 is likely to be a CAAC-OS film.

Next, an oxide semiconductor layer to be the oxide semiconductor layer 406b1 is formed. For the method for forming the oxide semiconductor layer to be the oxide semiconductor layer 406b1, the description of the method for forming the oxide semiconductor layer 306b1 is referred to.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment can improve the crystallinity of the oxide semiconductor layer to be the oxide semiconductor layer 406a1 and remove impurities such as hydrogen and water from the base insulating film 402 and/or the oxide semiconductor layer to be the oxide semiconductor layer 406a1. By the first heat treatment, the density of defect states of the oxide semiconductor layer 406a1 can be reduced. Accordingly, treatment like the first heat treatment can be referred to as treatment for reducing the density of defect states of an oxide semiconductor layer in some cases.

Next, the oxide semiconductor layer to be the oxide semiconductor layer 406a1 and the oxide semiconductor layer to be the oxide semiconductor layer 406b1 are partly etched to form a multilayer film including the oxide semiconductor layer 406a1 and the oxide semiconductor layer 406b1 (see FIG. 11A).

Next, a conductive film to be the source electrode 416a and the drain electrode 416b is formed. For the method for forming the conductive film to be the source electrode 416a and the drain electrode 416b, the description of the method for forming the conductive film to be the source electrode 316a and the drain electrode 316b is referred to.

Next, the conductive film to be the source electrode 416a and the drain electrode 416b is partly etched to form the source electrode 416a and the drain electrode 416b. At the time of or after the etching, a region of the oxide semiconductor layer 406a1 and the oxide semiconductor layer 406b1 which overlaps with neither the source electrode 416a nor the drain electrode 416b can be etched by the methods given above as examples of Model A and Model B. The region of the oxide semiconductor layer 406a1 and the oxide semiconductor layer 406b1 which overlaps with neither the source electrode 416a nor the drain electrode 416b is etched to form the oxide semiconductor layer 406a and the oxide semiconductor layer 406b (see FIG. 11C).

Next, second heat treatment is preferably performed. The description of the first heat treatment can be referred to for the second heat treatment. The second heat treatment can remove impurities such as hydrogen and water from the oxide semiconductor layer 406a. Hydrogen easily moves especially in the oxide semiconductor layer 406a; thus, reducing hydrogen by the second heat treatment enables a reduction in the density of defect states of the oxide semiconductor layer 406a. Accordingly, the transistor can have stable electric characteristics.

Figure 12A:
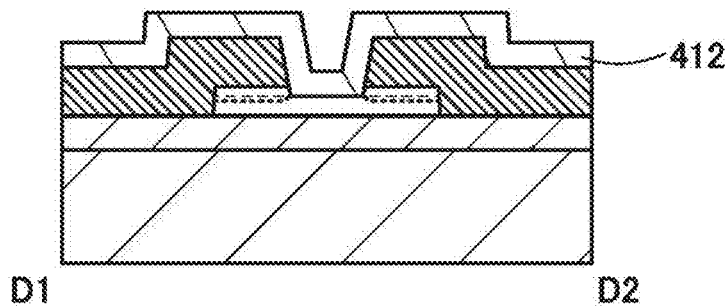
FIGS. 12A to 12C are cross-sectional views illustrating the example of the method for manufacturing the semiconductor device of one embodiment of the present invention.

Next, the gate insulating film 412 is formed (see FIG. 12A). For the method for forming the gate insulating film 412, the description of the method for forming the gate insulating film 312 is referred to.

Next, a conductive film to be the gate electrode 404 is formed. For the method for forming the conductive film to be the gate electrode 404, the description of the method for forming the conductive film to be the gate electrode 304 is referred to.

Figure 12B:
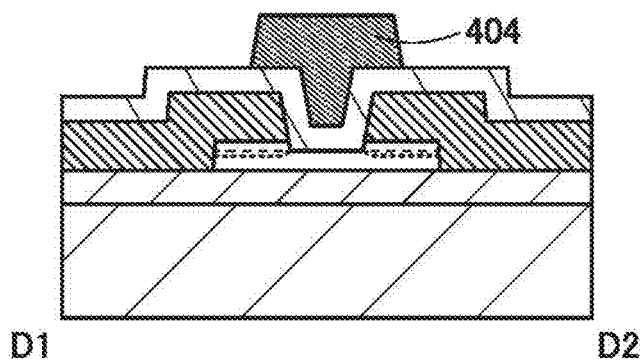

Next, the conductive film to be the gate electrode 404 is partly etched to form the gate electrode 404 (see FIG. 12B).

Figure 12C:
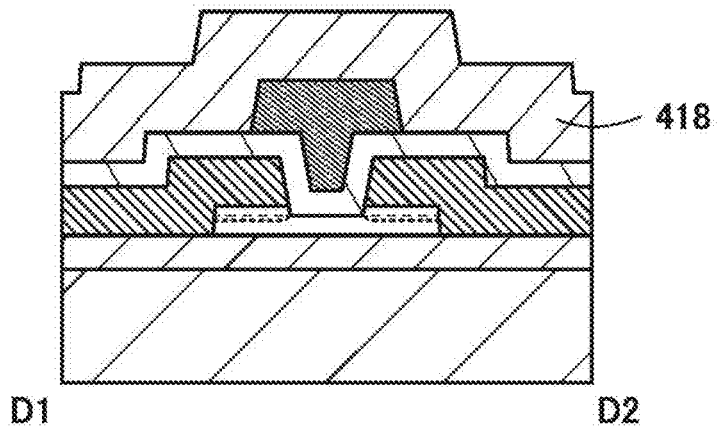

Next, the insulating film 418 is formed (see FIG. 12C). For the method for forming the insulating film 418, the description of the method for forming the insulating film 318 is referred to.

Next, third heat treatment is preferably performed. The description of the first heat treatment can be referred to for the third heat treatment. By the third heat treatment, excess oxygen is released from at least one of the base insulating film 402, the gate insulating film 412, and the insulating film 418; thus, the density of defect states due to oxygen vacancies or the like in the oxide semiconductor layer 406a is reduced in some cases. Note that in the oxide semiconductor layer 406a, an oxygen vacancy captures an adjacent oxygen atom, so that the oxygen vacancy seems to move.

In the above manner, the TGTC transistor can be manufactured.

The transistor has stable electric characteristics because a region in which a channel is formed is protected. The transistor has low off-state current. The transistor is an enhancement transistor. The transistor has high field-effect mobility.

It is possible to provide a transistor with a small number of steps. It is possible to provide a transistor with high yield.

<3. Application Product>

Application products using the above transistor are described below.

<3-1. Display Device>

In this section, a display device to which the above transistor is applied is described.

As a display element provided in the display device, a liquid crystal element (also referred to as a liquid crystal display element), a light-emitting element (also referred to as a light-emitting display element), or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink or an electrophoretic element, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

<3-1-1. EL Display Device>

First, a display device including an EL element (also called an EL display device) is described.

Figure 20:
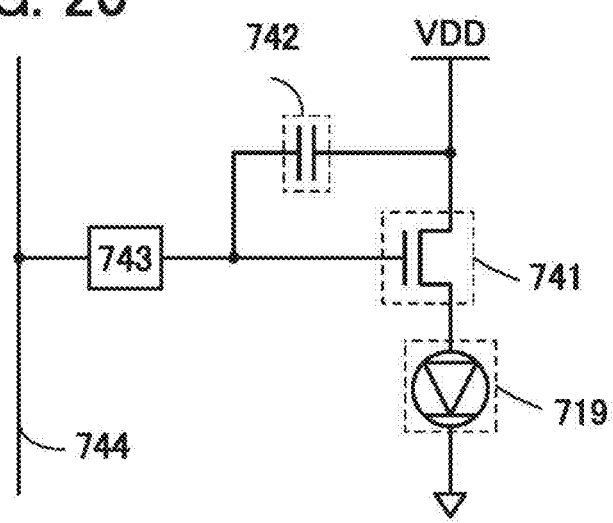
FIG. 20 is a circuit diagram illustrating an example of an EL display device of one embodiment of the present invention.

FIG. 20 is an example of a circuit diagram of a pixel in the EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, even when such portions are not specified, one embodiment of the present invention can be clear and it can be determined that one embodiment of the present invention is disclosed in this specification and the like in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear and it can be determined that one embodiment of the present invention is disclosed in this specification and the like in some cases. Therefore, when a connection portion of a circuit is specified, the circuit is disclosed as one embodiment of the invention even when a function of the circuit is not specified, and one embodiment of the invention can be constructed. Alternatively, when a function of a circuit is specified, the circuit is disclosed as one embodiment of the invention even when a connection portion of the circuit is not specified, and one embodiment of the invention can be constituted.

The EL display device illustrated in FIG. 20 includes a switching element 743, a transistor 741, a capacitor 742, and a light-emitting element 719.

Note that FIG. 20 and the like each illustrate an example of a circuit configuration; thus, a transistor can be provided additionally. On the other hand, for each node in FIG. 20, it is also possible not to provide an additional transistor, switch, passive element, or the like. For example, it is possible not to increase the number of transistors directly connected to the node A, the node B, the node C, the node D, the node E, the node F, and/or the node G. Accordingly, for example, the following structure can be used: only the transistor 741 is directly connected to the node C and the other transistors are not directly connected to the node C.

A gate of the transistor 741 is electrically connected to one terminal of the switching element 743 and one terminal of the capacitor 742. A source of the transistor 741 is electrically connected to one terminal of the light-emitting element 719.

A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower.

Note that as the transistor 741, any of the above transistors each of which includes the multilayer film including the oxide semiconductor layer is used. The transistor has stable electric characteristics. Thus, the EL display device can have high display quality.

As the switching element 743, a transistor is preferably used. When the transistor is used as the switching element, the area of a pixel can be reduced, so that the EL display device can have high resolution. Alternatively, any of the above transistors each of which includes the multilayer film including the oxide semiconductor layer may be used as the switching element 743. When any of the above transistors is used as the switching element 743, the switching element 743 can be formed in the same process as the transistor 741, so that the productivity of the EL display device can be improved.

Figure 21A:
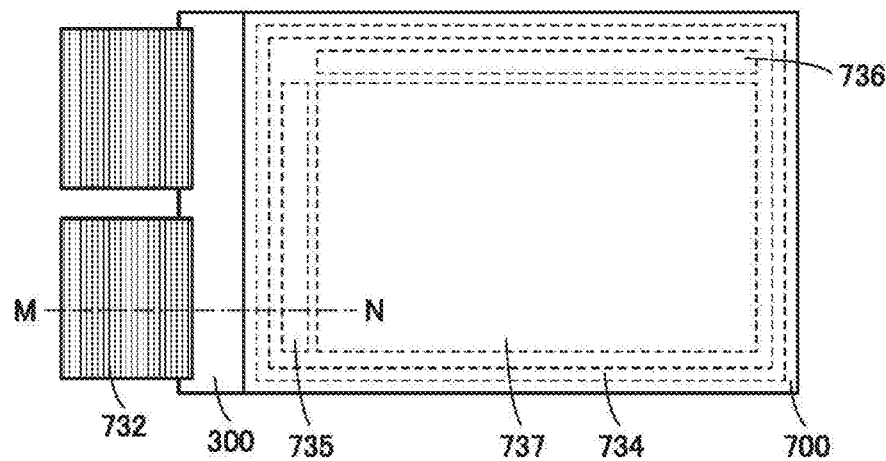
FIGS. 21A to 21C are a top view and cross-sectional views illustrating an example of an EL display device of one embodiment of the present invention.

FIG. 21A is a top view of an EL display device. The EL display device includes the substrate 300, a substrate 700, a sealant 734, a driver circuit 735, a driver circuit 736, a pixel 737, and an FPC 732. The sealant 734 is provided between the substrate 300 and the substrate 700 so as to surround the pixel 737, the driver circuit 735, and the driver circuit 736. Note that the driver circuit 735 and/or the driver circuit 736 may be provided outside the sealant 734.

Figure 21B:
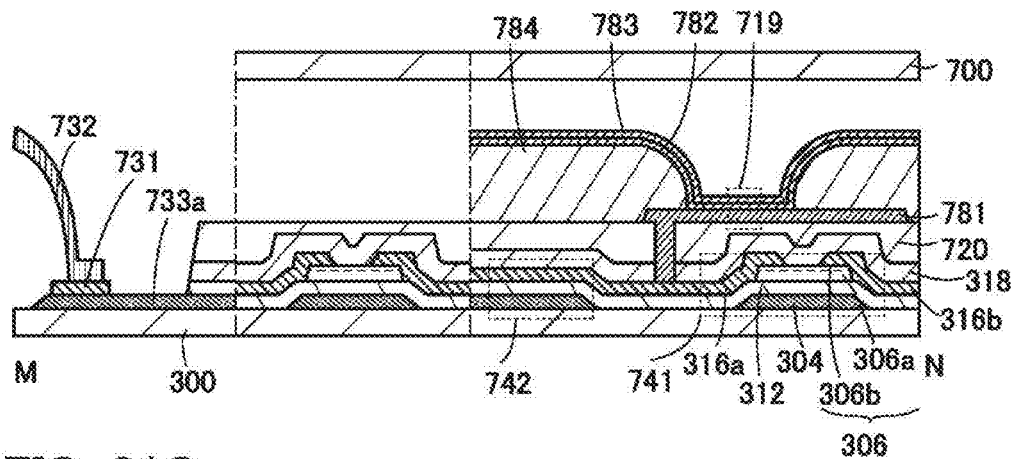

FIG. 21B is a cross-sectional view of the EL display device taken along dashed-dotted line M-N in FIG. 21A. The FPC 732 is connected to a wiring 733a via a terminal 731. Note that the wiring 733a is formed in the same steps as the gate electrode 304.

Note that FIG. 21B shows an example in which the transistor 741 and the capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the EL display device can be reduced; thus, the productivity can be improved.

FIG. 21B illustrates an example in which the transistor illustrated in FIGS. 6A to 6D is used as the transistor 741. Therefore, for components of the transistor 741 which are not particularly described below, the description on FIGS. 6A to 6D is referred to.

An insulating film 720 is provided over the transistor 741 and the capacitor 742.

Here, an opening reaching the source electrode 316a of the transistor 741 is provided in the insulating film 720 and the insulating film 318.

An electrode 781 is provided over the insulating film 720. The electrode 781 is connected to the source electrode 316a of the transistor 741 through the opening provided in the insulating film 720 and the insulating film 318.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that for the insulating film 720, the description of the insulating film 318 is referred to. Alternatively, a resin film of a polyimide resin, an acrylic resin, an epoxy resin, a silicone resin, or the like may be used.

Note that an acrylic resin which absorbs and releases less water is preferably used.

Figure 21C:
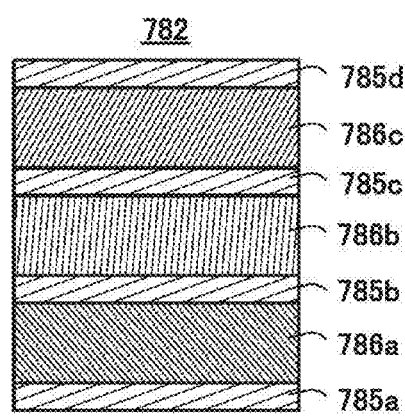

The light-emitting layer 782 is not limited to a single layer, and may be a stack of plural kinds of light-emitting layers and the like. For example, a structure illustrated in FIG. 21C may be employed. FIG. 21C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rendering property or higher emission efficiency can be formed.

Plural kinds of light-emitting materials may be stacked to obtain white light. Although not illustrated in FIG. 21B, white light may be extracted through coloring layers.

Although the structure in which three light-emitting layers and four intermediate layers are provided is shown here, the structure is not limited thereto. The number of light-emitting layers and the number of intermediate layers can be changed as appropriate. For example, the light-emitting layer 782 can be formed with only the intermediate layer 785*a*, the light-emitting layer 786*a*, the intermediate layer 785*b*, the light-emitting layer 786*b*, and the intermediate layer 785*c*. Alternatively, the light-emitting layer 782 may be formed with the intermediate layer 785*a*, the light-emitting layer 786*a*, the intermediate layer 785*b*, the light-emitting layer 786*b*, the light-emitting layer 786*c*, and the intermediate layer 785*d*; the intermediate layer 785*c* may be omitted.

Further, the intermediate layer may have a stacked-layer structure including a hole-injection layer, a hole-transport layer, an electron-transport layer, an electron-injection layer, or the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having visible light permeability. Having visible light permeability means to have an average transmittance of 70% or more, particularly 80% or more in the visible light region (e.g., the range of wavelength of from 400 nm to 800 nm).

As the electrode 781, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used. For example, an Ag film, a Mg film, or an Ag—Mg alloy film with a thickness of 5 nm may be used.

The electrode 781 is preferably a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has visible light permeability, it is preferable that the electrode 783 efficiently reflects visible light. When the electrode 781 efficiently reflects visible light, it is preferable that the electrode 783 have visible light permeability.

Positions of the electrode 781 and the electrode 783 are not limited to the structure illustrated in FIG. 21B, and the electrode 781 and the electrode 783 may be replaced with each other. It is preferable to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

For the partition 784, the description of the insulating film 318 is referred to. Alternatively, a resin film of a polyimide resin, an acrylic resin, an epoxy resin, a silicone resin, or the like may be used.

The transistor 741 connected to the light-emitting element 719 has stable electric characteristics. Thus, an EL display device having high display quality can be provided.

Figure 22A:
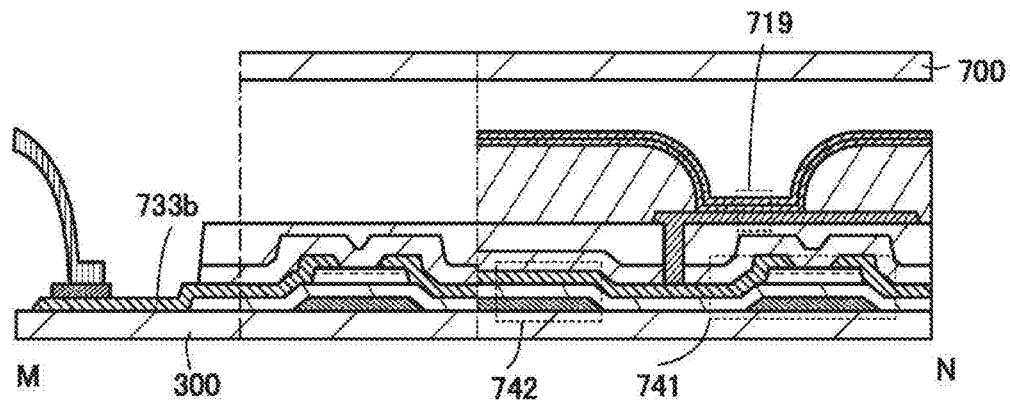
FIGS. 22A and 22B are cross-sectional views each illustrating an example of an EL display device of one embodiment of the present invention.
Figure 22B:
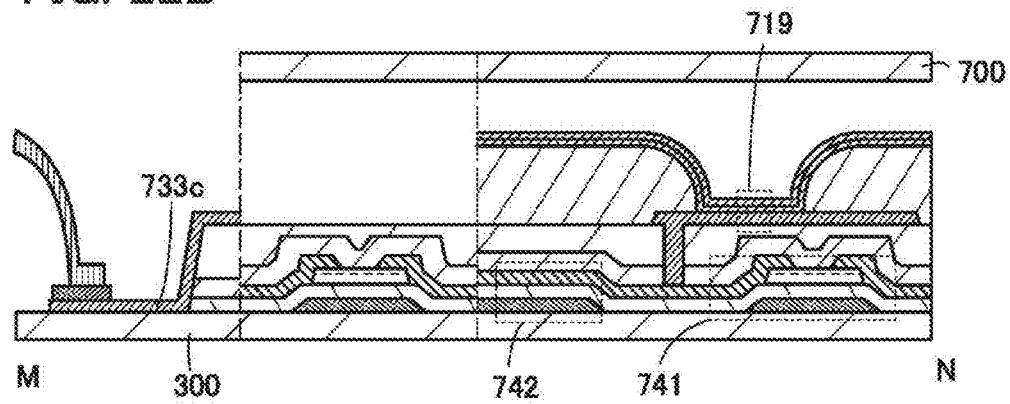

FIGS. 22A and 22B each illustrate an example of a cross section of an EL display device which is partly different from that in FIG. 21B. Specifically, the difference lies in a wiring connected to the FPC 732. In FIG. 22A, a wiring 733*b* is connected to the FPC 732 via the terminal 731. The wiring 733*b* is formed in the same steps as the source electrode 316*a* and the drain electrode 316*b*. In FIG. 22B, a wiring 733*c* is connected to the FPC 732 via the terminal 731. The wiring 733*c* is formed in the same steps as the electrode 781.

<3-1-2. Liquid Crystal Display Device>

Next, a display device including a liquid crystal element (also called a liquid crystal display device) is described.

Figure 23:
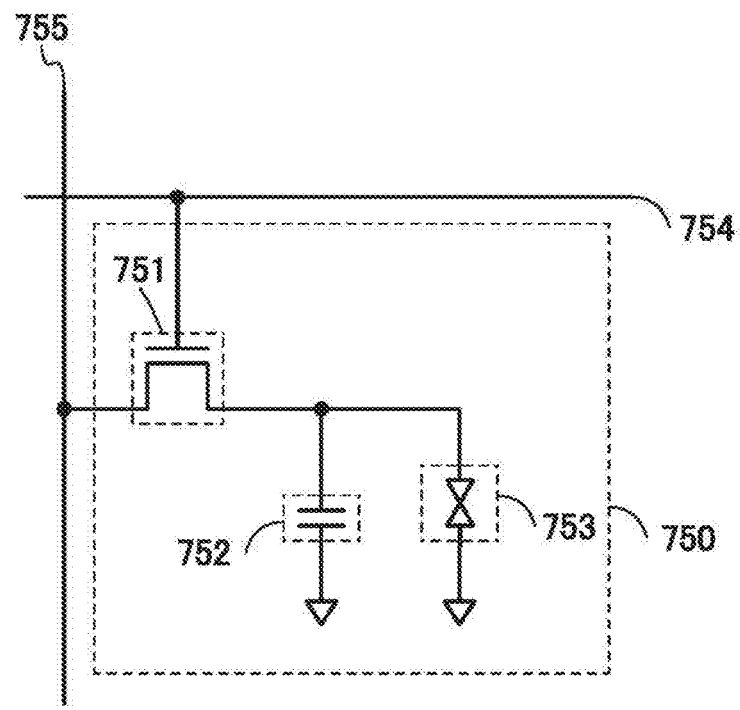
FIG. 23 is a circuit diagram illustrating an example of a liquid crystal display device of one embodiment of the present invention.

FIG. 23 is a circuit diagram showing a structural example of a pixel of the liquid crystal display device. A pixel 750 illustrated in FIG. 23 includes a transistor 751, a capacitor 752, and an element in which liquid crystal is injected between a pair of electrodes (hereinafter also referred to as liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring to which the other of the electrodes of the capacitor 752 is electrically connected.

Figure 24A:
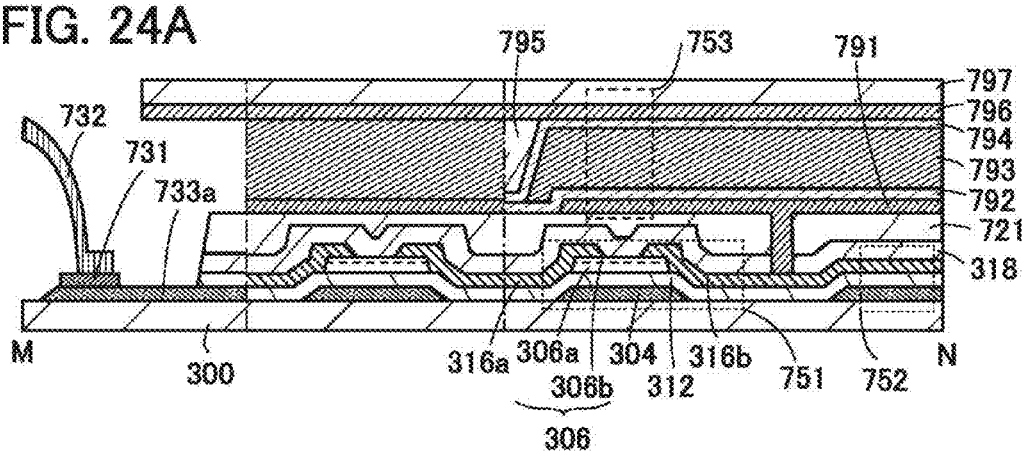
FIGS. 24A to 24C are cross-sectional views each illustrating an example of a liquid crystal display device of one embodiment of the present invention.

Note that a top view of the liquid crystal display device is roughly similar to that of the EL display device. FIG. 24A is a cross-sectional view of the liquid crystal display device taken along dashed-dotted line M-N in FIG. 21A. In FIG. 24A, the FPC 732 is connected to the wiring 733*a* via the terminal 731. Note that the wiring 733*a* is formed in the same steps as the gate electrode 304.

Note that FIG. 24A illustrates an example in which the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the liquid crystal display device can be reduced; thus, the productivity can be improved.

As the transistor 751, any of the above transistors can be used. In FIG. 24A, the transistor illustrated in FIGS. 6A to 6D is used as the transistor 751. Therefore, for components of the transistor 751 which are not particularly described below, the description of FIGS. 6A to 6D is referred to.

Note that the transistor 751 can be a transistor having extremely low off-state current. Thus, the charge held in the capacitor 752 is unlikely to be leaked and voltage applied to the liquid crystal element 753 can be retained for a long time. Thus, by turning off the transistor 751 when an image with little motion or a still image is displayed, power for the operation of the transistor 751 is not needed. As a result, the power consumption of the liquid crystal display device can be low.

An insulating film 721 is provided over the transistor 751 and the capacitor 752.

Here, an opening reaching the drain electrode 316*b* of the transistor 751 is provided in the insulating film 721 and the insulating film 318.

An electrode 791 is provided over the insulating film 721. The electrode 791 is in contact with the drain electrode 316*b* of the transistor 751 through the opening provided in the insulating film 721 and the insulating film 318.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, the description of the insulating film 318 is referred to. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the insulating films 792 and 794 serving as an alignment film are not necessarily provided.

The electrode 791 can be formed using a conductive film having a transmitting property with respect to visible light.

As the electrode 791, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used.

The electrode 791 is preferably a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has visible light permeability, it is preferable that the electrode 796 efficiently reflect visible light. When the electrode 791 efficiently reflects visible light, it is preferable that the electrode 796 have visible light permeability.

Positions of the electrode 791 and the electrode 796 are not limited to the structure illustrated in FIG. 24A, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

As the substrate 797, a glass substrate, a resin substrate, a metal substrate, or the like can be used. The substrate 797 may have flexibility.

Figure 24B:
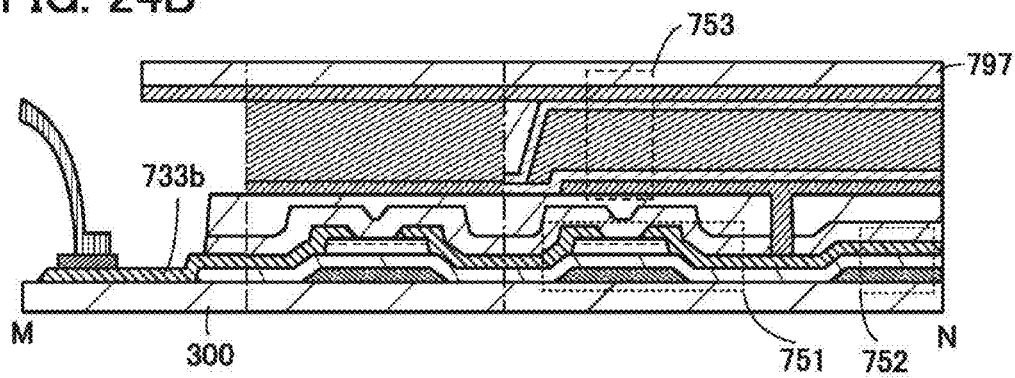
Figure 24C:
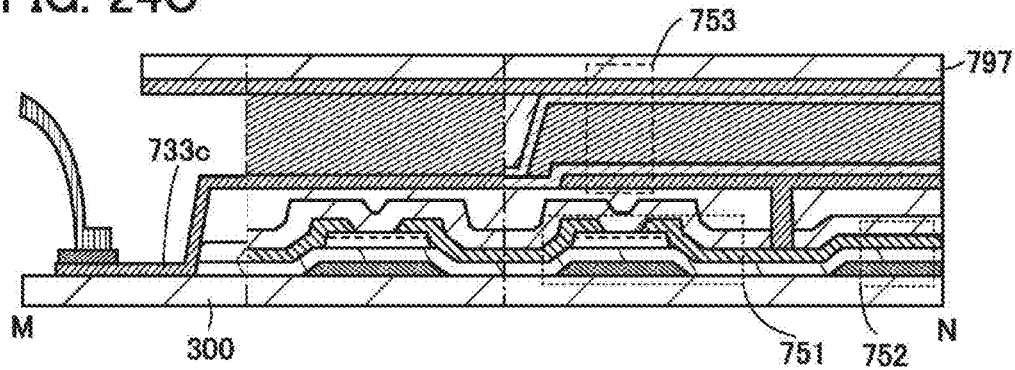

FIGS. 24B and 24C each illustrate an example of a cross section of a liquid crystal display device which is partly different from that in FIG. 24A. Specifically, the difference lies in a wiring connected to the FPC 732. In FIG. 24B, the wiring 733b is connected to the FPC 732 via the terminal 731. The wiring 733b is formed in the same steps as the source electrode 316a and the drain electrode 316b. In FIG. 24C, the wiring 733c is connected to the FPC 732 via the terminal 731. The wiring 733c is formed in the same steps as the electrode 791.

The transistor 751 connected to the liquid crystal element 753 has stable electric characteristics. Thus, a liquid crystal display device having high display quality can be provided. Further, since the off-state current of the transistor 751 can be extremely low, a display device with low power consumption can be provided.

Operation modes of liquid crystal is described below, using examples. Driving methods of a liquid crystal of a liquid crystal display device include a vertical electric field method where voltage is applied perpendicular to a substrate and a horizontal electric field method where voltage is applied in parallel to a substrate.

First, FIGS. 25A1 and 25A2 are cross-sectional schematic views illustrating a pixel structure of a liquid crystal display device of a TN mode.

A liquid crystal layer 3100 is held between a substrate 3101 and a substrate 3102 which are arranged so as to face each other. A polarizing plate 3103 is formed on the substrate 3101 side and a polarizing plate 3104 is formed on the substrate 3102 side. The absorption axis of the polarizing plate 3103 and the absorption axis of the polarizing plate 3104 are arranged in a cross-Nicol state.

Although not illustrated, a backlight and the like are provided outside the polarizing plate 3104. An electrode 3108 and an electrode 3109 are provided on the substrate 3101 and the substrate 3102, respectively. The electrode 3108 on the opposite side to the backlight, that is, on the viewing side, is formed to have a light-transmitting property.

In the case where a liquid crystal display device having such a structure is in a normally white mode, when voltage is applied between the electrode 3108 and the electrode 3109 (referred to as a vertical electric field method), liquid crystal molecules 3105 are aligned vertically as illustrated in FIG. 25A1. Thus, the light from the backlight cannot pass through the polarizing plate 3103, which leads to black display.

When no voltage is applied between the electrode 3108 and the electrode 3109, the liquid crystal molecules 3105 are aligned horizontally and twisted on a plane surface as illustrated in FIG. 25A2. As a result, light from the backlight can pass through the polarizing plate 3103, which leads to white display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

A known liquid crystal molecule may be used as a liquid crystal material for the TN mode.

FIGS. 25B1 and 25B2 are cross-sectional schematic views illustrating a pixel structure of a VA-mode liquid crystal display device. In the VA mode, the liquid crystal molecules 3105 are aligned such that they are perpendicular to the substrate when there is no electric field.

In a manner similar to that in FIGS. 25A1 and 25A2, the electrode 3108 and the electrode 3109 are provided on the substrate 3101 and the substrate 3102, respectively. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the electrode 3108 and the electrode 3109 (the vertical electric field method) in a liquid crystal display device having such a structure, the liquid crystal molecules 3105 are aligned horizontally as illustrated in FIG. 25B1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 25B2. As a result, light from the backlight which is polarized by the polarizing plate 3104 passes through a cell without being influenced by birefringence of the liquid crystal molecules 3105. Thus, the light from the backlight which is polarized cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

FIGS. 25C1 and 25C2 are cross-sectional schematic views illustrating a pixel structure of a liquid crystal display device of an MVA mode. The MVA mode is a method in which one pixel is divided into a plurality of portions, and the portions have different alignment directions of the liquid crystal molecules 3105 and compensate the viewing angle dependencies with each other. As illustrated in FIG. 25C1, in the MVA mode, a protrusion 3158 whose cross section is a triangle is provided on the electrode 3108 and a protrusion 3159 whose cross section is a triangle is provided on the electrode 3109 for controlling alignment. Note that the other structures are similar to those of the VA mode.

When voltage is applied between the electrode 3108 and the electrode 3109 (the vertical electric field method), the liquid crystal molecules 3105 are aligned so that a long axis of the liquid crystal molecule 3105 is substantially vertical to surfaces of the protrusions 3158 and 3159 as illustrated in FIG. 25C1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 25C2. As a result, light from the backlight cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

Figure 28A:
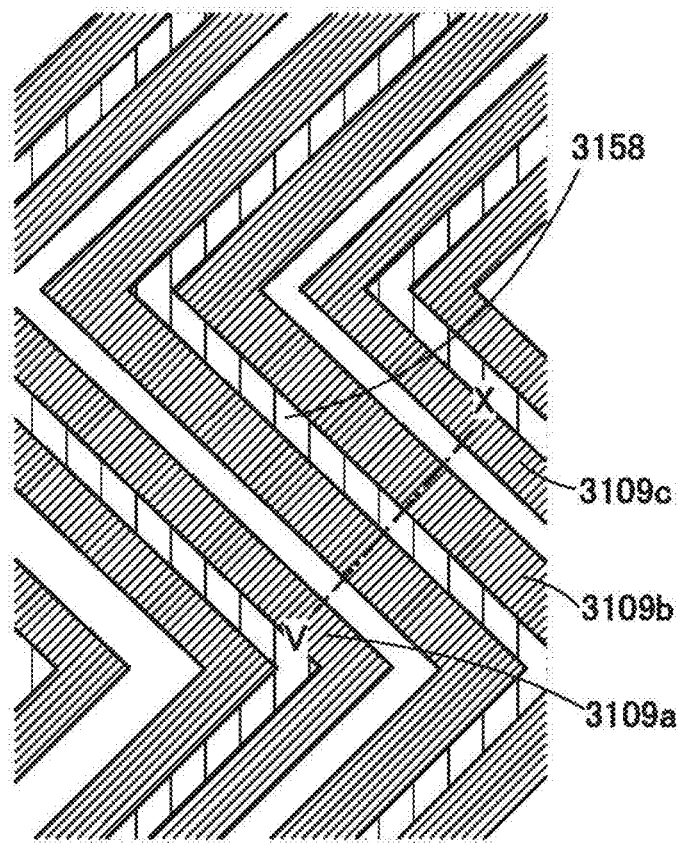
FIGS. 28A and 28B are a top view and a cross-sectional view illustrating an example of a pixel of a liquid crystal device of one embodiment of the present invention.
Figure 28B:
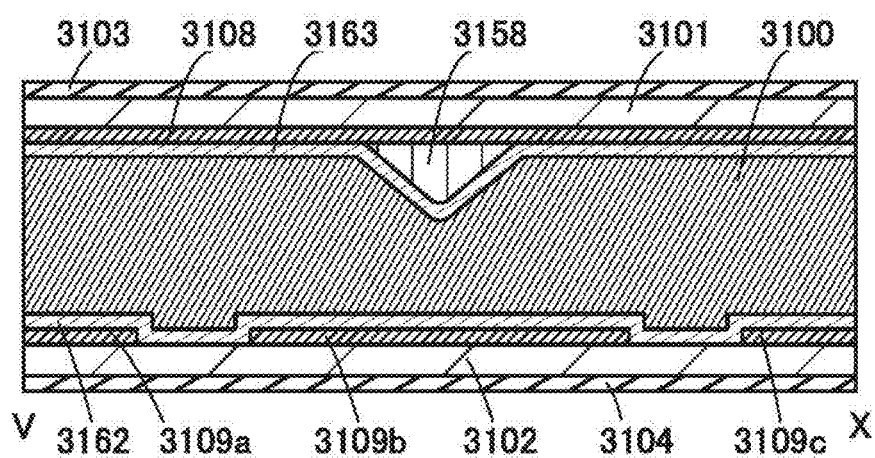

FIGS. 28A and 28B are a top view and a cross-sectional view, respectively, of another example of the MVA mode. As illustrated in FIG. 28A, an electrode 3109a, an electrode 3109b, and an electrode 3109c are each formed into a bent pattern like a dogleg-like shape (V-like shape). As illustrated in FIG. 28B, an insulating film 3162 and an insulating film 3163 which function as alignment films are formed over the electrodes 3109a, 3109b, and 3109c and over the electrode 3108, respectively. The protrusion 3158 is formed on the electrode 3108 so as to overlap with the electrode 3109b.

FIGS. 26A1 and 26A2 are cross-sectional schematic views illustrating a pixel structure of an OCB-mode liquid crystal display device. In the OCB mode, the liquid crystal molecules 3105 in a liquid crystal layer are aligned so that they compensate the viewing angle dependence. This alignment is called a bend alignment.

As in FIGS. 25A1 to 25C2, the electrode 3108 is provided on the substrate 3101 and the electrode 3109 is provided on the substrate 3102. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the electrode 3108 and the electrode 3109 (the vertical electric field method) in a liquid crystal display device having such a structure, black display is performed. At this time, the liquid crystal molecules 3105 are aligned vertically as illustrated in FIG. 26A1. Thus, the polarized light from the backlight cannot pass through the polarizing plate 3103, which leads to black display.

When no voltage is applied between the electrode 3108 and the electrode 3109, the liquid crystal molecules 3105 exist in a bend alignment state as illustrated in FIG. 26A2. As a result, light from the backlight can pass through the polarizing plate 3103, which leads to white display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

In such an OCB mode, alignment of the liquid crystal molecules 3105 can compensate the viewing angle dependence. In addition, a contrast ratio can be increased by a pair of stacked layers including polarizers.

FIGS. 26B1 and 26B2 are cross-sectional schematic views illustrating pixel structures of an FLC-mode liquid crystal display device and an AFLC-mode liquid crystal display device.

As in FIGS. 25A1 to 25C2, the electrode 3108 is provided on the substrate 3101 and the electrode 3109 is provided on the substrate 3102. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

In the liquid crystal display device having such a structure, when voltage is applied between the electrode 3108 and the electrode 3109 (referred to as vertical electric field method), the liquid crystal molecules 3105 are aligned horizontally in a direction deviated from a rubbing direction. As a result, light from the backlight can pass through the polarizing plate 3103, which leads to white display.

When no voltage is applied between the electrode 3108 and the electrode 3109, the liquid crystal molecules 3105 are aligned horizontally along the rubbing direction as illustrated in FIG. 26B2. Thus, the polarized light from the backlight cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

A known material may be used for a liquid crystal material for an FLC mode or an AFLC mode.

FIGS. 27A1 and 27A2 are cross-sectional schematic views illustrating a pixel structure of an IPS-mode liquid crystal display device. The IPS mode is a mode in which the liquid crystal molecules 3105 are rotated in a plane parallel to a substrate by horizontal electric field generated by the electrodes provided for only one substrate side.

The IPS mode is characterized in that liquid crystals are controlled by a pair of electrodes which are provided on one substrate. Thus, a pair of electrodes 3150 and 3151 are provided over the substrate 3102. The pair of electrodes 3150 and 3151 may each have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the pair of electrodes 3150 and 3151 in the liquid crystal display device having such a structure, the liquid crystal molecules 3105 are aligned along an electric flux line deviated from a rubbing direction as illustrated in FIG. 27A1. Thus, light from the backlight can pass through the polarizing plate 3103, which leads to white display.

As long as voltage is not applied between the pair of electrodes 3150 and 3151, the liquid crystal molecules 3105 are aligned horizontally along the rubbing direction, as illustrated in FIG. 27A2. As a result, light from the backlight cannot pass through the polarizing plate 3103, which leads to black display. In addition, the grayscale can be expressed by adjusting the voltage applied between the pair of electrodes 3150 and 3151. In this manner, a predetermined image is displayed.

At this time, full color display can be performed by providing a coloring layer. The coloring layer can be provided on either the substrate 3101 side or on the substrate 3102 side.

Figure 29A:
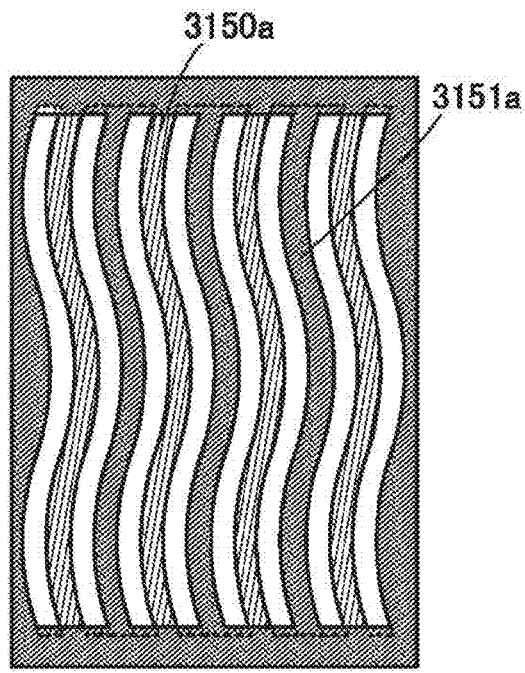
FIGS. 29A to 29C are top views each illustrating an example of a pixel of a liquid crystal device of one embodiment of the present invention.
Figure 29B:
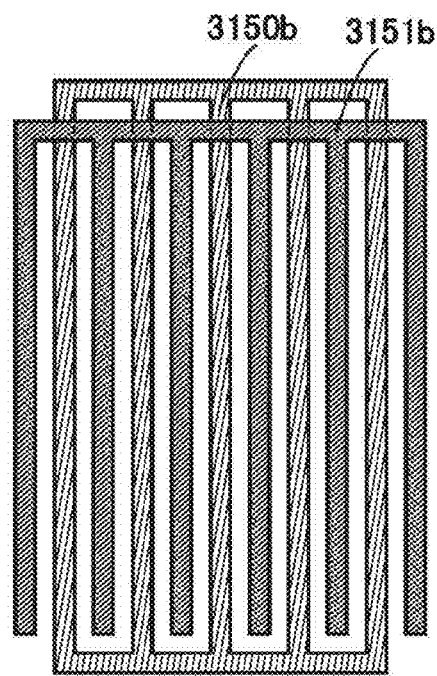
Figure 29C:
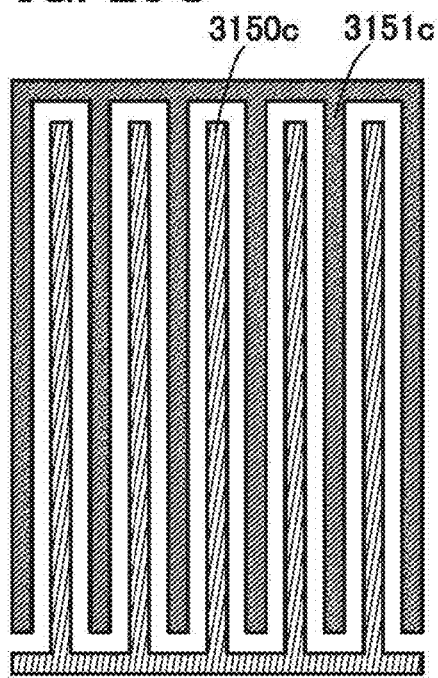

FIGS. 29A to 29C each illustrate an example of the pair of electrodes 3150 and 3151 that can be used in the IPS mode. As illustrated in top views of FIGS. 29A to 29C, the pair of electrodes 3150 and 3151 are alternately formed. In FIG. 29A, electrodes 3150a and 3151a each have an undulating wave shape. In FIG. 29B, electrodes 3150b and 3151b each have a comb-like shape and partly overlap with each other. In FIG. 29C, electrodes 3150c and 3151c have a comb-like shape in which the electrodes are meshed with each other.

FIGS. 27B1 and 27B2 are cross-sectional schematic views illustrating a pixel structure of an FFS-mode liquid crystal display device. The FFS mode is also a horizontal electric field method as in the IPS mode and has a structure in which the electrode 3151 is formed over the electrode 3150 with an insulating film 3154 provided therebetween as illustrated in FIGS. 27B1 and 27B2.

The pair of electrodes 3150 and 3151 may each have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the pair of electrodes 3150 and 3151 in a liquid crystal display device having such a structure, the liquid crystal molecules 3105 are aligned along an electric flux line deviated from a rubbing direction as illustrated in FIG. 27B1. Thus, light from the backlight can pass through the polarizing plate 3103, which leads to white display.

When no voltage is applied between the pair of electrodes 3150 and 3151, the liquid crystal molecules 3105 are aligned horizontally along the rubbing direction as illustrated in FIG. 27B2. As a result, light from the backlight cannot pass through the polarizing plate 3103, which leads to black display. In addition, the grayscale can be expressed by adjusting the voltage applied between the pair of electrodes 3150 and 3151. In this manner, a predetermined image is displayed.

At this time, full color display can be performed by providing a coloring layer. The coloring layer can be provided on either the substrate 3101 side or on the substrate 3102 side.

Figure 30A:
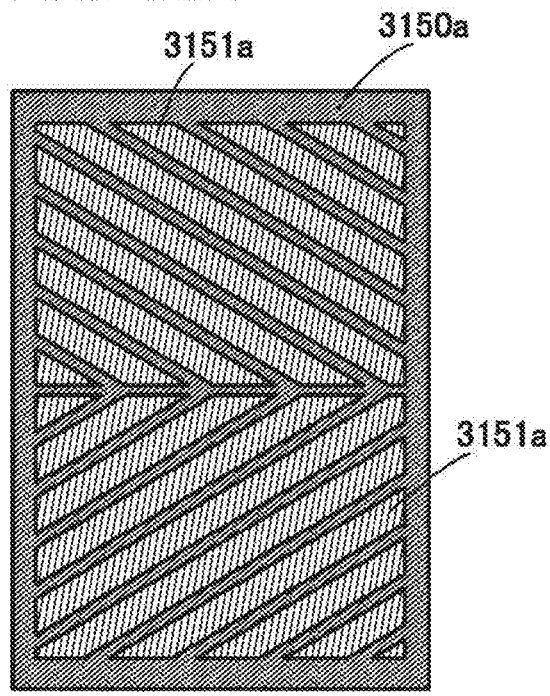
FIGS. 30A to 30C are top views each illustrating an example of a pixel of a liquid crystal device of one embodiment of the present invention.
Figure 30B:
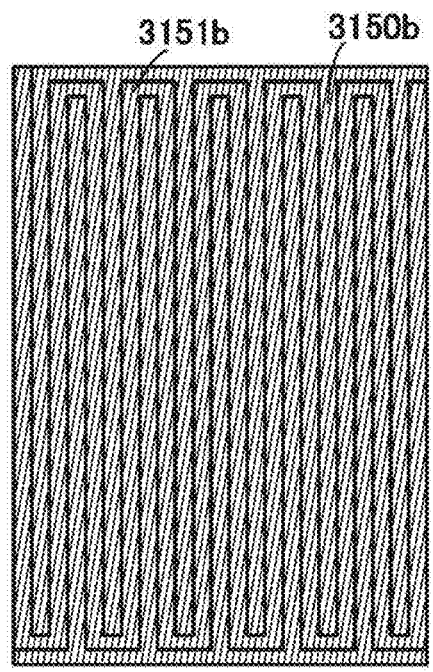
Figure 30C:
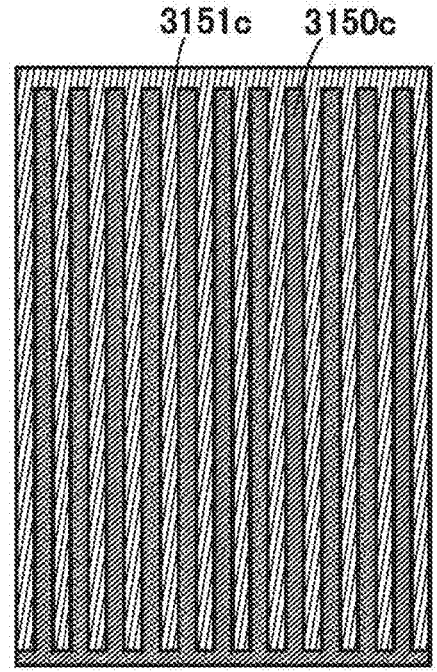

FIGS. 30A to 30C each show an example of the pair of electrodes 3150 and 3151 that can be used in the FFS mode. As illustrated in top views of FIGS. 30A to 30C, the electrodes 3151 are formed into various patterns over the electrodes 3150. In FIG. 30A, the electrode 3151a over the electrode 3150a has a bent dogleg-like shape (V-like shape). In FIG. 30B, the electrode 3151b over the electrode 3150b has a comb-like shape in which the electrodes are meshed with each other. In FIG. 30C, the electrode 3151c over the electrode 3150c has a comb-like shape.

A known liquid crystal molecule may be used for the IPS-mode liquid crystal display device and the FFS-mode liquid crystal display device.

Another operation mode such as a PVA mode, an ASM mode, or a TBA mode may be employed.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. A field-sequential driving method enables color display without using a coloring layer.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. However, one embodiment of the present invention is not limited to a color liquid crystal display device and can be applied to a monochrome liquid crystal display device.

<3-2. Touch Sensor>

A structure example of a sensor that can sense proximity or a touch of an object (hereinafter referred to as a touch sensor) which is one embodiment of the present invention is described below.

For a touch sensor, a variety of types such as a capacitive type, a resistive type, a surface acoustic wave type, an infrared type, and an optical type can be used.

Examples of the capacitive touch sensor are typically of a surface capacitive type, a projected capacitive type, and the like. Further, examples of the projected capacitive type are of a self capacitive type, a mutual capacitive type, and the like mainly in accordance with the difference in the driving method. The use of a mutual capacitive type is preferable because of simultaneous sensing of multiple points (multi-point sensing).

<3-2-1. Example of Detection Method of Touch Sensor>

Figure 31A:
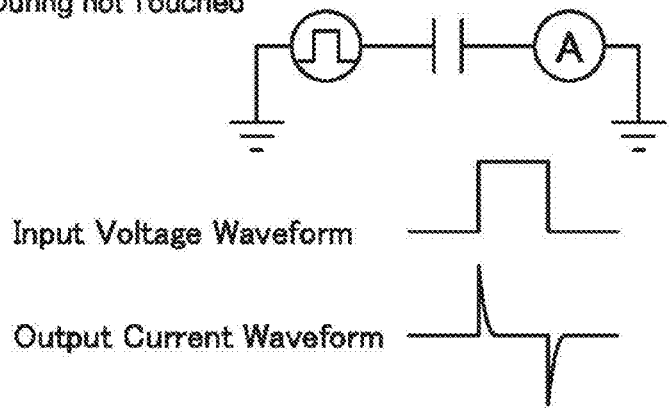
FIGS. 31A to 31C are diagrams illustrating an example of a touch sensor of one embodiment of the present invention.
Figure 31B:
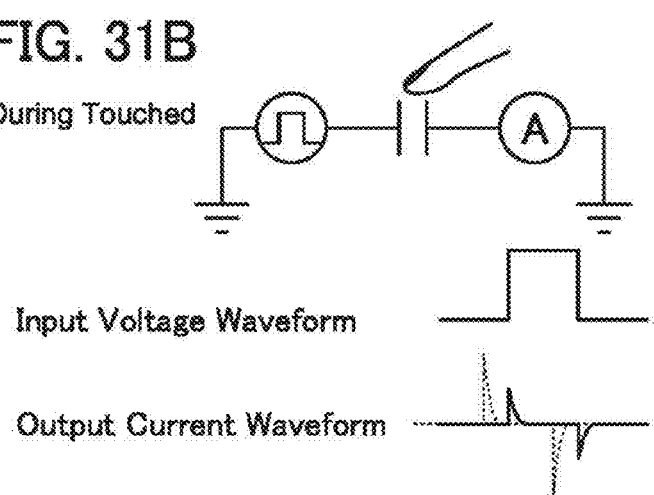

FIGS. 31A and 31B are schematic diagrams each illustrating a structure of a mutual capacitive touch sensor and input and output waveforms. The touch sensor includes a pair of electrodes. A capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 31A, a waveform having a sharp peak is detected as an output current waveform.

Further, in the case where a conductive object is close to or touches a capacitor as illustrated in FIG. 31B, the capacitance value between the electrodes is decreased; accordingly, the current value is decreased.

By detecting a change in capacitance by using a change in output current (or potential) with respect to input voltage in this manner, proximity or a touch of an object can be detected.

<3-2-2. Structure Example of Touch Sensor>

Figure 31C:
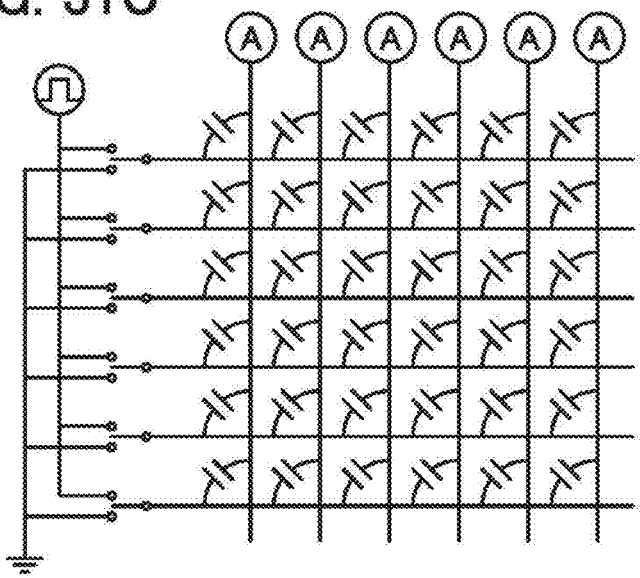

FIG. 31C illustrates a structure example of a touch sensor provided with a plurality of capacitors arranged in a matrix.

The touch sensor includes a plurality of wirings extending in the X direction (the horizontal direction of this figure) and a plurality of wirings extending in the Y direction (the vertical direction of this figure) which intersect with the plurality of wirings. Capacitance is formed between two wirings intersecting with each other.

One of input voltage and a common potential (including a grounded potential and a reference potential) is input to the wiring extending in the X direction. Further, a detection circuit (e.g., a source meter or a sense amplifier) is electrically connected to the wirings extending in the Y direction and can detect current (or potential) flowing through the wirings.

The touch sensor can perform sensing two dimensionally in such a manner that the touch sensor sequentially scans the plurality of wirings extending in the X direction so that input voltage is input and detects a change in current (or potential) flowing through the wirings extending in the Y direction.

<3-2-3. Structure Example of Touch Panel>

A structure example of a touch panel incorporating the touch sensor into a display portion including a plurality of pixels is described below. Here, an example where a liquid crystal element is used as a display element provided in the pixel is shown. Note that an EL element may be used as the display element provided in the pixel.

Figure 32A:
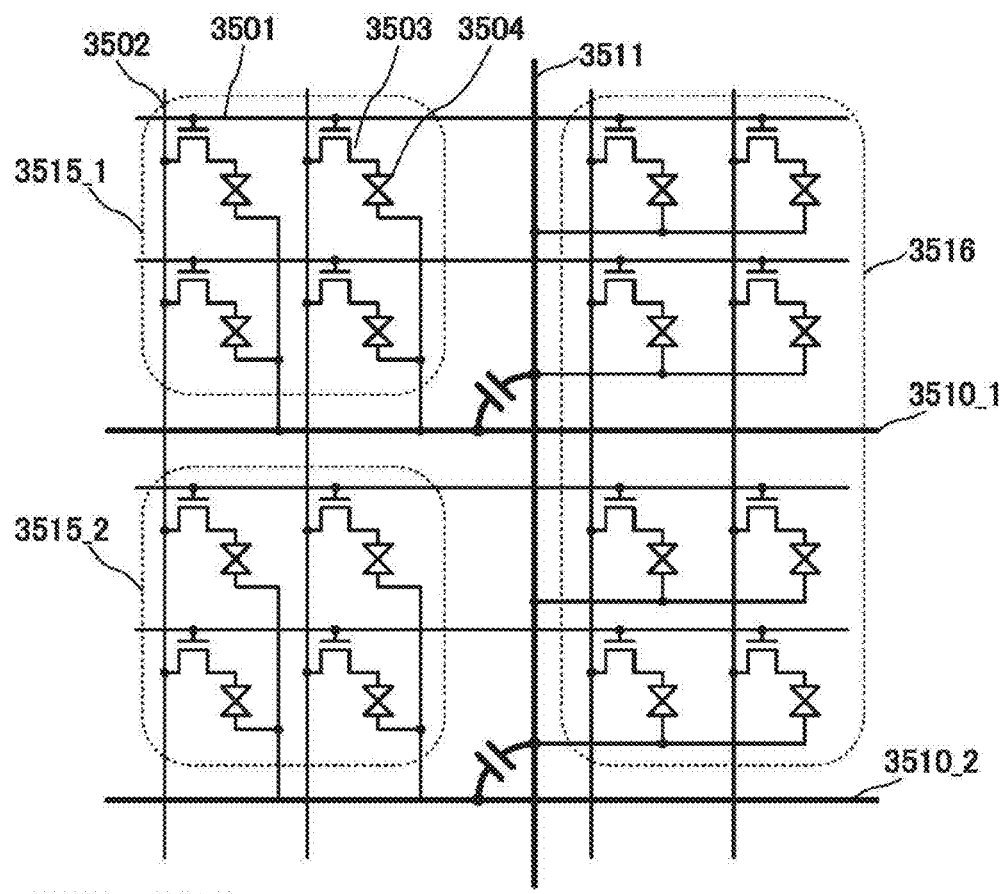
FIGS. 32A and 32B are diagrams illustrating a pixel provided with a touch sensor of one embodiment of the present invention.

FIG. 32A is an equivalent circuit diagram of part of a pixel circuit provided in the display portion of the touch panel described in this structure example.

Each pixel includes at least a transistor 3503 and a liquid crystal element 3504. In addition, a gate of the transistor 3503 is electrically connected to a wiring 3501, and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., wirings 3511). These wirings are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction.

The wiring 3510_1 (or 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Further, the wiring 3511 extending in the Y direction is electrically connected to the linear block 3516.

Figure 32B:
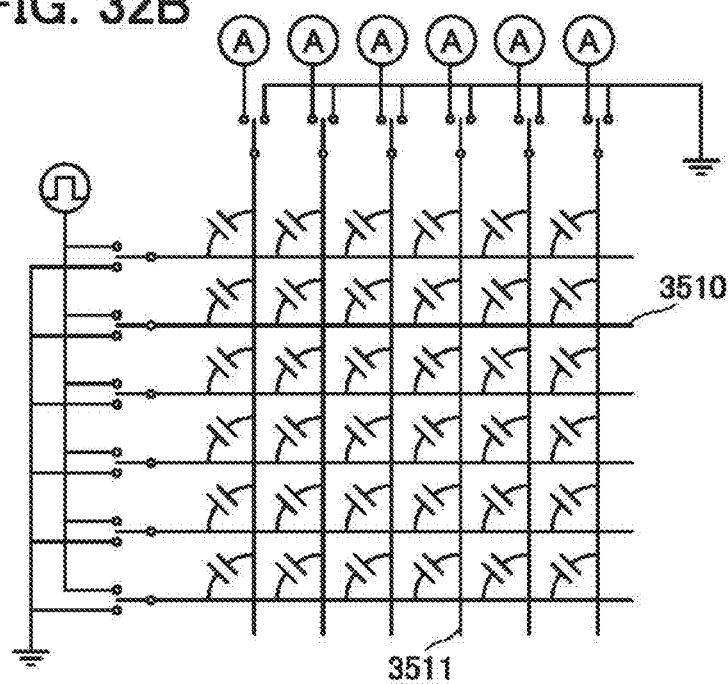

FIG. 32B is an equivalent circuit diagram illustrating a plurality of wirings 3510 extending in the X direction and the plurality of wirings 3511 extending in the Y direction. Input voltage or a common potential can be input to each of the wirings 3510 extending in the X direction. Further, a ground potential can be input to each of the wirings 3511 extending in the Y direction, or the wirings 3511 can be electrically connected to the detection circuit.

<3-2-4. Operation Example of Touch Panel>

Operation of the above-described touch panel is described with reference to FIGS. 33A and 33B and FIG. 34.

Figure 34:
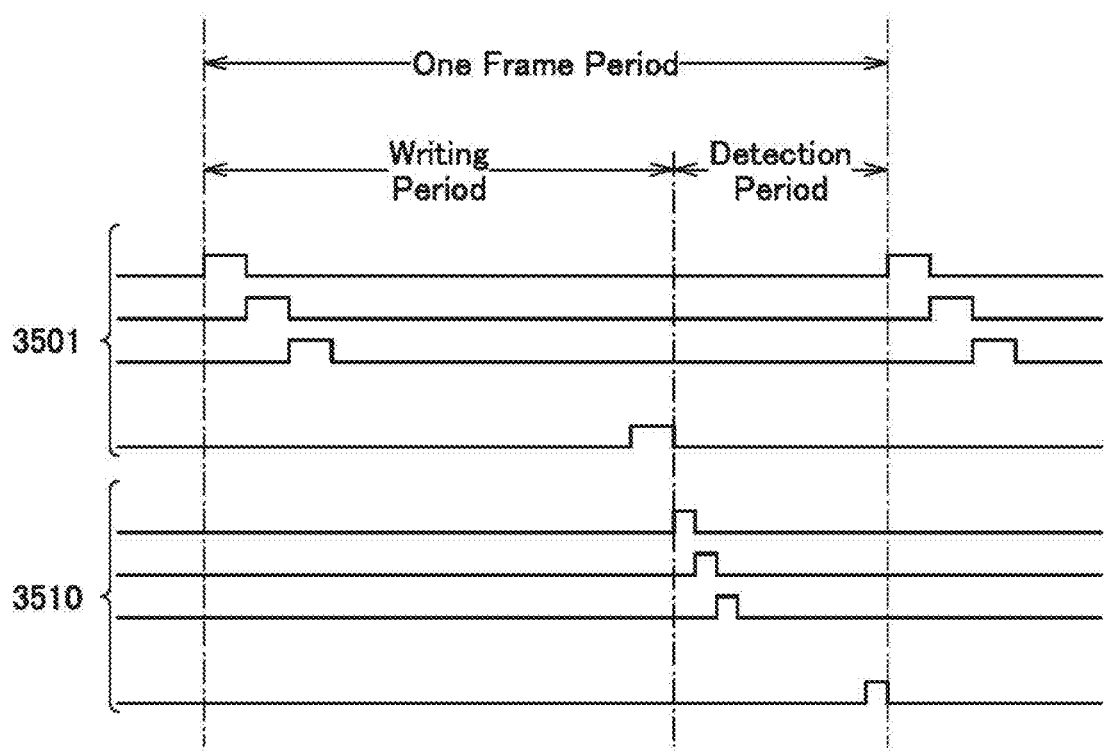
FIG. 34 is a diagram illustrating an example of operation of a touch sensor and a pixel of one embodiment of the present invention.

As illustrated in FIG. 34, one frame period is divided into a writing period and a detecting period. The writing period is a period in which image data is written to a pixel, and the wirings 3510 (also referred to as gate lines) are sequentially selected. On the other hand, the detecting period is a period in which sensing is performed by a touch sensor, and the wirings 3510 extending in the X direction are sequentially selected and input voltage is input.

Figure 33A:
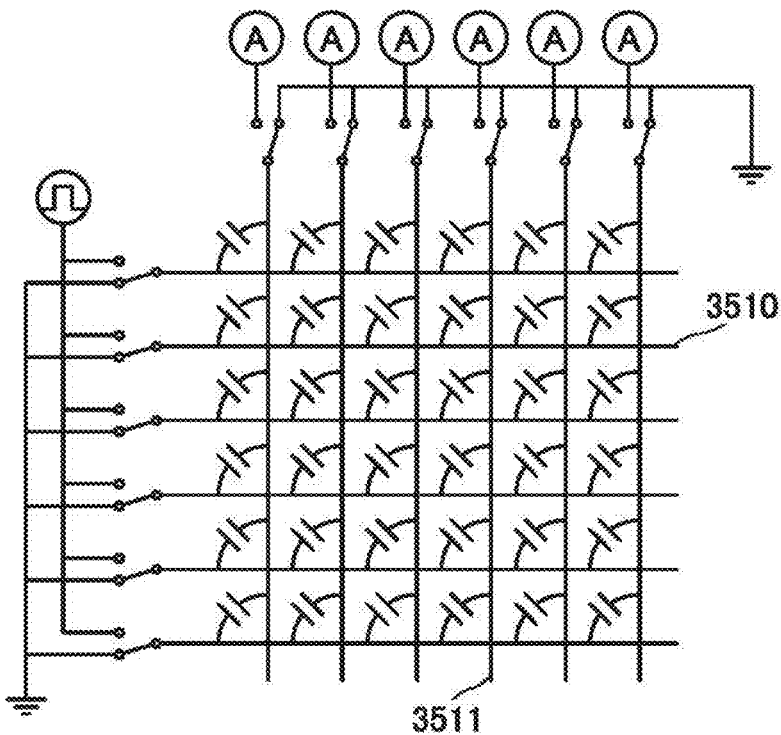
FIGS. 33A and 33B are diagrams illustrating an example of operation of a touch sensor and a pixel of one embodiment of the present invention.

FIG. 33A is an equivalent circuit diagram in the writing period. In the writing period, a common potential is input to both the wiring 3510 extending in the X direction and the wiring 3511 extending in the Y direction.

Figure 33B:
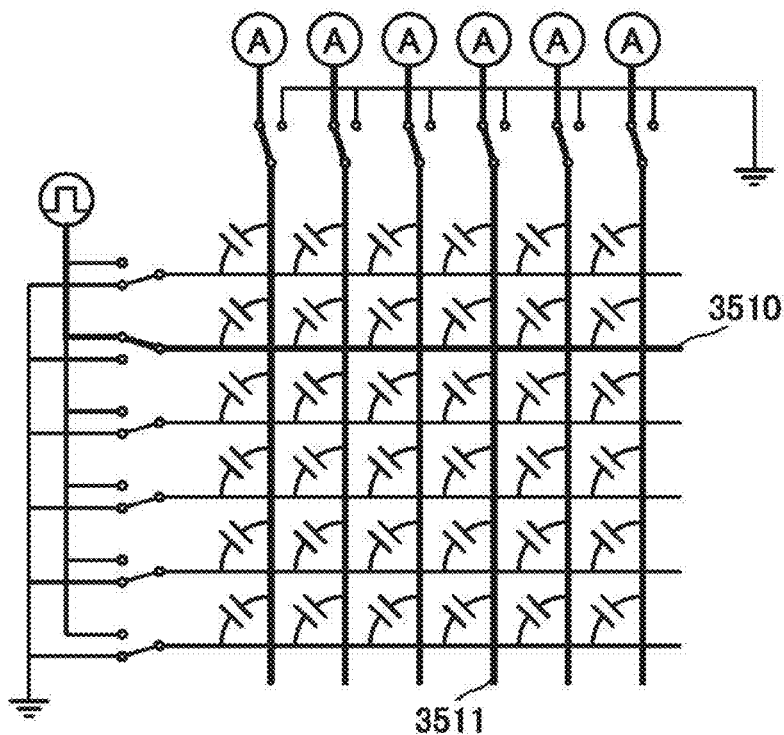

FIG. 33B is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

<3-2-5. Structure Examples of Pixel>

Structure examples of a pixel which can be used for the above touch panel are described below.

Figure 35A:
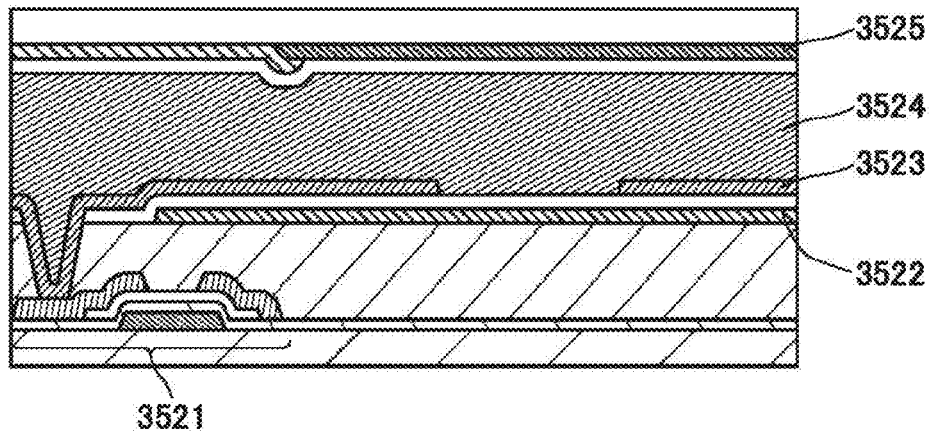
FIGS. 35A to 35C are diagrams each illustrating an example of a structure of a pixel of one embodiment of the present invention.

FIG. 35A is a cross-sectional schematic diagram illustrating part of a pixel using an FFS mode of a liquid crystal display device.

The pixel includes a transistor 3521, an electrode 3522, an electrode 3523, a liquid crystal 3524, and a color filter 3525. The electrode 3523 having an opening is electrically connected to one of a source and a drain of the transistor 3521. The electrode 3523 is provided over the electrode 3522 with an insulating film provided therebetween. The electrode 3523 and the electrode 3522 can each function as one electrode of a liquid crystal element, and by applying different potentials thereto, alignment of liquid crystals can be controlled.

For example, the electrode 3522 is electrically connected to the above-described wiring 3510 or wiring 3511; thus, the pixel of the above-described touch panel can be formed.

Note that the electrode 3522 can be provided over the electrode 3523. In that case, the electrode 3522 may have an opening and may be provided over the electrode 3523 with an insulating film provided therebetween.

Figure 35B:
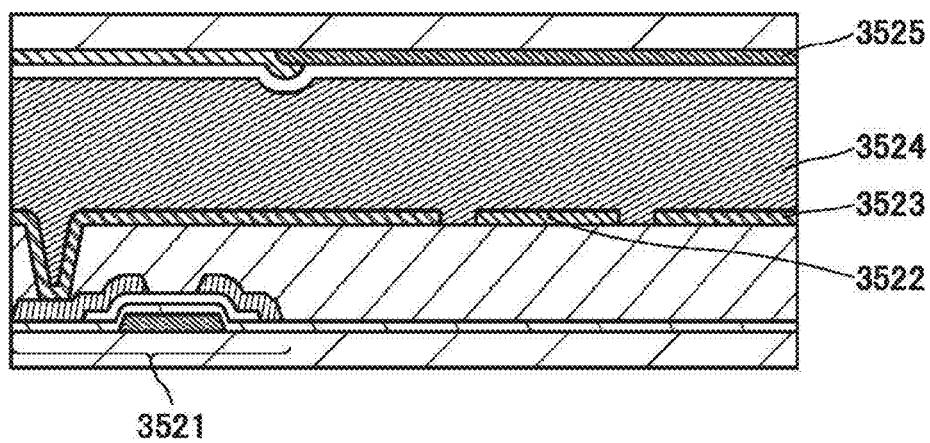

FIG. 35B is a cross-sectional schematic diagram illustrating part of a pixel having an IPS mode of a liquid crystal display device.

The electrode 3523 and electrode 3522 provided in the pixel each have a comb-like shape and are provided on the same plane so as to engage with each other and be apart from each other.

For example, the electrode 3522 is electrically connected to the above-described wiring 3510 or wiring 3511; thus, the pixel of the above-described touch panel can be formed.

Figure 35C:
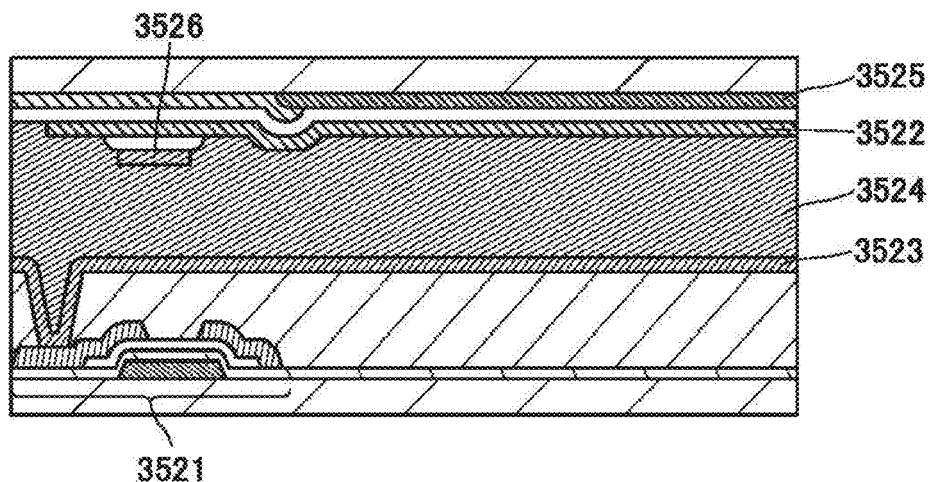

FIG. 35C is a cross-sectional schematic diagram illustrating part of a pixel having a VA mode of a liquid crystal display device.

The electrode 3522 is provided so as to face the electrode 3523 with the liquid crystal 3524 provided therebetween. The wiring 3526 is provided on the electrode 3522. For example, the wiring 3526 can be provided to electrically connect the block including the pixel illustrated in FIG. 35C and blocks different from the block including the pixel illustrated in FIG. 35C.

For example, the electrode 3522 is electrically connected to the above-described wiring 3510 or wiring 3511; thus, the pixel of the above-described touch panel can be formed.

<3-3. Microcomputer>

The transistors described above can be applied to a microcomputer used for a variety of electronic appliances.

A structure and operation of a fire alarm system that is an example of the electronic appliance using a microcomputer are described with reference to FIG. 36, FIG. 37, FIGS. 38A to 38C, and FIG. 39A.

The fire alarm in this specification refers to any system which raises an alarm over fire occurrence instantly and includes, for example, a residential fire alarm, an automatic fire alarm system, and a fire detector used for the automatic fire alarm system are included in its category.

Figure 36:
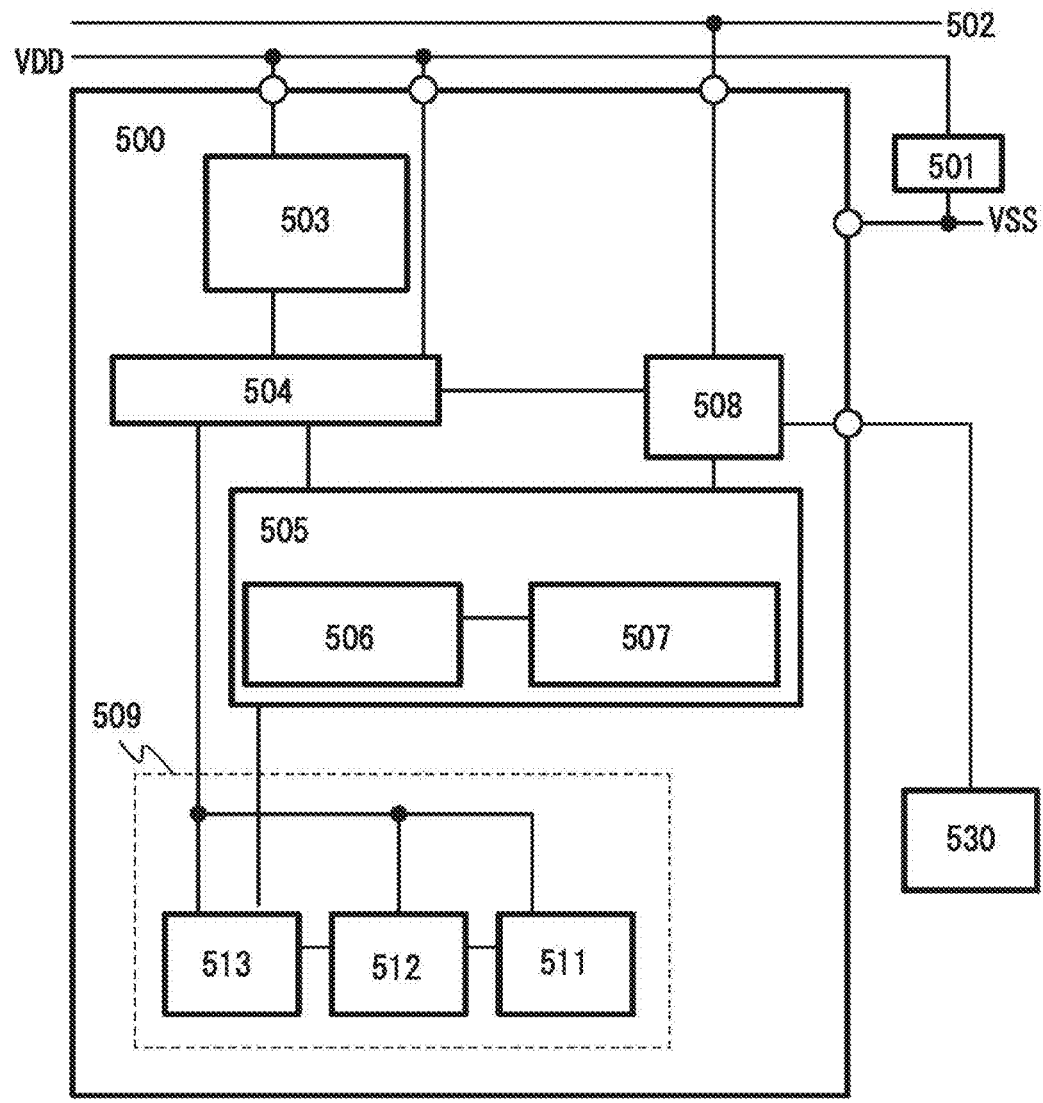
FIG. 36 is a block diagram illustrating an example of a semiconductor device of one embodiment of the present invention.

An alarm system illustrated in FIG. 36 includes at least a microcomputer 500. The microcomputer 500 is provided inside the alarm system. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 via an interface 508. The interface 508 as well as the CPU 505 is electrically connected to the power gate 504. As a bus standard of the interface 508, for example, an I²C bus can be used. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm system operates in such a manner, whereby power consumption can be reduced as compared to the case where power is continuously supplied to the above structures.

In the case where a transistor is used as the power gate 504, it is preferable to use a transistor which has extremely low off-state current and is used for the nonvolatile memory portion 507, for example, any of the transistors each of which includes the multilayer film including the oxide semiconductor layer. With the use of such a transistor, leakage current can be reduced when supply of power is stopped by the power gate 504, so that power consumption can be reduced.

A direct-current power source 501 may be provided in the alarm system so that power is supplied from the direct-current power source 501 to the high potential power supply line VDD. An electrode of the direct-current power source 501 on the high potential side is electrically connected to the high potential power supply line VDD, and an electrode of the direct-current power source 501 on the low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case which includes an electrode electrically connected to the high potential power supply line VDD, an electrode electrically connected to the low potential power supply line VSS, and a housing which can hold the battery is provided in the housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. A physical quantity relating to an abnormal situation depends on the usage of the alarm system, and in an alarm system functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 37:
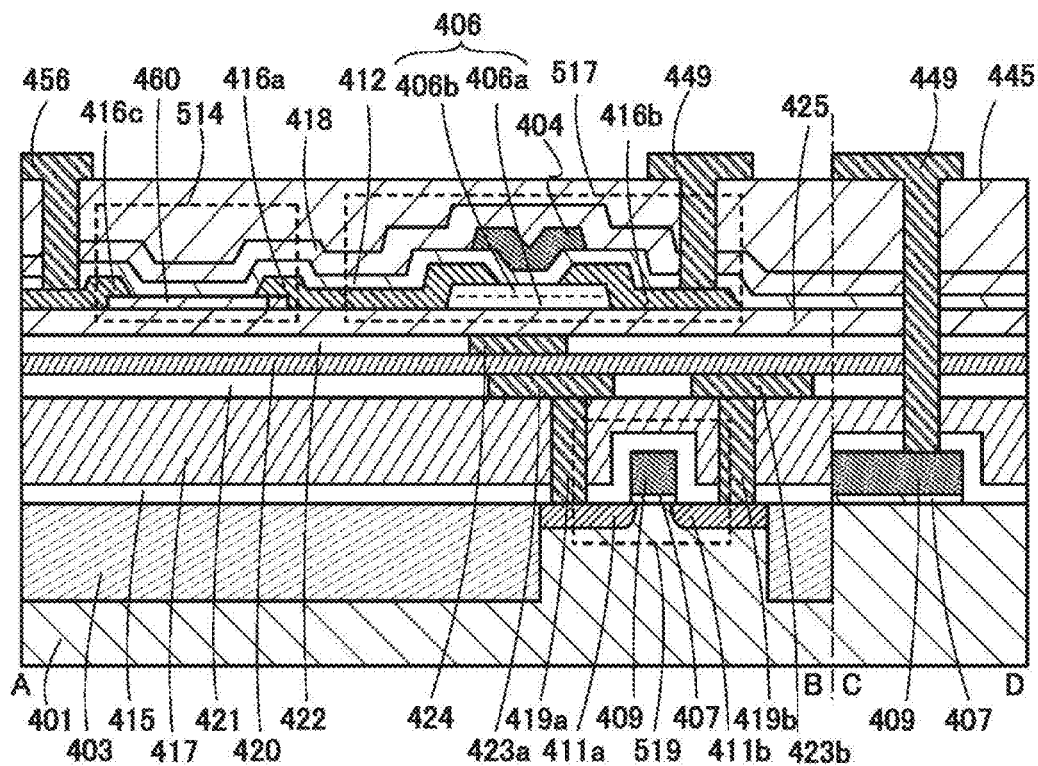
FIG. 37 is a cross-sectional view illustrating an example of a semiconductor device of one embodiment of the present invention.

FIG. 37 illustrates part of the cross section of the alarm system. An n-channel transistor 519 includes element isolation regions 403 in a p-type semiconductor substrate 401, a gate insulating film 407, a gate electrode 409, n-type impurity regions 411a and 411b, an insulating film 415, and an insulating film 417. The n-channel transistor 519 is formed using a semiconductor such as single crystal silicon, so that the n-channel transistor 519 can operate at high speed. Accordingly, a volatile memory portion of a CPU that can achieve high-speed access can be formed.

In addition, contact plugs 419a and 419b are formed in openings which are formed by partly etching the insulating films 415 and 417, and an insulating film 421 having groove portions is formed over the insulating film 417 and the contact plugs 419a and 419b. Wirings 423a and 423b are formed in the groove portions of the insulating film 421. An insulating film 420 is formed over the insulating film 421 and the wirings 423a and 423b by a sputtering method, a CVD method, or the like, and an insulating film 422 having a groove portion is formed over the insulating film 420. An electrode 424 is formed in the groove portion of the insulating film 422. The electrode 424 functions as a back gate electrode of a second transistor 517. The electrode 424 can control the threshold voltage of the second transistor 517.

Moreover, an insulating film 425 is formed over the insulating film 422 and the electrode 424 by a sputtering method, a CVD method, or the like.

The second transistor 517 and a photoelectric conversion element 514 are provided over the insulating film 425. The second transistor 517 includes the multilayer film 406 including the oxide semiconductor layer 406a and the oxide semiconductor layer 406b, the source electrode 416a and the drain electrode 416b which are over and in contact with the multilayer film 406, the gate insulating film 412, the gate electrode 404, and the insulating film 418. Moreover, an insulating film 445 to cover the photoelectric conversion element 514 and the second transistor 517 is formed, and a wiring 449 in contact with the drain electrode 416b is formed over the insulating film 445. The wiring 449 functions as a node which electrically connects the drain electrode 416b of the second transistor 517 to the gate electrode 409 of the n-channel transistor 519.

The optical sensor 511 includes the photoelectric conversion element 514, a capacitor, a first transistor, the second transistor 517, a third transistor, and the n-channel transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the second transistor 517. The gate electrode of the second transistor 517 is supplied with an electric charge accumulation control signal Tx, and the other of the source electrode and the drain electrode thereof is electrically connected to one of a pair of electrodes of the capacitor, one of a source electrode and a drain electrode of the first transistor, and the gate electrode of the n-channel transistor 519 (hereinafter the node is referred to as a node FD in some cases). The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD. One of a source electrode and a drain electrode of the n-channel transistor 519 is electrically connected to one of a source electrode and a drain electrode of the third transistor and the amplifier 512. The other of the source electrode and the drain electrode of the n-channel transistor 519 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 519 or the like is sufficiently large, a structure without the capacitor may be employed.

Further, as each of the first transistor and the second transistor 517, the transistor with extremely low off-state current is preferably used. As the transistor with extremely low off-state current, any of the above transistors each of which includes the multilayer film including the oxide semiconductor layer is preferably used. With such a structure, the potential of the node FD can be held for a long time.

In the structure in FIG. 37, the photoelectric conversion element 514 is electrically connected to the second transistor 517 and is provided over the insulating film 425.

The photoelectric conversion element 514 includes a semiconductor film 460 over the insulating film 425, and the source electrode 416a and an electrode 416c which are in contact with the top surface of the semiconductor film 460. The source electrode 416a is an electrode functioning as the source electrode or the drain electrode of the second transistor 517 and electrically connects the photoelectric conversion element 514 to the second transistor 517.

Over the semiconductor film 460, the source electrode 416a, and the electrode 416c, the gate insulating film 412, the insulating film 418, and the insulating film 445 are provided. Further, a wiring 456 is formed over the insulating film 445 and is in contact with the electrode 416c through an opening provided in the gate insulating film 412, the insulating film 418, and the insulating film 445.

The electrode 416c can be formed in steps similar to those of the source electrode 416a and the drain electrode 416b, and the wiring 456 can be formed in steps similar to those of the wiring 449.

As the semiconductor film 460, a semiconductor film which can perform photoelectric conversion is provided, and for example, silicon, germanium, or the like can be used. In the case of using silicon for the semiconductor film 460, an optical sensor which senses visible light can be obtained. Further, there is a difference between silicon and germanium in wavelengths of absorbed electromagnetic waves. In the case of using germanium for the semiconductor film 460, a sensor which senses infrared rays can be obtained.

In the above manner, the sensor portion 509 including the optical sensor 511 can be incorporated into the microcomputer 500, so that the number of components can be reduced and the housing of the alarm system can be reduced.

In the fire alarm including the above-described IC chip, the CPU 505 in which a plurality of circuits each including any of the above transistors are combined and mounted on one IC chip is used.

<3-3-1. CPU>

Figure 38A:
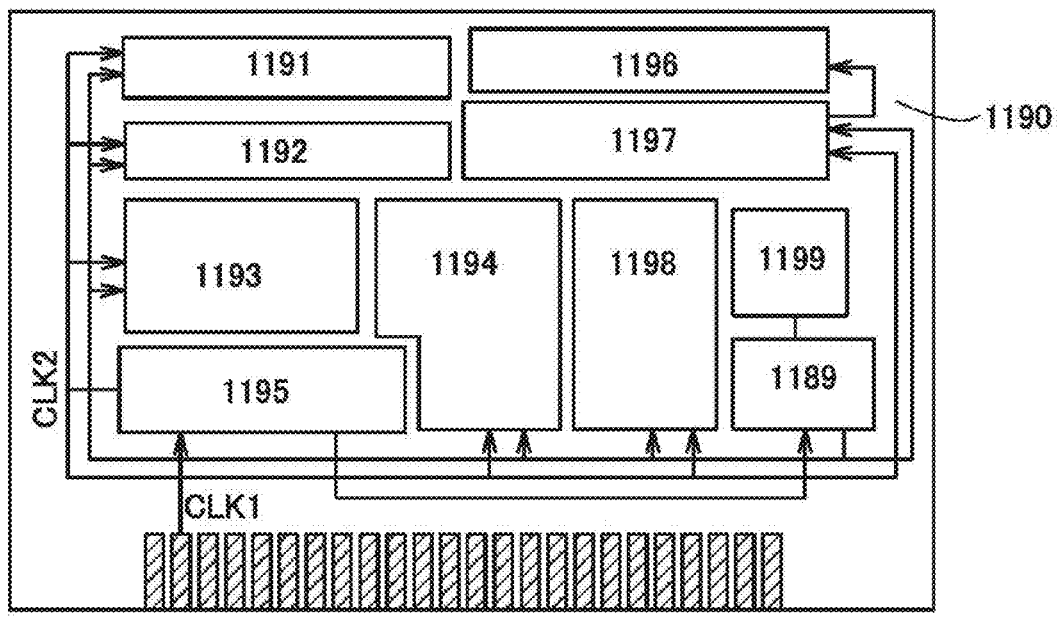
FIGS. 38A to 38C are block diagrams illustrating examples of a CPU of one embodiment of the present invention.
Figure 38B:
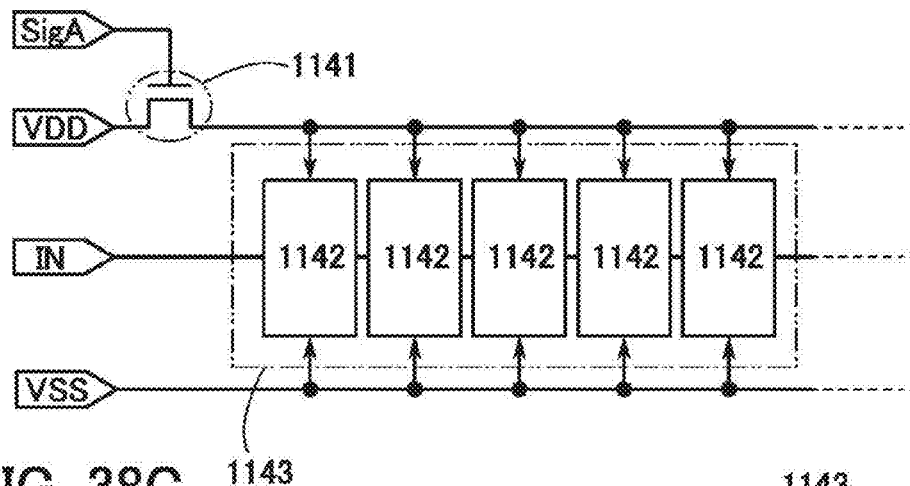
Figure 38C:
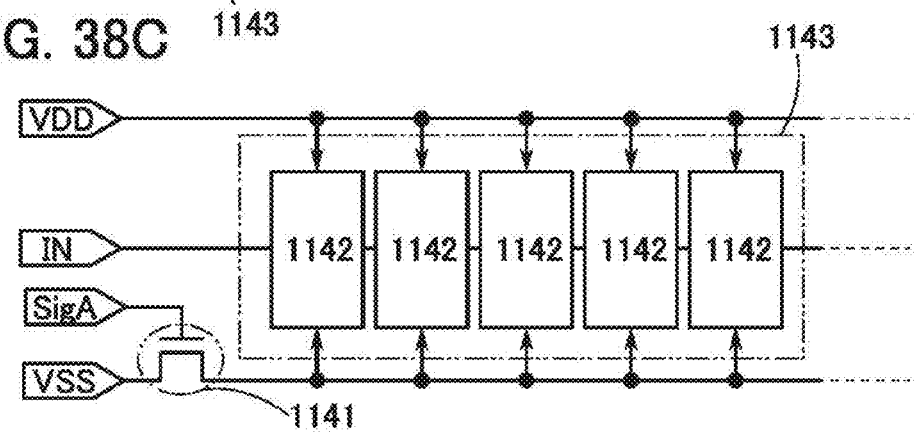

FIGS. 38A to 38C are block diagrams illustrating a specific structure of a CPU at least partly including any of the above transistors.

The CPU illustrated in FIG. 38A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over separate chips. Needless to say, the CPU in FIG. 38A is just an example of a simplified structure, and an actual CPU may have a variety of structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 38A, a memory cell is provided in the register 1196. As the memory cell of the register 1196, the above transistor can be used.

In the CPU illustrated in FIG. 38A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 38B or FIG. 38C. Circuits illustrated in FIGS. 38B and 38C are described below.

FIGS. 38B and 38C each illustrate a memory device in which any of the above transistors is used as a switching element which controls supply of a power supply potential to a memory cell.

The memory device illustrated in FIG. 38B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 38B, any of the above transistors is used as the switching element 1141, and the switching of the transistor is controlled by a signal SigA supplied to a gate electrode layer thereof.

Note that FIG. 38B illustrates the structure in which the switching element 1141 includes only one transistor; however, one embodiment of the present invention is not limited thereto and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 38B, the switching element 1141 may control the supply of the low-level power supply potential VSS.

FIG. 38C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<3-3-2. Installation Example>

Figure 39A:
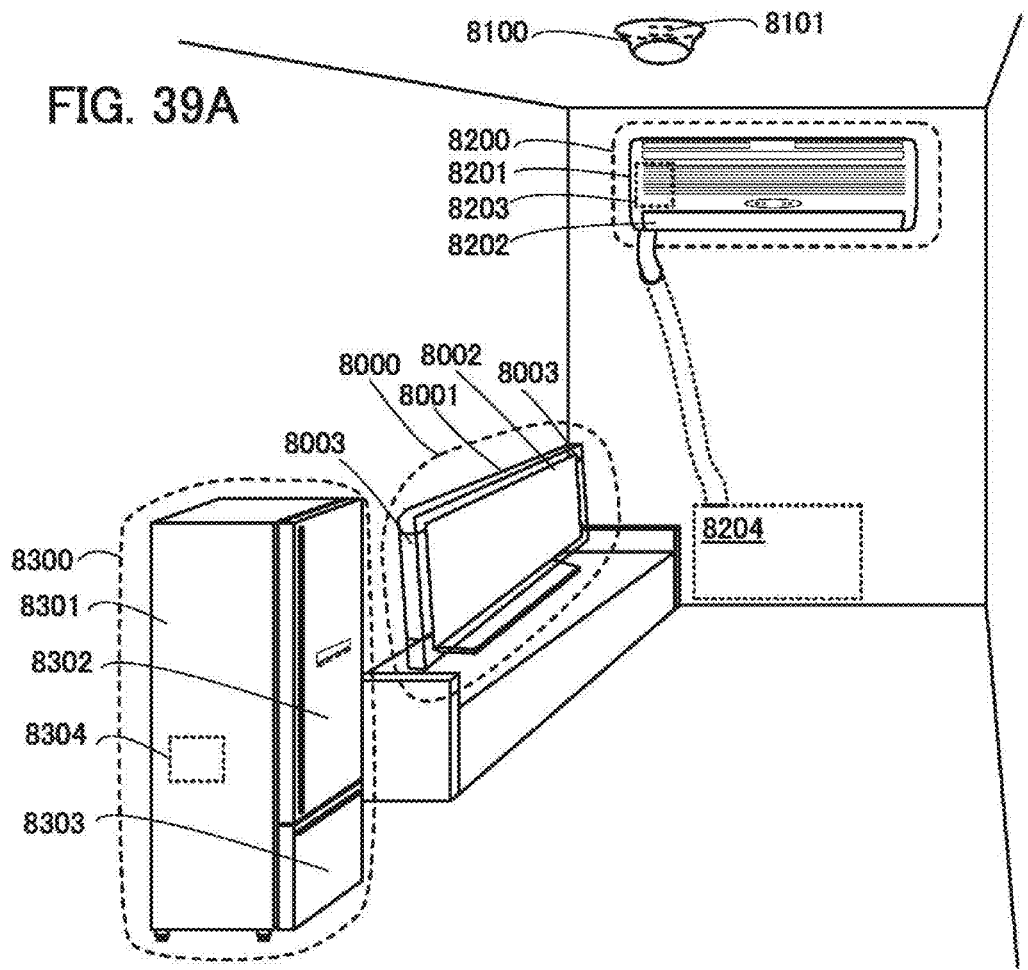
FIGS. 39A to 39C illustrate examples of an electronic appliance of one embodiment of the present invention.

In a television set 8000 in FIG. 39A, a display portion 8002 is incorporated in a housing 8001. The display portion 8002 can display an image and a speaker portion 8003 can output sound. The above transistor can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

In addition, the television set 8000 may include a CPU for performing information communication or a memory. A CPU or a memory that uses any of the above transistors, the above memory device, or the above CPU consumes less power.

In FIG. 39A, an alarm system 8100 is a residential fire alarm, which includes a sensor portion and a microcomputer 8101. The microcomputer 8101 includes a CPU in which any of the above transistors is used.

In FIG. 39A, a CPU that uses any of the above transistors is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 39A, the CPU 8203 may be provided in the outdoor unit 8204. Alternatively, the CPU 8203 may be provided in both the indoor unit 8200 and the outdoor unit 8204. A CPU that uses any of the above transistors can save the power of the air conditioner.

In FIG. 39A, a CPU that uses any of the above transistors is included in an electric refrigerator-freezer 8300. Specifically, the electric refrigerator-freezer 8300 includes a housing 8301, a door for a refrigerator 8302, a door for a freezer 8303, a CPU 8304, and the like. In FIG. 39A, the CPU 8304 is provided in the housing 8301. A CPU that uses any of the above transistors can save the power of the electric refrigerator-freezer 8300.

Figure 39B:
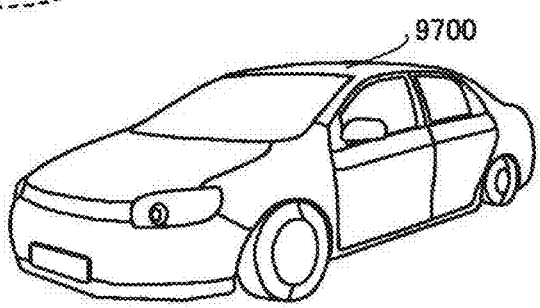
Figure 39C:
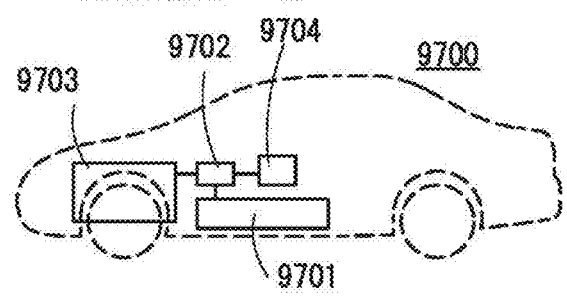

FIGS. 39B and 39C illustrate an example of an electric vehicle. The electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses any of the above transistors can save the power of the electric vehicle 9700.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of or the whole of this embodiment can be freely combined with, applied to, or replaced with part of or the whole of another embodiment.

Example 1

In this example, a change in composition of a surface of an oxide semiconductor layer which was etched using a phosphoric acid solution was examined.

A sample used in this example includes a glass substrate, a 35-nm-thick first oxide semiconductor layer over the glass substrate, and a 20-nm-thick second oxide semiconductor layer over the first oxide semiconductor layer.

The first oxide semiconductor layer was formed by a sputtering method using an In—Ga—Zn oxide (having an atomic ratio of In:Ga:Zn=1:1:1) target. The second oxide semiconductor layer was formed by a sputtering method using an In—Ga—Zn oxide (having an atomic ratio of In:Ga:Zn=1:3:2) target.

First, the composition of a surface of the sample used in this example was measured by X-ray photoelectron spectroscopy (XPS). In the XPS, Quantera SXM manufactured by ULVAC-PHI, Inc. was used and monochromatic AlKa ray (1486.6 eV) was used for an X-ray source. Note that a detected region was a circle with a diameter of 100 μm. At this time, the detected depth was approximately 4 nm to 5 nm.

Next, the sample used in this example was soaked in a phosphoric acid solution for 15 seconds, washed with water, and then dried. As the phosphoric acid solution, a solution in which an 85 weight % phosphoric acid solution was diluted by 100 times was used. Then, the composition of the surface of the sample used in this example was measured by XPS.

Table 1 shows the composition of the oxide semiconductor layer before and after the treatment using a phosphoric acid solution (expressed in atomic %). Note that in the treatment using a phosphoric acid solution, the second oxide semiconductor layer with a thickness of 10 nm or more is left; thus, the composition analysis by XPS is hardly affected by the first oxide semiconductor layer.

TABLE 1

|  | In | Ga | Zn | O | P |
|---|---|---|---|---|---|
| Before treatment | 10.7 | 20.8 | 9.6 | 58.9 | 0.0 |
| After treatment | 9.0 | 20.5 | 9.4 | 59.8 | 1.3 |

The following is found from Table 1: the indium concentration in the composition of the vicinity of the surface of the sample used in this example (with a depth of approximately 4 nm to 5 nm) was decreased by the treatment using a phosphoric acid solution; the phosphorus concentration was increased; the oxygen concentration was increased; the gallium concentration was hardly changed; and the zinc concentration was hardly changed.

Table 2 shows the results of XPS standardized on indium.

TABLE 2

|  | In | Ga | Zn | O | P |
|---|---|---|---|---|---|
| Before treatment | 1.00 | 1.95 | 0.90 | 5.51 | 0.00 |
| After treatment | 1.00 | 2.28 | 1.05 | 6.67 | 0.15 |

The following is found from Table 2: since the indium concentration became relatively low, the gallium concentration, the zinc concentration, the oxygen concentration, and the phosphorus concentration became high.

Accordingly, it is revealed that the vicinity of the surface of the second oxide semiconductor layer is an oxide semiconductor layer containing gallium at a high concentration by phosphoric acid solution treatment.

Further, time-of-flight secondary ion mass spectrometry (ToF-SIMS) was performed on the vicinity of the surface of the sample used in this example instead of XPS. The secondary ion intensities detected by ToF-SIMS were compared to evaluate an increase or decrease in the number of elements between before and after the phosphoric acid solution treatment.

Figure 40:
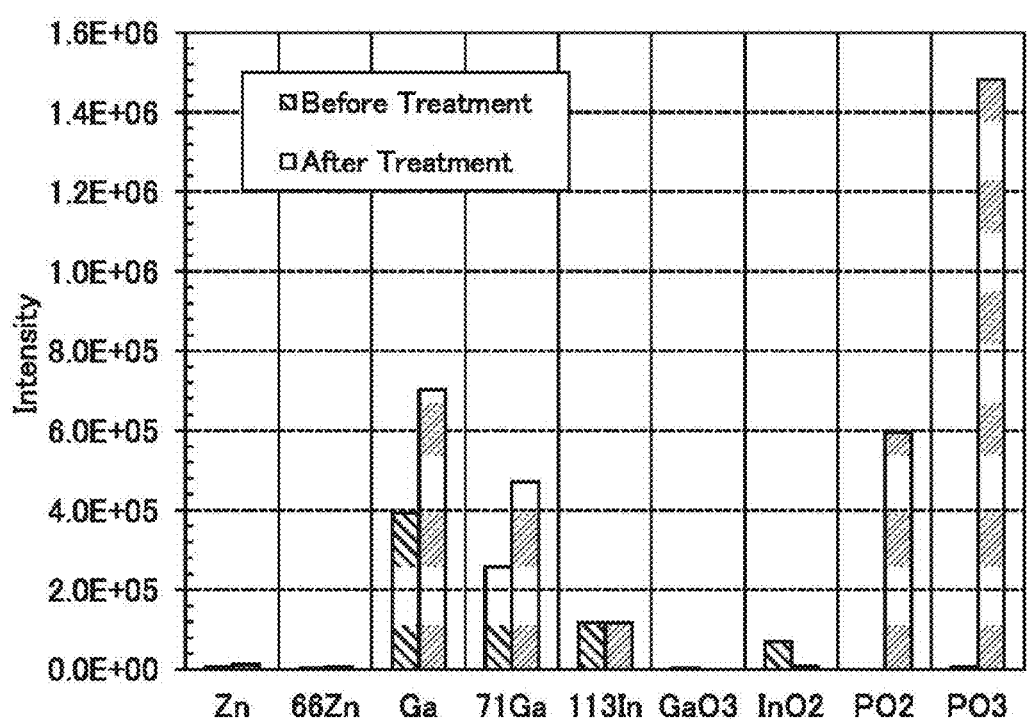
FIG. 40 is a graph showing results of XPS analysis of composition of the vicinity of a surface of a sample.

FIG. 40 shows the secondary ion intensities of Zn (having a mass-to-charge ratio of 63.93), 66Zn (having a mass-to-charge ratio of 65.93), Ga (having a mass-to-charge ratio of 68.93), 71Ga (having a mass-to-charge ratio of 70.92), 113In (having a mass-to-charge ratio of 112.90), $GaO_3$ (having a mass-to-charge ratio of 116.91), $InO_2$ (having a mass-to-charge ratio of 146.89), $PO_2$ (having a mass-to-charge ratio of 62.96), and $PO_3$ (having a mass-to-charge ratio of 78.96) as typical examples.

It is found from FIG. 40 that the secondary ion intensities of Ga and 71 Ga are increased after the phosphoric acid solution treatment.

Thus, it is revealed also by ToF-SIMS that the vicinity of the surface of the second oxide semiconductor layer is an oxide semiconductor layer containing gallium at a high concentration by the phosphoric acid solution treatment.

Example 2

In this example, a transistor of one embodiment of the present invention was manufactured, and the reliability thereof was evaluated.

The transistor has the BGTC structure illustrated in FIGS. 6A to 6D. The structure of the transistor of the sample used in this example is described below with reference to FIGS. 6A to 6D. A 0.7-mm-thick glass substrate was used as the substrate 300. A 200-nm-thick tungsten film was used as the gate electrode 304. A stacked layer including a 400-nm-thick silicon nitride layer and a 50-nm-thick silicon oxynitride layer in this order from the bottom was used as the gate insulating film 312. A stacked layer including the first oxide semiconductor layer and the second oxide semiconductor layer in this order from the bottom was used as the multilayer film 306. A stacked layer including a 50-nm-thick titanium layer, a 400-nm-thick aluminum layer, and a 100-nm-thick titanium layer in this order from the bottom was used as the source electrode 316a and the drain electrode 316b. A stacked layer including a 450-nm-thick silicon oxynitride layer and a 100-nm-thick silicon nitride layer in this order from the bottom was used as the insulating film 318. Further, a 2-µm-thick acrylic resin was provided over the insulating film 318.

A method for manufacturing the transistor of the sample used in this example is described below.

First, the gate electrode 304 was formed over the substrate 300. Next, the gate insulating film 312 was formed. Then, the first oxide semiconductor layer and the second oxide semiconductor layer were formed in this order.

The first oxide semiconductor layer was formed by a sputtering method using an In—Ga—Zn oxide (having an atomic ratio of In:Ga:Zn=1:1:1) target. The second oxide semiconductor layer was formed by a sputtering method using an In—Ga—Zn oxide (having an atomic ratio of In:Ga:Zn=1:3:2) target.

The first oxide semiconductor layer was formed to a thickness of 35 nm.

The second oxide semiconductor layer was formed to a thickness of 20 nm.

Next, the source electrode 316a and the drain electrode 316b were formed.

In this example, a sample (with treatment) which was soaked in a phosphoric acid solution for 15 seconds after the source electrode 316a and the drain electrode 316b were formed and a sample (without treatment) which was not soaked in a phosphoric acid solution after the source electrode 316a and the drain electrode 316b were formed were prepared. As the phosphoric acid solution, a solution in which an 85 weight % phosphoric acid solution was diluted by 100 times was used.

Note that the second oxide semiconductor layer was etched by approximately 10 nm by the formation of the source electrode 316a and the drain electrode 316b and the phosphoric acid solution treatment.

Next, the insulating film 318 was formed, and then, an acrylic resin was formed. Consequently, the transistor was manufactured.

Figure 41:
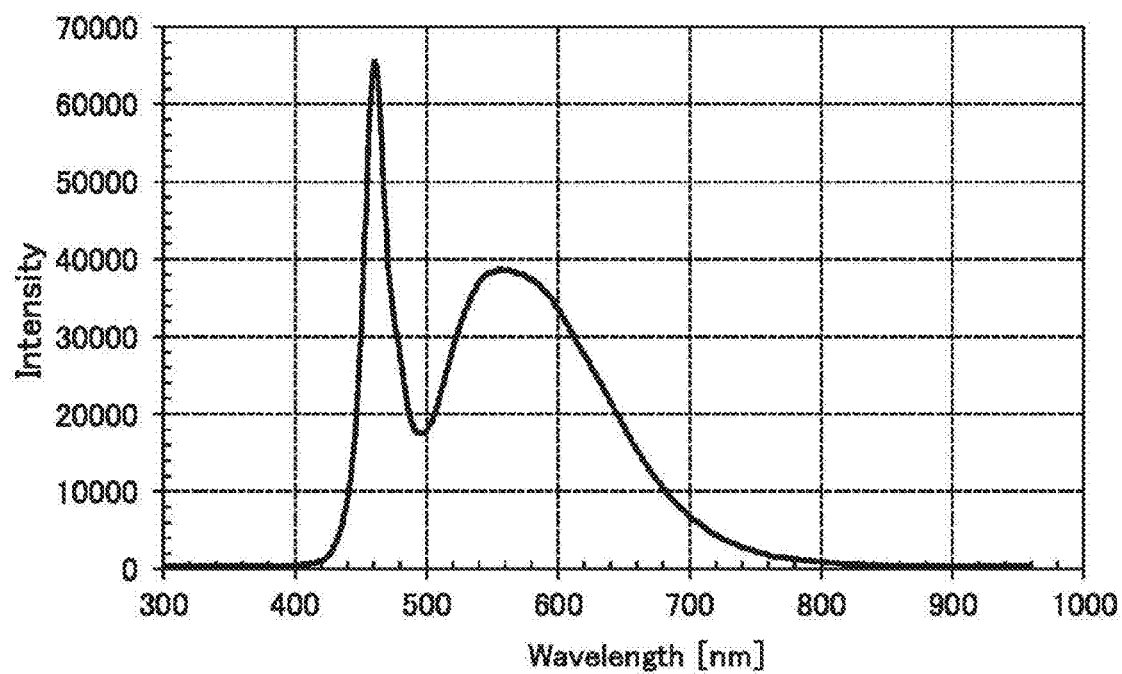
FIG. 41 is a graph showing a spectrum of an LED used in a test.

Next, gate BT stress tests (GBT tests) were performed on the transistors. The GBT tests were performed in a dark state (dark) or a light state (photo). Note that in the light state, the transistors were irradiated with white LED light with 10000 lx. FIG. 41 shows an emission spectrum of the white LED light used in the GBT test in the light state.

The GBT tests were performed on the transistors with a channel length L of 6 µm and a channel width W of 50 µm. The Vg-Id characteristics were measured by measurement of drain current under the conditions that the drain voltage was 10 V and the gate voltage was swept from −30 V to 30 V.

In the positive GBT test (+GBT), first, the substrate temperature was set to 40° C. and first measurement of Vg-Id characteristics was conducted. After that, the substrate temperature was set to 125° C., the gate voltage Vg was set to 30 V, and the drain voltage Vd was set to 0 V, and the transistors were held for an hour. After that, the substrate temperature was set to 40° C. and second measurement of Vg-Id characteristics was conducted.

In the negative GBT test (−GBT), first, the substrate temperature was set to 40° C. and first measurement of Vg-Id characteristics was conducted. After that, the substrate temperature was set to 125° C., the gate voltage Vg was set to −30 V, and the drain voltage Vd was set to 0 V, and the transistors were held for an hour. After that, the substrate temperature was set to 40° C. and second measurement of Vg-Id characteristics was conducted.

Figure 42A:
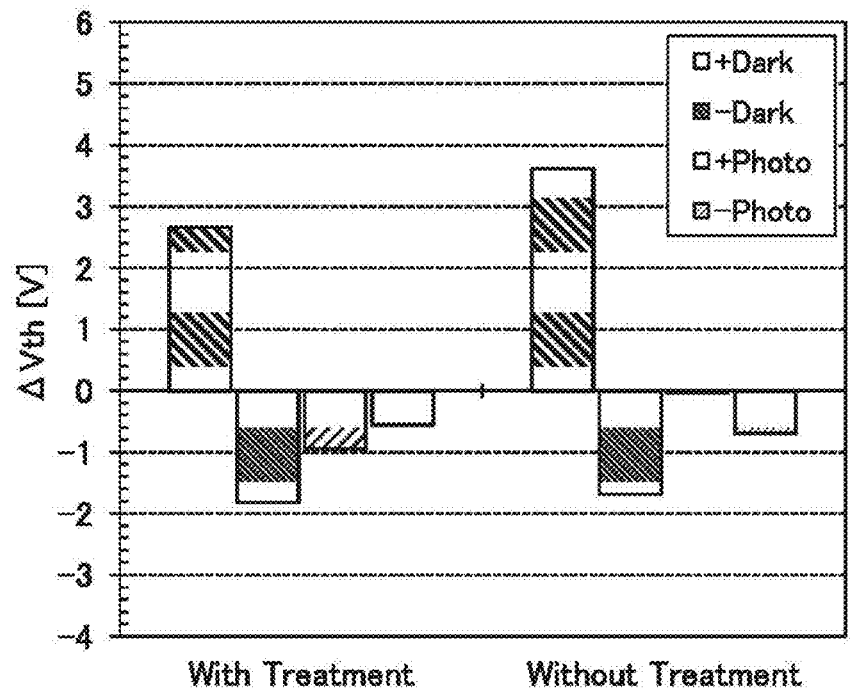
FIGS. 42A and 42B are graphs showing changes in electric characteristics of transistors measured between before and after gate BT stress tests.
Figure 42B:
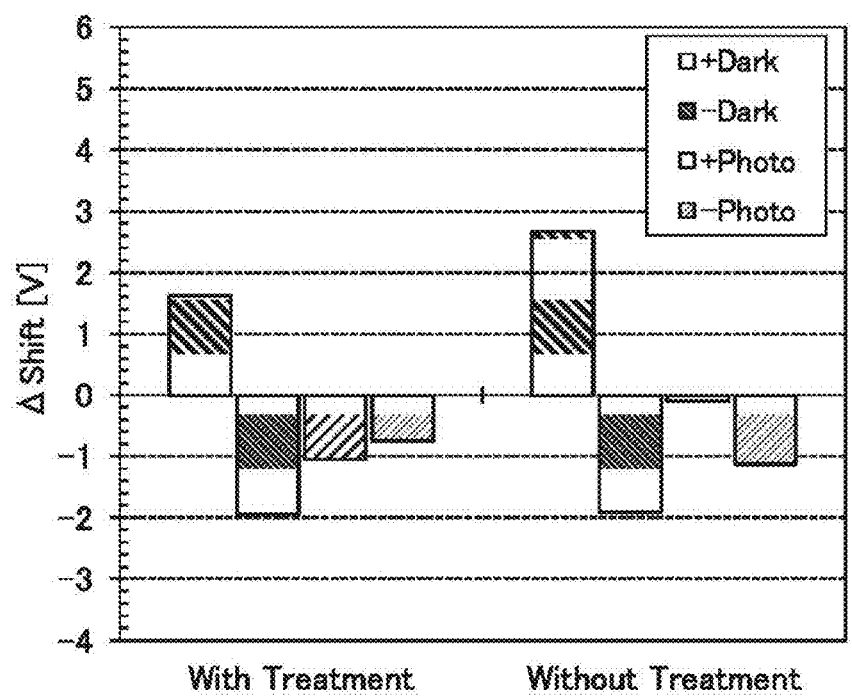

FIG. 42A and FIG. 42B show changes in threshold voltage (ΔVth) and shift value (ΔShift) between before and after the GBT tests, respectively. In FIGS. 42A and 42B, the results of the positive GBT test in the dark state are denoted by +Dark, the results of the negative GBT test in the dark state are denoted by −Dark, the results of the positive GBT test in the light state are denoted by +Photo, and the results of the negative GBT test in the light state are denoted by −Photo.

Note that the threshold voltage (Vth) refers to a gate voltage (voltage between a source and a gate) when a channel is formed. In a curve where the horizontal axis indicates the gate voltage (Vg) and the vertical axis indicates the square root of drain current (Id; current between a source and a drain) (Vg-$\sqrt{Id}$ characteristics), the threshold voltage was defined as a gate voltage at a point of intersection of an extrapolated tangent line having the highest inclination with the square root of drain current of 0 (Id=0 A). In a curve where the horizontal axis indicates the gate voltage (Vg) and the vertical axis indicates the logarithm of the drain current (Id), the shift value (Shift) is defined as a gate voltage at a point of intersection of an extrapolated tangent line having the highest inclination with a drain current of $1 \times 10^{-12}$ A.

The transistor which was subjected to the phosphoric acid solution treatment had a smaller amount of change in the threshold voltage and a smaller amount of change in the shift value due to the positive GBT test in the dark state than the transistor which was not subjected to the phosphoric acid solution treatment. The degradation due to the positive GBT test in the dark state causes a larger amount of change than other degradation. Accordingly, when the degradation due to the positive GBT test in the dark state is small, the transistor has high reliability.

The results in Example 1 show that the transistor subjected to the phosphoric acid solution treatment contains gallium at a high concentration in the region in the vicinity of the surface of the second oxide semiconductor layer. Thus, it is found that the reliability of the transistor is improved with the region.

Example 3

In this example, transistors of one embodiment of the present invention were manufactured, and the reliability thereof was evaluated.

The transistor has the BGTC structure illustrated in FIGS. 6A to 6D. The structure of the transistor of the sample used in this example is described below with reference to FIGS. 6A to 6D. A glass substrate with a thickness of 0.7 mm was used as the substrate 300. A 200-nm-thick tungsten film was used as the gate electrode 304. A stacked layer including a 400-nm-thick silicon nitride layer and a 50-nm-thick silicon oxynitride layer in this order from the bottom was used as the gate insulating film 312. A stacked layer including the first oxide semiconductor layer and the second oxide semiconductor layer in this order from the bottom was used as the multilayer film 306. A stacked layer including a 50-nm-thick titanium layer, a 400-nm-thick aluminum layer, and a 100-nm-thick titanium layer in this order from the bottom was used as the source electrode 316a and the drain electrode 316b. A stacked layer including a 450-nm-thick silicon oxynitride layer and a 100-nm-thick silicon nitride layer in this order from the bottom was used as the insulating film 318. Further, an acrylic resin with a thickness of 2 μm was provided over the insulating film 318.

A method for manufacturing the transistor of the sample used in this example is described below.

First, the gate electrode 304 was formed over the substrate 300. Next, the gate insulating film 312 was formed. Then, the first oxide semiconductor layer and the second oxide semiconductor layer were formed in this order.

The first oxide semiconductor layer was formed by a sputtering method using an In—Ga—Zn oxide (having an atomic ratio of In:Ga:Zn=1:1:1) target. The second oxide semiconductor layer was formed by a sputtering method using an In—Ga—Zn oxide (having an atomic ratio of In:Ga:Zn=1:3:2) target.

The first oxide semiconductor layer was formed to a thickness of 35 nm.

The second oxide semiconductor layer was formed to a thickness of 5 nm, 10 nm, 12.5 nm, 15 nm, 17.5 nm, 20 nm, or 25 nm. For comparison, a sample in which the second oxide semiconductor layer was not provided was prepared.

Next, the source electrode 316a and the drain electrode 316b were formed.

In this example, the sample was soaked in a phosphoric acid solution for 15 seconds after the source electrode 316a and the drain electrode 316b were formed. As the phosphoric acid solution, a solution in which an 85 weight % phosphoric acid solution was diluted by 100 times was used.

Note that the first oxide semiconductor layer and the second oxide semiconductor layer were etched by approximately 10 nm by the formation of the source electrode 316a and the drain electrode 316b and the phosphoric acid solution treatment.

Next, the insulating film 318 was formed, and then, an acrylic resin was formed. Consequently, the transistor was manufactured.

Next, GBT tests were performed on the transistors. The description in Example 2 is referred to for the details of the GBT tests.

Figure 43A:
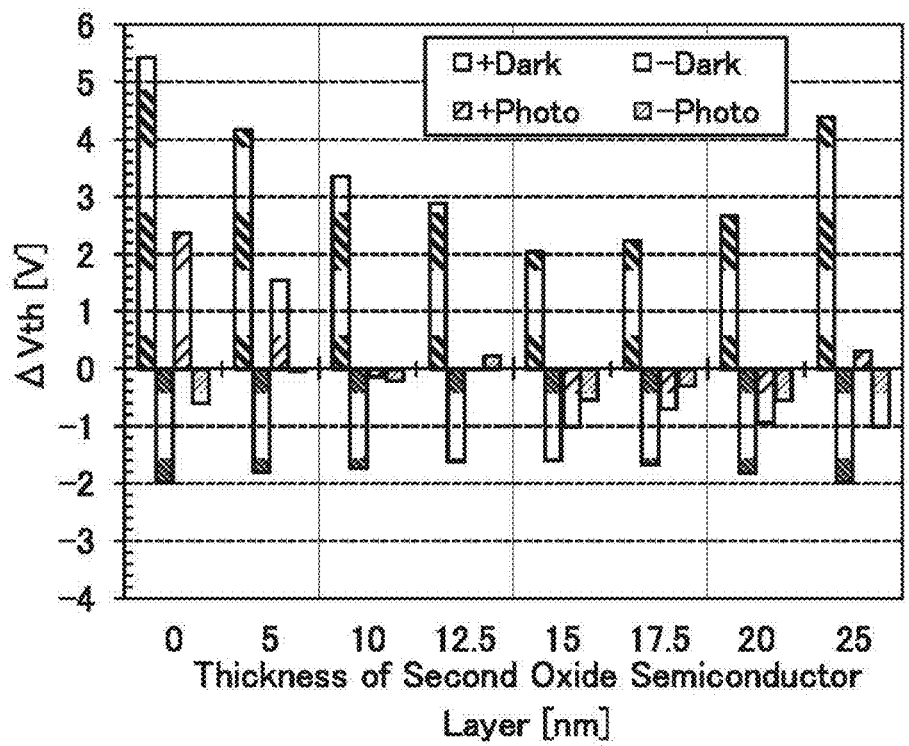
FIGS. 43A and 43B are graphs showing changes in electric characteristics of transistors measured between before and after gate BT stress tests.
Figure 43B:
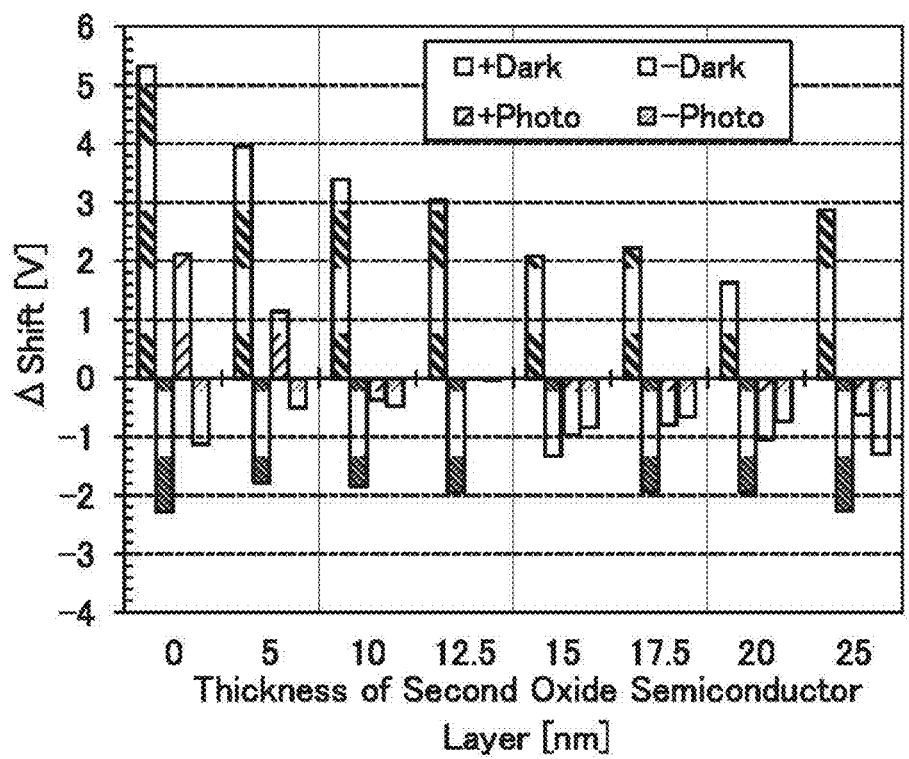

FIG. 43A and FIG. 43B show changes in threshold voltage (ΔVth) and shift value (ΔShift) between before and after the GBT tests, respectively. Note that in FIGS. 43A and 43B, the thickness of the second oxide semiconductor layer at the time of formation are shown; however, as described above, since the second oxide semiconductor layer (first oxide semiconductor layer) is etched by approximately 10 nm, the thickness thereof at the time of formation is different from the thickness thereof at the time of measurement.

It is found from FIGS. 43A and 43B that the amount of change in threshold voltage and the amount of change in shift value due to the positive GBT test in the dark state are small when the thickness of the second oxide semiconductor layer at the time of formation is 10 nm to 25 nm (approximately 0 nm to 15 nm at the time of measurement), particularly 15 nm to 20 nm (approximately 5 nm to 10 nm at the time of measurement).

Example 4

In this example, a transistor of one embodiment of the present invention was manufactured, and the reliability thereof was evaluated.

The transistor has the BGTC structure illustrated in FIGS. 6A to 6D. The structure of the transistor of the sample used in this example is described below with reference to FIGS. 6A to 6D. A glass substrate with a thickness of 0.7 mm was used as the substrate 300. A 100-nm-thick tungsten film was used as the gate electrode 304. A stacked layer including a 400-nm-thick silicon nitride layer and a 50-nm-thick silicon oxynitride layer in this order from the bottom was used as the gate insulating film 312. A stacked layer including the first oxide semiconductor layer and the second oxide semiconductor layer in this order from the bottom was used as the multilayer film 306. A stacked layer including a 50-nm-thick titanium layer, a 400-nm-thick aluminum layer, and a 100-nm-thick titanium layer in this order from the bottom was used as the source electrode 316a and the drain electrode 316b. A stacked layer including a 450-nm-thick silicon oxynitride layer and a 100-nm-thick silicon nitride layer in this order from the bottom was used as the insulating film 318. Further, an acrylic resin with a thickness of 1.5 μm was provided over the insulating film 318.

A method for manufacturing the transistor of the sample used in this example is described below.

First, the gate electrode 304 was formed over the substrate 300. Next, the gate insulating film 312 was formed. Then, the first oxide semiconductor layer and the second oxide semiconductor layer were formed in this order.

The first oxide semiconductor layer was formed by a sputtering method using an In—Ga—Zn oxide (having an atomic ratio of In:Ga:Zn=1:1:1) target. The second oxide semiconductor layer was formed by a sputtering method using an In—Ga—Zn oxide (having an atomic ratio of In:Ga:Zn=1:3:2) target.

The first oxide semiconductor layer was formed to a thickness of 35 nm.

The second oxide semiconductor layer was formed to a thickness of 20 nm. For comparison, a sample in which the second oxide semiconductor layer was not provided was prepared.

Next, the source electrode 316a and the drain electrode 316b were formed.

In this example, the sample was soaked in a phosphoric acid solution for 15 seconds after the source electrode 316a and the drain electrode 316b were formed. As the phosphoric acid solution, a solution in which an 85 weight % phosphoric acid solution was diluted by 100 times was used.

Note that the first oxide semiconductor layer and the second oxide semiconductor layer were etched by approximately 10 nm by the formation of the source electrode 316a and the drain electrode 316b and the phosphoric acid solution treatment.

Next, the insulating film 318 was formed, and then, an acrylic resin was formed. Consequently, the transistor was manufactured.

Next, constant-current stress tests were performed on the transistors. The constant-current stress tests were performed in a dark state (dark).

The constant-current stress tests were performed on the transistors with a channel length L of 6 μm and a channel width W of 5 μm. Note that the measurement of Vg-Id characteristics was performed by measuring drain current when the drain voltage was set to 0.1 V or 10 V and the gate voltage was swept in the range of −15 V to 15 V.

In the constant-current stress test, first, the substrate temperature was set to room temperature (20° C. to 25° C.) to perform first measurement of Vg-Id characteristics. After that, the substrate temperature was set to 60° C., the gate potential and the drain potential were set to a ground potential (GND), the source current was controlled to be −500 nA, and the transistors were held for two hours. The stress application was stopped after a lapse of 100 seconds, a lapse of 300 seconds, a lapse of 600 seconds, a lapse of 1000 seconds, a lapse of 1800 seconds, a lapse of 3600 seconds, and a lapse of 7200 seconds (2 hours) from the start of the constant-current stress test, and the Vg-Id characteristics after each stress time were measured at room temperature.

Figure 44A:
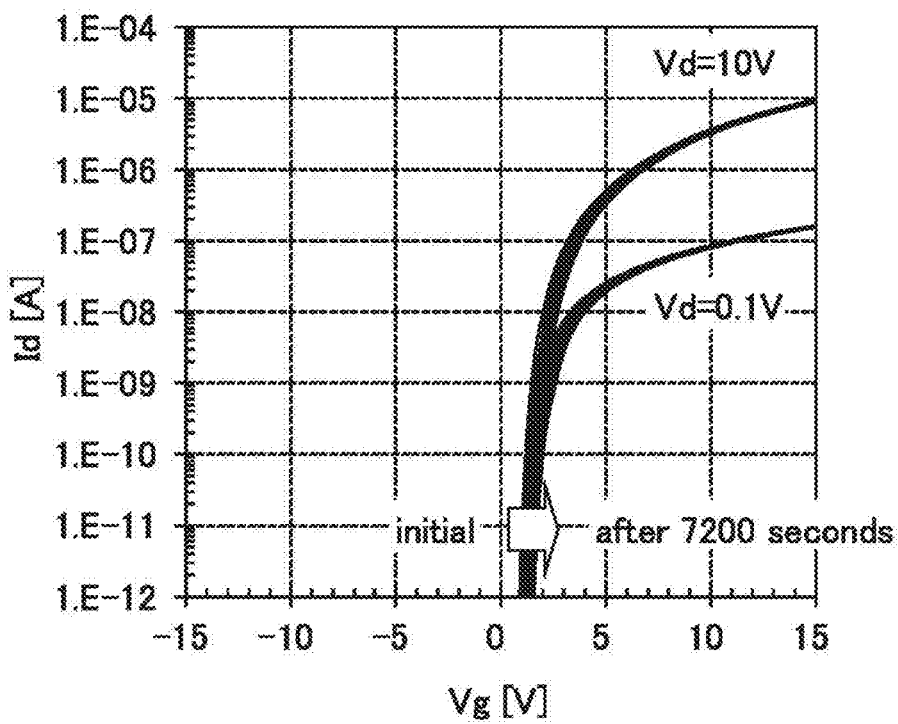
FIGS. 44A and 44B are graphs showing changes in electric characteristics of transistors measured between before and after constant-current stress tests.
Figure 44B:
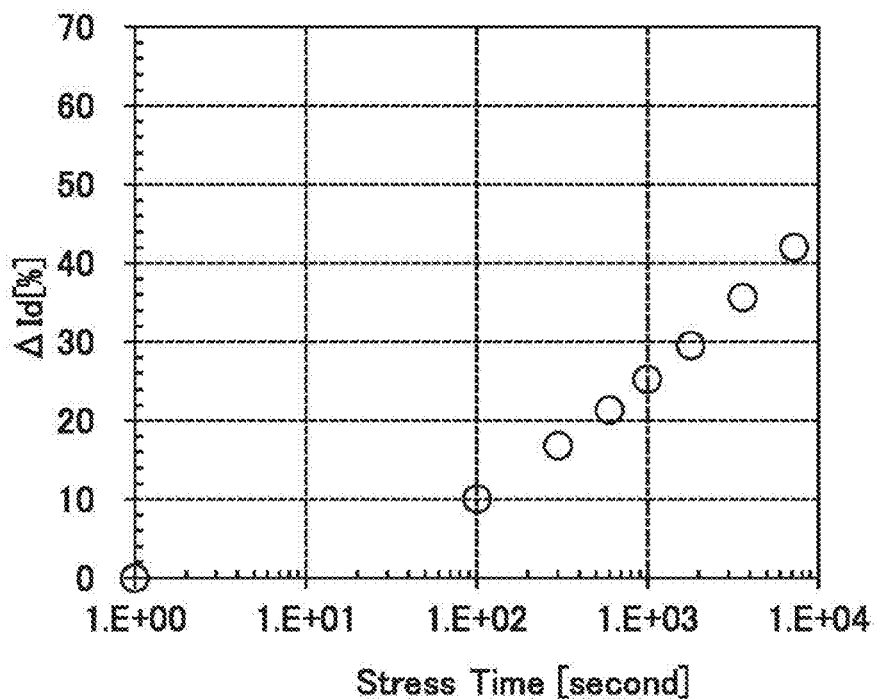

FIGS. 44A and 44B show the results of the constant-current stress tests of the transistors in which the second oxide semiconductor layers are not provided. FIG. 44A shows the Vg-Id characteristics, and FIG. 44B shows the rate of change in the drain current (ΔId).

Figure 45A:
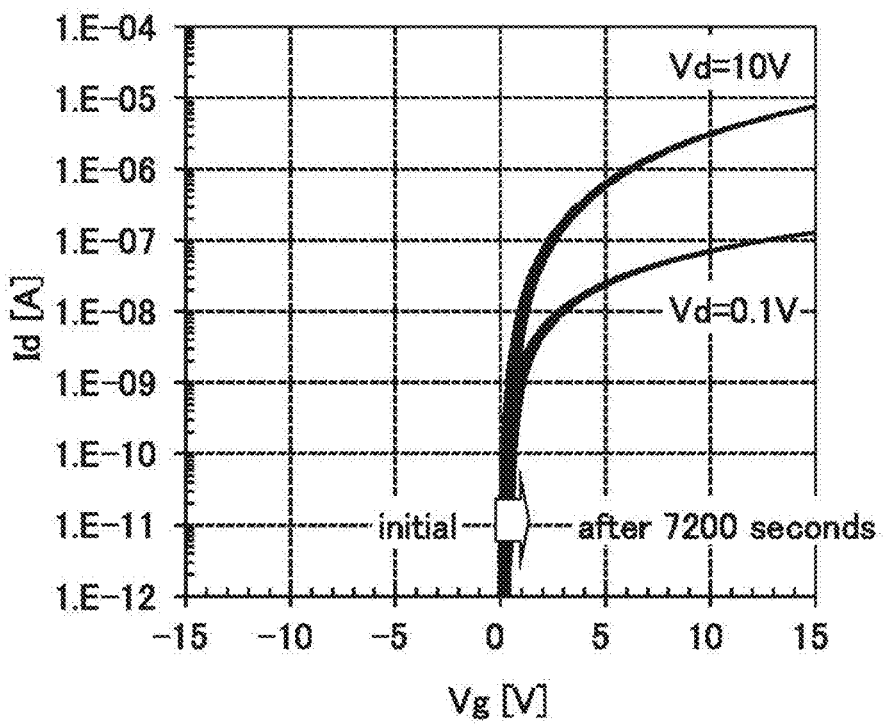
FIGS. 45A and 45B are graphs showing changes in electric characteristics of transistors measured between before and after constant-current stress tests.
Figure 45B:
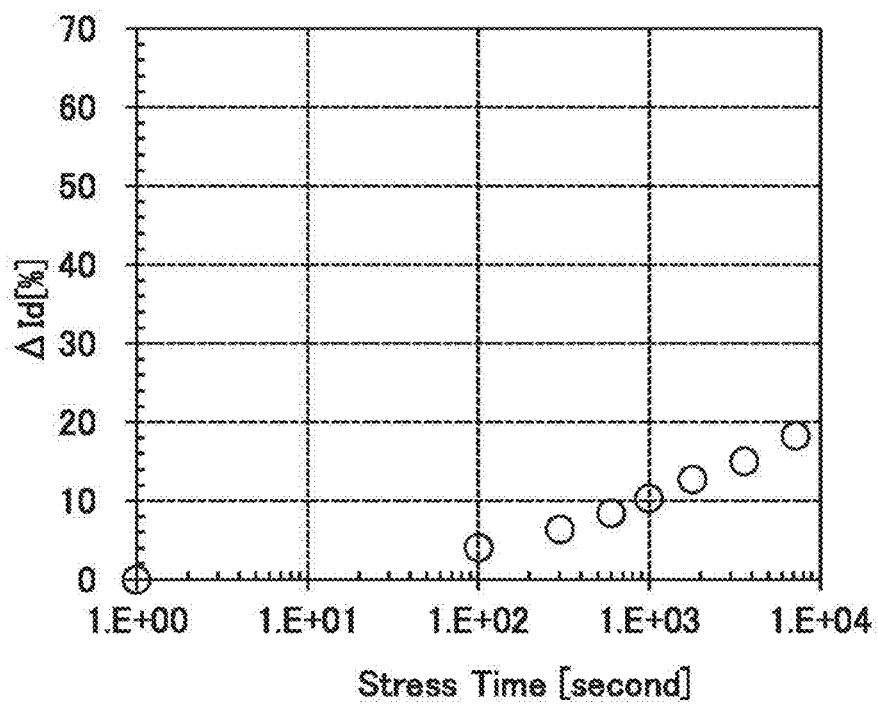

FIGS. 45A and 45B show the results of the constant-current stress tests of the transistors in which the second oxide semiconductor layers are provided. FIG. 45A shows the Vg-Id characteristics, and FIG. 45B shows the rate of change in the drain current (ΔId).

It is found from FIGS. 44A and 44B and FIGS. 45A and 45B that the transistor in which the second oxide semiconductor layer is provided has a lower rate of change in the drain current due to the constant-current stress test than the transistor in which the second oxide semiconductor layer is not provided.

Thus, the transistor in which the second oxide semiconductor layer is provided is suitable for a current-driven device.

This application is based on Japanese Patent Application serial no. 2012-264751 filed with Japan Patent Office on Dec. 3, 2012 and Japanese Patent Application serial no. 2012-273991 filed with Japan Patent Office on Dec. 14, 2012, the entire contents of which are hereby incorporated by reference.

What is claimed is:

1. A semiconductor device comprising:
an oxide semiconductor layer including a first oxide semiconductor layer, a second oxide semiconductor layer over the first oxide semiconductor layer, and a third oxide semiconductor layer over the second oxide semiconductor layer;
a gate insulating film in contact with the oxide semiconductor layer; and
a gate electrode overlapping with the oxide semiconductor layer with the gate insulating film provided between the gate electrode and the oxide semiconductor layer,
wherein a first energy gap of the first oxide semiconductor layer is greater than or equal to 2.7 eV and less than or equal to 4.9 eV,
wherein a third energy gap of the third oxide semiconductor layer is larger than a second energy gap of the second oxide semiconductor layer and an energy is continuously changed in a vicinity of an interface between the second oxide semiconductor layer and the third oxide semiconductor layer in a band structure, and
wherein the third oxide semiconductor layer has a thickness of less than 5 nm.

2. The semiconductor device according to claim 1,
wherein the oxide semiconductor layer is in contact with an insulating film containing silicon on a side facing the gate insulating film and comprises a channel region which is apart from the insulating film.

3. The semiconductor device according to claim 1,
wherein the gate insulating film is provided over the gate electrode and the oxide semiconductor layer is provided over the gate insulating film.

4. The semiconductor device according to claim 1,
wherein the oxide semiconductor layer contains indium and at least one of aluminum, gallium, yttrium, zirconium, and tin.

5. The semiconductor device according to claim 1,
wherein the oxide semiconductor layer is one of a c-axis aligned crystalline oxide semiconductor layer, a polycrystalline oxide semiconductor layer, a microcrystalline oxide semiconductor layer, and an amorphous oxide semiconductor layer.

6. The semiconductor device according to claim 1,
wherein the second energy gap of is greater than or equal to 2.5 eV and less than or equal to 4.2 eV.

7. The semiconductor device according to claim 1,
wherein the first oxide semiconductor layer has a thickness greater than or equal to 5 nm and less than or equal to 100 nm, and
wherein the second oxide semiconductor layer has a thickness greater than or equal to 5 nm and less than or equal to 200 nm.

8. The semiconductor device according to claim 1,
wherein a carrier density of the second oxide semiconductor layer is lower than or equal to $1\times10^{17}/cm^3$.

9. A semiconductor device comprising:
an oxide semiconductor layer including a first oxide semiconductor layer, a second oxide semiconductor layer over the first oxide semiconductor layer, and a third oxide semiconductor layer over the second oxide semiconductor layer, each of the first oxide semiconductor layer and the third oxide semiconductor layer containing indium and an element M, wherein M represents aluminum, gallium, yttrium, zirconium, or tin;
a gate insulating film in contact with the oxide semiconductor layer; and
a gate electrode overlapping with the oxide semiconductor layer with the gate insulating film provided between the gate electrode and the oxide semiconductor layer,
wherein each of the first oxide semiconductor layer and the third oxide semiconductor layer contains the element M at a higher proportion than indium, wherein a third energy gap of the third oxide semiconductor layer is larger than a second energy gap of the second oxide semiconductor layer and an energy is continuously changed in a vicinity of an interface between the second oxide semiconductor layer and the third oxide semiconductor layer in a band structure, and
wherein the third oxide semiconductor layer has a thickness of less than 5 nm.

10. The semiconductor device according to claim 9,
wherein the oxide semiconductor layer is in contact with an insulating film containing silicon on a side facing the gate insulating film and comprises a region in which a channel is formed in a region apart from the insulating film.

11. The semiconductor device according to claim 9,
wherein the gate insulating film is provided over the gate electrode and the oxide semiconductor layer is provided over the gate insulating film.

12. The semiconductor device according to claim 9,
wherein the oxide semiconductor layer is one of a c-axis aligned crystalline oxide semiconductor layer, a polycrystalline oxide semiconductor layer, a microcrystalline oxide semiconductor layer, an amorphous oxide semiconductor layer.

13. The semiconductor device according to claim 9,
wherein amount of the element M in the first oxide semiconductor layer in an atomic ratio is 1.5 times or more as much as amount of indium in an atomic ratio.

14. The semiconductor device according to claim 9,
wherein the first oxide semiconductor layer contains the element M at a higher proportion than the second oxide semiconductor layer.

15. The semiconductor device according to claim 9,
wherein the third oxide semiconductor layer contains the element M at a higher proportion than the second oxide semiconductor layer.

16. The semiconductor device according to claim 9,
wherein the first oxide semiconductor layer has a thickness greater than or equal to 5 nm and less than or equal to 100 nm, and
wherein the second oxide semiconductor layer has a thickness greater than or equal to 5 nm and less than or equal to 200 nm.

17. The semiconductor device according to claim 9,
wherein a carrier density of the second oxide semiconductor layer is lower than or equal to $1 \times 1017/cm^3$.

* * * * *